(12) United States Patent
Tanaka

(10) Patent No.: US 11,937,458 B2
(45) Date of Patent: Mar. 19, 2024

(54) DISPLAY DEVICE AND METHOD FOR MANUFACTURING THE SAME

(71) Applicant: MIKUNI ELECTRON CORPORATION, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 18/190,208

(22) Filed: Mar. 27, 2023

(65) Prior Publication Data

US 2023/0276662 A1  Aug. 31, 2023

Related U.S. Application Data

(63) Continuation of application No. 17/543,793, filed on Dec. 7, 2021, now Pat. No. 11,626,463, which is a
(Continued)

(30) Foreign Application Priority Data

May 31, 2017  (JP) ................. 2017-107278

(51) Int. Cl.
*H10K 59/12* (2023.01)
*H01L 27/12* (2006.01)
(Continued)

(52) U.S. Cl.
CPC ....... *H10K 59/1213* (2023.02); *H01L 27/124* (2013.01); *H01L 29/42384* (2013.01);
(Continued)

(58) Field of Classification Search
CPC ............. H10K 71/00; H10K 59/1201; H10K 59/1213; H10K 59/123; H10K 59/124;
(Continued)

(56) References Cited

U.S. PATENT DOCUMENTS

| 5,245,450 A | 9/1993 | Ukai et al. |
| 6,037,718 A | 3/2000 | Nagami |

(Continued)

FOREIGN PATENT DOCUMENTS

| CN | 101165906 A | 4/2008 |
| CN | 101847661 A | 9/2010 |

(Continued)

OTHER PUBLICATIONS

Japanese Notice of Allowance issued in Japanese Patent Application No. 2022-190674 dated Aug. 29, 2023.
(Continued)

*Primary Examiner* — Monica D Harrison
(74) *Attorney, Agent, or Firm* — PEARNE & GORDON LLP

(57) ABSTRACT

A display device includes a driving transistor and an organic EL element. The driving transistor includes an oxide semiconductor layer; a first gate electrode that includes a region overlapping the oxide semiconductor layer; a first insulating layer between the first gate electrode and the oxide semiconductor layer; a second gate electrode that includes a region overlapping the oxide semiconductor layer and the first gate electrode; a second insulating layer between the second gate electrode and the oxide semiconductor layer; and a first and a second transparent conductive layer that are provided between the oxide semiconductor layer and the first insulating layer and each include a region contacting the oxide semiconductor layer. The organic EL element includes a first electrode; a second electrode; a light emitting layer between the first electrode and the second electrode; and an electron transfer layer between the light emitting layer and the first electrode.

15 Claims, 62 Drawing Sheets

Related U.S. Application Data continuation of application No. 16/860,160, filed on Apr. 28, 2020, now Pat. No. 11,205,692, which is a continuation of application No. 16/516,749, filed on Jul. 19, 2019, now Pat. No. 10,727,288, which is a continuation of application No. 16/100,145, filed on Aug. 9, 2018, now Pat. No. 10,403,700, which is a continuation of application No. 15/721,271, filed on Sep. 29, 2017, now Pat. No. 10,074,709.

(51) Int. Cl.

| | | |
|---|---|---|
| *H01L 29/423* | (2006.01) | |
| *H01L 29/66* | (2006.01) | |
| *H01L 29/786* | (2006.01) | |
| *H10K 50/818* | (2023.01) | |
| *H10K 59/121* | (2023.01) | |
| *H10K 59/123* | (2023.01) | |
| *H10K 59/124* | (2023.01) | |
| *H10K 50/16* | (2023.01) | |
| *H10K 50/17* | (2023.01) | |
| *H10K 50/856* | (2023.01) | |
| *H10K 71/00* | (2023.01) | |
| *H10K 102/00* | (2023.01) | |

(52) U.S. Cl.
CPC .. *H01L 29/66969* (2013.01); *H01L 29/78648* (2013.01); *H01L 29/7869* (2013.01); *H10K 50/818* (2023.02); *H10K 59/123* (2023.02); *H10K 59/124* (2023.02); *H01L 27/1225* (2013.01); *H01L 27/1248* (2013.01); *H01L 27/1288* (2013.01); *H10K 50/16* (2023.02); *H10K 50/171* (2023.02); *H10K 50/856* (2023.02); *H10K 59/1201* (2023.02); *H10K 71/00* (2023.02); *H10K 2102/00* (2023.02)

(58) Field of Classification Search
CPC .... H10K 50/16; H10K 50/171; H10K 50/818; H10K 50/856; H10K 2102/00; H01L 29/42384; H01L 29/66969; H01L 29/78648; H01L 29/7869; H01L 27/124; H01L 27/1225; H01L 27/1248; H01L 27/1288
USPC .......................................................... 257/40
See application file for complete search history.

(56) References Cited

U.S. PATENT DOCUMENTS

| | | |
|---|---|---|
| 6,730,970 B1 | 5/2004 | Katoh et al. |
| 8,344,387 B2 | 1/2013 | Akimoto et al. |
| 8,421,068 B2 | 4/2013 | Yamazaki et al. |
| 8,427,607 B2 | 4/2013 | Lee et al. |
| 8,598,610 B2 | 12/2013 | Oda |
| 8,816,380 B2 | 8/2014 | Oda |
| 9,899,420 B2 | 2/2018 | Yamazaki et al. |
| 10,020,374 B2 | 7/2018 | Sone et al. |
| 10,074,709 B1 | 9/2018 | Tanaka |
| 10,141,343 B2 | 11/2018 | Ito et al. |
| 10,141,384 B2 | 11/2018 | Takata |
| 10,158,005 B2 | 12/2018 | Akimoto et al. |
| 10,326,008 B2 | 6/2019 | Kimura |
| 10,388,520 B2 | 8/2019 | Yamazaki et al. |
| 10,418,384 B2 | 9/2019 | Yamazaki et al. |
| 10,615,233 B2 | 4/2020 | Muccini et al. |
| 11,233,132 B2 | 1/2022 | Kimura |
| 11,239,449 B2 | 2/2022 | Tanaka |
| 2002/0089616 A1 | 7/2002 | Hashimoto et al. |
| 2002/0149722 A1 | 10/2002 | Anno et al. |
| 2002/0167280 A1 | 11/2002 | Hayashi et al. |
| 2003/0137242 A1 | 7/2003 | Seki |
| 2003/0184699 A1 | 10/2003 | Matsumoto et al. |
| 2003/0197666 A1 | 10/2003 | Akimoto et al. |
| 2004/0095168 A1 | 5/2004 | Miyazawa |
| 2004/0222429 A1 | 11/2004 | Yamazaki et al. |
| 2004/0227891 A1 | 11/2004 | Hirota |
| 2005/0018114 A1 | 1/2005 | Park et al. |
| 2005/0199880 A1 | 9/2005 | Hoffman et al. |
| 2007/0069202 A1 | 3/2007 | Choi et al. |
| 2007/0126671 A1 | 6/2007 | Naoaki |
| 2007/0269936 A1 | 11/2007 | Tanaka et al. |
| 2008/0122341 A1 | 5/2008 | Orita et al. |
| 2009/0135105 A1 | 5/2009 | Nakamura et al. |
| 2009/0140955 A1 | 6/2009 | Nakamura et al. |
| 2009/0179195 A1 | 7/2009 | Obata et al. |
| 2009/0179208 A1 | 7/2009 | Obata et al. |
| 2009/0189161 A1 | 7/2009 | Honda |
| 2009/0206332 A1 | 8/2009 | Son et al. |
| 2009/0315043 A1 | 12/2009 | Nakamura et al. |
| 2010/0102313 A1 | 4/2010 | Miyairi et al. |
| 2010/0193782 A1 | 8/2010 | Sakata |
| 2010/0200851 A1 | 8/2010 | Oikawa et al. |
| 2010/0224878 A1 | 9/2010 | Kimura |
| 2010/0244020 A1 | 9/2010 | Sakata et al. |
| 2010/0244031 A1 | 9/2010 | Akimoto et al. |
| 2010/0244710 A1 | 9/2010 | Obata et al. |
| 2010/0279474 A1 | 11/2010 | Akimoto et al. |
| 2011/0024740 A1 | 2/2011 | Yamazaki et al. |
| 2011/0031492 A1 | 2/2011 | Yamazaki et al. |
| 2011/0031496 A1 | 2/2011 | Yamazaki et al. |
| 2011/0090417 A1 | 4/2011 | Kim et al. |
| 2011/0108835 A1 | 5/2011 | Kim et al. |
| 2011/0127521 A1 | 6/2011 | Yamazaki |
| 2011/0133178 A1 | 6/2011 | Yamazaki et al. |
| 2011/0141076 A1 | 6/2011 | Fukuhara et al. |
| 2011/0147738 A1 | 6/2011 | Yamazaki et al. |
| 2011/0181349 A1 | 7/2011 | Yamazaki et al. |
| 2011/0212570 A1 | 9/2011 | Yamazaki et al. |
| 2011/0240987 A1 | 10/2011 | Lee et al. |
| 2011/0240994 A1 | 10/2011 | Yamazaki |
| 2011/0248258 A1 | 10/2011 | Kim et al. |
| 2012/0007083 A1 | 1/2012 | You et al. |
| 2012/0112200 A1 | 5/2012 | Nagano |
| 2012/0138922 A1 | 6/2012 | Yamazaki et al. |
| 2012/0146062 A1 | 6/2012 | Oda |
| 2012/0146713 A1 | 6/2012 | Kim et al. |
| 2012/0248451 A1 | 10/2012 | Sone et al. |
| 2012/0313903 A1 | 12/2012 | Pyon et al. |
| 2013/0001602 A1 | 1/2013 | Park et al. |
| 2013/0240842 A1 | 9/2013 | Rinzler et al. |
| 2013/0270552 A1 | 10/2013 | Yamazaki et al. |
| 2013/0328045 A1 | 12/2013 | Takata et al. |
| 2014/0111406 A1 | 4/2014 | Wang et al. |
| 2014/0340608 A1 | 11/2014 | Yamazaki et al. |
| 2015/0137103 A1 | 5/2015 | Hosono et al. |
| 2015/0153599 A1 | 6/2015 | Yamazaki et al. |
| 2015/0179802 A1* | 6/2015 | Kim .................. H01L 29/7869 257/43 |
| 2015/0221678 A1 | 8/2015 | Yamazaki et al. |
| 2015/0228799 A1 | 8/2015 | Koezuka et al. |
| 2016/0056214 A1 | 2/2016 | Pyo et al. |
| 2016/0155858 A1 | 6/2016 | Yoo et al. |
| 2016/0155980 A1 | 6/2016 | Lee et al. |
| 2016/0218324 A1 | 7/2016 | Kim et al. |
| 2016/0284854 A1 | 9/2016 | Okazaki et al. |
| 2016/0285027 A1 | 9/2016 | Hosono et al. |
| 2016/0300950 A1 | 10/2016 | Lee et al. |
| 2016/0329388 A1 | 11/2016 | Yokota et al. |
| 2016/0343868 A1 | 11/2016 | Koezuka et al. |
| 2017/0117705 A1 | 4/2017 | Sekine et al. |
| 2017/0176826 A1 | 6/2017 | Tsuda et al. |
| 2017/0186984 A1 | 6/2017 | Hosono et al. |
| 2018/0122833 A1 | 5/2018 | Lee et al. |
| 2018/0166585 A1 | 6/2018 | Takechi |
| 2018/0301472 A1 | 10/2018 | Matsukizono |
| 2019/0013333 A1 | 1/2019 | Inoue et al. |
| 2020/0089064 A1 | 3/2020 | Morinaga et al. |

(56) References Cited

U.S. PATENT DOCUMENTS

| | | | |
|---|---|---|---|
| 2020/0373430 | A1 | 11/2020 | Shima et al. |
| 2021/0012728 | A1 | 1/2021 | Shan |

FOREIGN PATENT DOCUMENTS

| | | | |
|---|---|---|---|
| CN | 101997007 A | 3/2011 | |
| CN | 102782858 A | 11/2012 | |
| CN | 105762196 A | 7/2016 | |
| CN | 109637493 A | 4/2019 | |
| EP | 2634812 A1 | 9/2013 | |
| EP | 3410490 A3 | 2/2019 | |
| EP | 3618136 A2 | 3/2020 | |
| JP | H09-269508 A | 10/1997 | |
| JP | 2909266 B2 | 6/1999 | |
| JP | H11-212493 A | 8/1999 | |
| JP | 2001-144298 A | 5/2001 | |
| JP | 2001-291583 A | 10/2001 | |
| JP | 2002-311424 A | 10/2002 | |
| JP | 2002-343578 A | 11/2002 | |
| JP | 2003-005203 A | 1/2003 | |
| JP | 2003-108034 A | 4/2003 | |
| JP | 2003-295207 A | 10/2003 | |
| JP | 2004-145300 A | 5/2004 | |
| JP | 2004-341465 A | 12/2004 | |
| JP | 2005-004193 A | 1/2005 | |
| JP | 2005-338653 A | 12/2005 | |
| JP | 2006-165529 A | 6/2006 | |
| JP | 2007-053286 A | 3/2007 | |
| JP | 2007-095685 A | 4/2007 | |
| JP | 2007-149922 A | 6/2007 | |
| JP | 2007-157871 A | 6/2007 | |
| JP | 2007-310334 A | 11/2007 | |
| JP | 2008-066385 A | 3/2008 | |
| JP | 2008-084655 A | 4/2008 | |
| JP | 2009-075613 A | 4/2009 | |
| JP | 2009-175563 A | 8/2009 | |
| JP | 2010-040552 A | 2/2010 | |
| JP | 2010-050165 A | 3/2010 | |
| JP | 2010-153842 A | 7/2010 | |
| JP | 2010-206187 A | 9/2010 | |
| JP | 2010-232645 A | 10/2010 | |
| JP | 2010-232651 A | 10/2010 | |
| JP | 2010-251731 A | 11/2010 | |
| JP | 2010-283338 A | 12/2010 | |
| JP | 2011-049550 A | 3/2011 | |
| JP | 2011-128442 A | 6/2011 | |
| JP | 2011-146694 A | 7/2011 | |
| JP | 2011-199273 A | 10/2011 | |
| JP | 2011-223004 A | 11/2011 | |
| JP | 2012-146764 A | 8/2012 | |
| JP | 2012-191131 A | 10/2012 | |
| JP | 2014-505324 A | 2/2014 | |
| JP | 2014-154382 A | 8/2014 | |
| JP | 2014-218706 A | 11/2014 | |
| JP | 2015-143396 A | 8/2015 | |
| JP | 2015-179822 A | 10/2015 | |
| JP | 2015-228515 A | 12/2015 | |
| JP | 2016-181695 A | 10/2016 | |
| JP | 2016-213052 A | 12/2016 | |
| JP | 2016-219801 A | 12/2016 | |
| JP | 2017-005064 A | 1/2017 | |
| JP | 2017-057288 A | 3/2017 | |
| JP | 2017-084868 A | 5/2017 | |
| JP | 2017-116622 A | 6/2017 | |
| JP | 2017-168860 A | 9/2017 | |
| JP | 2017-537350 A | 12/2017 | |
| JP | 2018-098364 A | 6/2018 | |
| JP | 2018-133144 A | 8/2018 | |
| JP | 2018-206822 A | 12/2018 | |
| JP | 2019-016659 A | 1/2019 | |
| JP | 2019-149561 A | 9/2019 | |
| JP | 2020-035942 A | 3/2020 | |
| KR | 10-2006-0003633 A | 1/2006 | |
| KR | 10-2011-0015373 A | 2/2011 | |
| KR | 10-2011-0041139 A | 4/2011 | |
| KR | 10-2013-0037569 A | 4/2013 | |
| KR | 10-2014-0081662 A | 7/2014 | |
| KR | 10-2016-0120394 A | 10/2016 | |
| KR | 10-2017-0021903 A | 2/2017 | |
| TW | 201545360 A | 12/2015 | |
| TW | 201630181 A | 8/2016 | |
| TW | 201639213 A | 11/2016 | |
| TW | 201714313 A | 4/2017 | |
| WO | 2005/071764 A1 | 8/2005 | |
| WO | 2007/043697 A1 | 4/2007 | |
| WO | 2007/043704 A1 | 4/2007 | |
| WO | 2015/098458 A1 | 7/2015 | |
| WO | 2016/043234 A1 | 3/2016 | |
| WO | 2016/195039 A1 | 12/2016 | |
| WO | 2019/043510 A1 | 3/2019 | |

OTHER PUBLICATIONS

Extended European search report issued in European Patent Application No. 21827868.7 dated Sep. 5, 2023.
Hee Yeon Kim et al., "Transparent InP Quantum Dot Light-Emitting Diodes with ZrO2 Electron Transport Layer and Indium Zinc Oxide Top Electrode", Advanced Functional Materials, Wiley-VCH Verlag GMBH & Co. KGAA, DE, vol. 26, No. 20, Apr. 6, 2016, pp. 3454-3461, XP072413443.
Japanese Office Action issued in Japanese Patent Application No. 2020-018120 dated Sep. 5, 2023.
Japanese Office Action issued in Japanese Patent Application No. 2022-532499 dated Jul. 4, 2023.
Chinese Office Action issued in Chinese Patent Application No. 201810479338.8 dated Apr. 1, 2023.
Taiwanese Office Action issued in Taiwanese Patent Application No. 112116069 dated May 29, 2023.
Korean Office Action issued in Korean Patent Application No. 10-2023-0014691 dated Sep. 27, 2023.
International Search Report issued in Patent Application No. PCT/JP2021/023638 dated Sep. 14, 2021.
Written Opinion issued in Patent Application No. PCT/JP2021/023638 dated Sep. 14, 2021.
Partial European Search Report for Application No. 18173345.2 dated Oct. 2, 2018.
Extended European Search Report for Application No. 18173345.2 dated Jan. 14, 2019.
Extended European Search Report for 19186679.7 dated Feb. 11, 2020.
Extended European Search Report for 19199145.4 dated Feb. 14, 2020.
Extended European Search Report for 19213814.7 dated May 29, 2020.
Extended European search report issued in European Patent Application No. 21154269.1 dated Jul. 15, 2021.
Extended European search report issued in European Patent Application No. 22161095.9 dated May 9, 2022.
Hosono et al., "Transparent Amorphous Oxide Semiconductors for Organic Electronics: Application to Inverted OLEDs", Proceedings of the National Academy of Sciences, vol. 114, No. 2, Dec. 27, 2016, pp. 233-238.
Gyujeong Lee et al., "Vertical organic light-emitting transistor showing a high current on/off ratio through dielectric encapsulation for the effective charge pathway", Journal of Applied Physics, Jan. 12, 2017, vol. 121, p. 024502-(1-8).
Japanese Office Action issued in Japanese Patent Application No. 2019-029934 dated Aug. 2, 2022.
Japanese Office Action issued in Japanese Patent Application No. 2018-162568 dated Aug. 23, 2022.
Japanese Office Action issued in Japanese Patent Application No. 2018-180487 dated Sep. 6, 2022.
Taiwanese Office Action issued in Taiwanese Patent Application No. 111131731 dated Sep. 1, 2022.
U.S. Office action for U.S. Appl. No. 16/206,744 dated Mar. 5, 2020.

(56) References Cited

OTHER PUBLICATIONS

Office Action dated Oct. 14, 2020 for the U.S. Appl. No. 16/206,744.
U.S. Office Action issued in U.S. Appl. No. 16/206,744 dated Apr. 23, 2021.
U.S. Office Action issued in U.S. Appl. No. 16/577,044 dated Jun. 24, 2021.
United States Office Action dated Jun. 7, 2022 issued in United States U.S. Appl. No. 17/163,939.
Notice of Allowance dated Sep. 30, 2020 for the U.S. Appl. No. 16/678,229.
Notice of Allowance dated Jan. 19, 2021 for the corresponding to Japanese application No. 2017-107278.
Notice of Allowance dated Nov. 8, 2022 for the corresponding to Korean application No. KR10-2018-0057002.
Extended European Search Report dated Mar. 2, 2023 for EP application No. 22212464.6.
U.S. Office Action issued in U.S. Appl. No. 18/299,101 dated Nov. 9, 2023.
Japanese Office Action issued in Japanese Patent Application No. 2023-035885 dated Nov. 21, 2023.
Extended European Search Report issued for European application No. 23191776.6 dated Nov. 28, 2023.
Woo Jae Jang et al., "Low Resistive High-Work-Function Gate Electrode for Transparent a-IGZO TFTs", IEEE Transactions On Electron Devices, IEEE, USA, vol. 64, No. 1, Jan. 1, 2017, pp. 164-169, XP011637544 ISSN: 0018-9383, DOI:10.1109/TED.2016.2631567 [retrieved on Dec. 26, 2016].
Korean Office Action issued in Korean Patent Application No. 10-2022-7042390 dated Jan. 18, 2024.
European Office Action issued in European Patent Application No. 19186679.7 dated Jan. 24, 2024.

\* cited by examiner

DISPLAY DEVICE AND METHOD FOR MANUFACTURING THE SAME

CROSS REFERENCE TO RELATED APPLICATIONS

This is a continuation of U.S. patent application Ser. No. 17/543,793 filed on Dec. 7, 2021, which is a continuation of U.S. patent application Ser. No. 16/860,160 filed on Apr. 28, 2020, which is a continuation of U.S. patent application Ser. No. 16/516,749 filed on Jul. 19, 2019, which is a continuation of U.S. patent application Ser. No. 16/100,145 filed on Aug. 9, 2018, which is a continuation of U.S. patent application Ser. No. 15/721,271 filed on Sep. 29, 2017, which claims priority from Japanese Patent Application No. 2017-107278 filed on May 31, 2017. The contents of these applications are incorporated herein by reference in its entirety.

FIELD

The present invention relates to a structure of a display device. An embodiment of the present invention relates to a structure of a transistor and a display element included in a pixel of a display device.

BACKGROUND

An active matrix display device includes a display element and a transistor driving the display element that are provided in each of pixels thereof. Usable as the display element is a liquid crystal element including a pair of electrodes and a liquid crystal layer provided between the pair of electrodes or an organic electroluminescence element (hereinafter, referred to as an "organic EL element") including a cathode electrode, an anode electrode and a layer that is provided between the cathode electrode and the anode electrode and contains an organic electroluminescence material. The transistor is formed of an amorphous silicon semiconductor or a polycrystalline silicon semiconductor. Recently, a thin film transistor formed of an oxide semiconductor is also used.

For example, a display device including an organic EL element and a driving transistor that includes a semiconductor layer formed of silicon, a gate insulating layer and a gate electrode is disclosed (e.g., Japanese Laid-Open Patent Publication No. 2007-053286). Also, a display device including an organic EL element and a transistor driving the organic EL element that are integrally formed of an oxide semiconductor is disclosed (e.g., Japanese Laid-Open Patent Publication No. 2014-154382).

SUMMARY

A display device in an embodiment according to the present invention includes a substrate; and a plurality of pixels provided on the substrate. The plurality of pixels each include a driving transistor and an organic EL element electrically connected with the driving transistor. The driving transistor includes an oxide semiconductor layer; a first gate electrode including a region overlapping the oxide semiconductor layer, the first gate electrode being provided on a surface of the oxide semiconductor layer facing the substrate; a first insulating layer provided between the first gate electrode and the oxide semiconductor layer; a second gate electrode including a region overlapping the oxide semiconductor layer and the first gate electrode, the second gate electrode being provided on a surface of the oxide semiconductor layer opposite to the surface facing the substrate; a second insulating layer provided between the second gate electrode and the oxide semiconductor layer; and a first transparent conductive layer and a second transparent conductive layer provided between the oxide semiconductor layer and the first insulating layer, the first transparent conductive layer and the second transparent conductive layer each including a region in contact with the oxide semiconductor layer. The organic EL element includes a light-transmissive first electrode; a second electrode provided to face the first electrode; a light emitting layer provided between the first electrode and the second electrode; and an electron transfer layer provided between the light emitting layer and the first electrode. The first electrode is continuous from the first transparent conductive layer.

A display device in an embodiment according to the present invention includes a substrate; and a plurality of pixels provided on the substrate. The plurality of pixels each include a driving transistor and an organic EL element electrically connected with the driving transistor. The driving transistor includes an oxide semiconductor layer; a first gate electrode including a region overlapping the oxide semiconductor layer, the first gate electrode being provided on a surface of the oxide semiconductor layer facing the substrate; a first insulating layer provided between the first gate electrode and the oxide semiconductor layer; a second gate electrode including a region overlapping the oxide semiconductor layer and the first gate electrode, the second gate electrode being provided on a surface of the oxide semiconductor layer opposite to the surface facing the substrate; and a second insulating layer provided between the second gate electrode and the oxide semiconductor layer. The organic EL element includes a light-transmissive first electrode; a second electrode provided to face the first electrode; a light emitting layer provided between the first electrode and the second electrode; and an electron transfer layer provided between the light emitting layer and the first electrode. The first electrode is continuous from the first transparent conductive layer.

DESCRIPTION OF EMBODIMENTS

Figure 1:
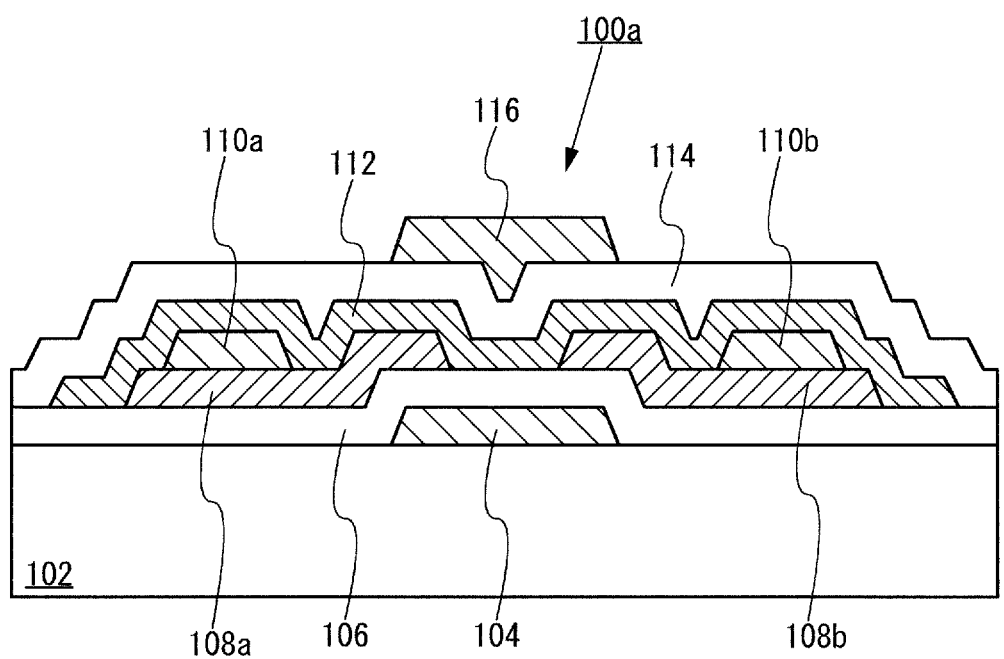
FIG. 1 is a cross-sectional view showing a structure of a transistor in an embodiment according to the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" another component encompasses a case where such a component is in contact with the another component and also a case where such a component is above or below the another component, namely, a case where still another component is provided between such a component and the another component, unless otherwise specified.

In order to increase the productivity of display devices, it is needed to shorten the time from when a transparent insulating substrate is prepared until an active matrix element substrate is completed. However, for producing an active matrix element substrate including a complementary circuit that includes a transistor formed of polycrystalline silicon, eight or more photomasks are required. Polycrystalline silicon films produced by laser annealing are varied in the crystallinity, and thus have a problem of deteriorating the display quality when being used for a driving transistor.

In the meantime, a transistor formed of an oxide semiconductor requires precise control on the carrier concentration. An oxide semiconductor is a type of compound semiconductor containing a plurality of metal oxides, and thus requires, in a production process thereof, control on the composition, on the oxygen deficiency, and on impurities. In order to control the carrier concentration of a channel by contriving the device structure, it is effective to provide a back gate. However, this has problems of complicating the structure and increasing the number of photomasks needed to produce the device.

In the case where the driving transistor is formed of oxide semiconductor, a drain of the transistor is connected with a cathode of the organic EL element. Therefore, an electron transfer layer of the organic EL element needs to be formed before a light emitting element; namely, the organic EL element needs to have a so-called inverted stack structure. The organic EL element of an inverted stack structure has a problem of not having characteristics equivalent to the characteristics of an organic EL element having a normal stack structure, in which the light emitting layer is stacked on a hole transfer layer. Some of the embodiments described below provide a display device solving one or a plurality of these problems.

Embodiment 1

1-1. Transistor Structure

FIG. 1 is a cross-sectional view showing a structure of a transistor 100a in embodiment 1 according to the present invention. The transistor 100a includes a first gate electrode 104, a first insulating layer 106, an oxide semiconductor layer 112, a second insulating layer 114, and a second gate electrode 116, which are provided on a substrate 102 having an insulating surface.

The first gate electrode 104 is located to face one of two main surfaces of the oxide semiconductor layer 112 (surface facing the substrate 102). The first insulating layer 106 is located between the oxide semiconductor layer 112 and the first gate electrode 104. The second gate electrode 116 is located to face the other main surface of the oxide semiconductor layer 112 (surface opposite to the surface facing the substrate 102). The second insulating layer 114 is located between the oxide semiconductor layer 112 and the second gate electrode 116. The first gate electrode 104 and the second gate electrode 116 are located to partially overlap each other while having the first insulating layer 106, the oxide semiconductor layer 112 and the second insulating layer 114 between the first gate electrode 104 and the second gate electrode 116. In the transistor 100a, a channel is formed in a region where the oxide semiconductor layer 112 overlaps the first gate electrode 104 and the second gate electrode 116. The first insulating layer 106 acts as a gate insulating film in a region where the oxide semiconductor layer 112 and the first gate electrode 104 overlap each other. The second insulating layer 114 acts as a gate insulating film in a region where the oxide semiconductor layer 112 and the second gate electrode 116 overlap each other.

A first transparent conductive layer 108a and a second transparent conductive layer 108b are located between the oxide semiconductor layer 112 and the first insulating layer 106. The first transparent conductive layer 108a and the second transparent conductive layer 108b are provided in contact with the oxide semiconductor layer 112. The first transparent conductive layer 108a and the second transparent conductive layer 108b are located such that one end of the first transparent conductive layer 108a and one end of the second transparent conductive layer 108b overlap the first gate electrode 104 and the second gate electrode 116. One of the first transparent conductive layer 108a and the second transparent conductive layer 108b acts as a source region, and the other of the first transparent conductive layer 108a and the second transparent conductive layer 108b acts as a drain region. In the structure shown in FIG. 1, the one ends of the first transparent conductive layer 108a and the second transparent conductive layer 108b overlap the first gate electrode 104 and the second gate electrode 116. Therefore, the oxide semiconductor layer 112 does not include any offset region (region having a high resistance). Thus, the level of on-current is increased.

A first line 110a is provided in contact with the first transparent conductive layer 108a, and a second line 110b is provided in contact with the second transparent conductive layer 108b. The first line 110a is located between the first transparent conductive layer 108a and the oxide semiconductor layer 112, and the second line 110b is located between the second transparent conductive layer 108b and the oxide semiconductor layer 112. The first line 110a and the second line 110b are respectively located in contact with the first transparent conductive layer 108a and the second transparent conductive layer 108b. This decreases the number of photolithography steps as described below. In the transistor 100a in this embodiment, A region where a channel is formed in the oxide semiconductor layer 112 is separated from the first line 110a or the second line 110b. Therefore, the oxide semiconductor layer 112 is prevented from being contaminated with a metal material usable for the first line 110a and the second line 110b.

1-2. Operations and Functions of the Transistor

In the transistor 100a, the first gate electrode 104 is located to face one of the two main surfaces of the oxide semiconductor layer 112, and the second gate electrode 116 is located to face the other main surface of the oxide semiconductor layer 112. With such a structure, a constant potential (fixed potential) may be applied to one of the first gate electrode 104 and the second gate electrode 116, so that either one of the first gate electrode 104 and the second first gate electrode 116 act as a back gate. The transistor 100a is substantially of an n-channel type. Therefore, for example, one of the first gate electrode 104 and the second gate electrode 116 may be supplied with a potential lower than a source potential, so that the gate electrode supplied with such a potential acts as a back gate electrode. Thus, a threshold voltage of the transistor 100a is controlled. The first gate electrode 104 and the second gate electrode 116 of the transistor 100a may be supplied with the same gate voltage, so that the transistor 100a acts as a dual gate transistor. Thus, the transistor 100a increases the level of on-current and improves the frequency characteristics.

1-3. Oxide Semiconductor Layer

The oxide semiconductor layer 112 contains one or a plurality of elements selected from indium (In), zinc (Zn), gallium (Ga), tin (Sn), aluminum (Al), and magnesium (Mg). For example, an oxide semiconductor material used to form the oxide semiconductor layer 112 may be a four-component oxide material, a three-component oxide material, a two-component oxide material or a one-component oxide material showing semiconductor characteristics. Examples of the four-component oxide material include an $In_2O_3$—$Ga_2O_3$—$SnO_2$—ZnO-based oxide material and the like. Examples of the three-component oxide material include an $In_2O_3$—$Ga_2O_3$—ZnO-based oxide material, an $In_2O_3$—$SnO_2$—ZnO-based oxide material, an $In_2O_3$—$Al_2O_3$—ZnO-based oxide material, a $Ga_2O_3$—$SnO_2$—ZnO-based oxide material, a $Ga_2O_3$—$Al_2O_3$—ZnO-based oxide material, an $SnO_2$—$Al_2O_3$—ZnO-based oxide material, and the like. Examples of the two-component oxide material include an $In_2O_3$—ZnO-based oxide material, an $SnO_2$—ZnO-based oxide material, an $Al_2O_3$—ZnO-based oxide material, an MgO—ZnO-based oxide material, an $SnO_2$—MgO-based oxide material, an $In_2O_3$—MgO-based oxide material, and the like. Examples of the one-component oxide material include an $In_2O_3$-based metal oxide material, an $SnO_2$-based metal oxide material, a ZnO-based metal oxide material, and the like. The above-listed oxide semiconductors may include silicon (Si), nickel (Ni), tungsten (W), hafnium (Hf), or titanium (Ti). For example, the In—Ga—Zn—O-based oxide material is an oxide material containing at least In, Ga and Zn. There is no specific limitation on the composition ratio thereof. In other words, the oxide semiconductor layer 112 may be formed of a thin film represented by chemical formula $InMO_3(ZnO)_m$ (m>0). M represents one or a plurality of metal elements selected from Ga, Al, Mg, Ti, Ta, W, Hf and Si. The oxide material contained in each of the four-component oxide materials, the three-component oxide materials, the two-component oxide materials and one-component oxide materials listed above is not limited to having a stoichiometric composition, but may have a composition shifted from the stoichiometric composition.

The oxide semiconductor layer 112 is formed by sputtering. For example, the oxide semiconductor layer 112 may be formed by use of a sputtering target compatible to any of the four-component oxide materials, the three-component oxide materials, the two-component oxide materials and the one-component oxide materials listed above and also by use of, as sputtering gas, noble gas such as argon (Ar), xenon (Xe) or the like or mixed gas of noble gas and oxygen ($O_2$).

The oxide semiconductor layer 112 desirably has a carrier concentration of about $1\times10^{15}/cm^3$ to $5\times10^{18}/cm^3$ in order to form a channel layer of the transistor 100a. As long as the carrier concentration of the oxide semiconductor layer 112 is in this range, a normally-off transistor is formed. In addition, an on-current/off-current ratio (on/off ratio) of about 107 to $10^{10}$ is provided.

1-4. Transparent Conductive Layers

The first transparent conductive layer 108a and the second transparent conductive layer 108b are formed of a metal oxide material, a metal nitride material, or a metal oxide nitride material, all of which are conductive. Examples of the metal nitride material usable for the first transparent conductive layer 108a and the second transparent conductive layer 108b include indium tin oxide ($In_2O_3$—$SnO_2$: ITO), indium zinc oxide ($In_2O_3$—ZnO: IZO), and tin oxide ($SnO_2$). Such a metal oxide material forms a good ohmic contact with the oxide semiconductor layer 112.

Examples of the metal oxide material usable for the first transparent conductive layer 108a and the second transparent conductive layer 108b also include titanium oxide ($TiO_x$) and the like. Examples of the metal nitride material usable for the first transparent conductive layer 108a and the second transparent conductive layer 108b include titanium nitride ($TiN_x$), zirconium nitride ($ZrN_x$), and the like. Examples of the metal oxide nitride material usable for the first transparent conductive layer 108a and the second transparent conductive layer 108b include titanium oxide nitride ($TiO_xN_y$), tantalum oxide nitride ($TaO_xN_y$), zirconium oxide nitride ($ZrO_xN_y$), hafnium oxide nitride ($HfO_xN_y$), and the like. The metal oxide materials, the metal nitride materials, and the metal oxide nitride materials described above may contain trace amount of metal element in order to improve the conductivity. For example, titanium oxide doped with niobium ($TiO_x$:Nb) may be used. Use of such a metal oxide material, such a metal nitride material, or such a metal oxide nitride material guarantees stability even in the case where the first transparent conductive layer 108a and the second transparent conductive layer 108b are in contact with the first line 110a and the second line 110b, respectively. Namely, use of such a metal oxide material, such a metal nitride material, or such a metal oxide nitride material prevents an oxidation-reduction reaction (local cell reaction) with aluminum (Al) having a lower potential.

1-5. Insulating Layers

The first insulating layer 106 and the second insulating layer 114 are formed of an inorganic insulating material. Examples of the inorganic insulating material usable for the first insulating layer 106 and the second insulating layer 114 include silicon oxide, silicon nitride, silicon oxide nitride, aluminum oxide, and the like. The first insulating layer 106 and the second insulating layer 114 each have a single-layer structure, or a stack structure including a plurality of films, formed of such an organic insulating material. For example, the first insulating layer 106 may include a silicon nitride film and a silicon oxide film stacked in this order from the substrate 102 side. The second insulating layer 114 may include a silicon oxide film and a silicon nitride film stacked in this order from the oxide semiconductor layer 112 side. The first insulating layer 106 and the second insulating layer 114, in the case of including a plurality of organic insulating films, alleviate the action of an internal stress and also improve the barrier property against water vapor or the like.

It is preferable that surfaces of the first insulating layer 106 and the second insulating layer 114 that are in contact with the oxide semiconductor layer 112 are formed of a silicon oxide film, a silicon oxide nitride film or an aluminum oxide film. Since such an oxide insulating film is in contact with the oxide semiconductor layer 112 (in other words, a nitride insulating film is not in contact with the oxide semiconductor layer 112), diffusion of impurities such as hydrogen or the like, which generates a donor in the oxide semiconductor layer 112, is suppressed. Since the oxide insulating film is provided in contact with the oxide semiconductor layer 112, a defect (donor) caused by oxygen deficiency is prevented from being caused to the oxide semiconductor layer 112.

1-6. Gate Electrodes

The first gate electrode 104 and the second gate electrode 116 are formed of a metal material such as aluminum (Al), molybdenum (Mo), tungsten (W), zirconium (Zr) or the like. For example, the first gate electrode 104 and the second gate electrode 116 may each be formed of a film of aluminum (Al), a molybdenum-tungsten alloy (MoW), or the like. The first gate electrode 104 and the second gate electrode 116 may be formed of an aluminum alloy, a copper alloy, or a silver alloy. Examples of the aluminum alloy usable for the first gate electrode 104 and the second gate electrode 116 include an aluminum-neodymium alloy (Al—Nd), an aluminum-neodymium-nickel alloy (Al—Nd—Ni), an aluminum-carbon-nickel alloy (Al—C—Ni), a copper-nickel alloy (Cu—Ni), and the like. Alternatively, the first gate electrode 104 and the second gate electrode 116 may each be formed of a transparent conductive film of indium tin oxide (ITO), indium zinc oxide (IZO), zinc oxide (ZnO) or the like.

1-7. Lines

The first line 110a and the second line 110b are formed of a metal material having a high conductivity such as aluminum (Al), copper (Cu) or the like. For example, the first line 110a and the second line 110b are formed of an aluminum alloy, a copper alloy, or a silver alloy. Examples of the aluminum alloy usable for the first line 110a and the second line 110b include an aluminum-neodymium alloy (Al—Nd), an aluminum-titanium alloy (Al—Ti), an aluminum-silicon alloy (Al—Si), an aluminum-neodymium-nickel alloy (Al—Nd—Ni), an aluminum-carbon-nickel alloy (Al—C—Ni), a copper-nickel alloy (Cu—Ni), and the like. Use of such a metal material provides heat resistance and decreases the line resistance.

1-8. Production Method

Figure 2A:
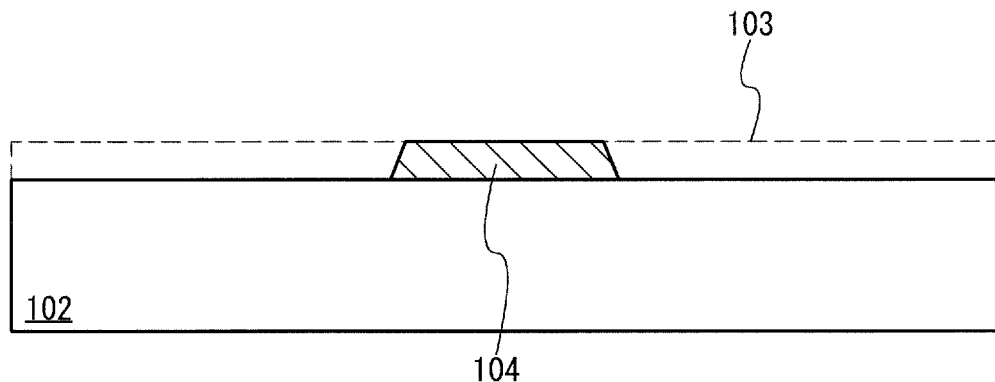
FIG. 2A shows a method for producing the transistor in an embodiment according to the present invention, and shows a stage of forming a first gate electrode.

Now, a method for producing the transistor 100a will be described. FIG. 2A shows a stage of forming the first gate electrode 104 on the substrate 102. The substrate 102 may be, for example, a transparent insulating substrate. The transparent insulating substrate is formed of non-alkali glass such as aluminosilicate glass, aluminoborosilicate glass or the like, or quartz.

First, a first conductive film 103 is formed on one surface of the substrate 102. Then, a resist mask is formed on the first conductive film 103 by a photolithography step, and the first gate electrode 104 is formed by an etching step. The first conductive film 103 is not limited to having any specific thickness, but is formed to have a thickness of about 100 nm to 2000 nm. It is preferable that the first gate electrode 104 has tapered ends as seen in a cross-sectional view. The first gate electrode 104 has tapered ends and thus is covered with the first insulating layer 106 with certainty. Therefore, in the etching step of forming the first gate electrode 104, it is preferable to perform anisotropic etching on the first conductive film 103 while chemically milling the resist mask; namely, to perform so-called taper etching. The resist mask that is left after the formation of the first gate electrode 104 is removed by use of a releasing solution or by an ashing process.

Figure 2B:
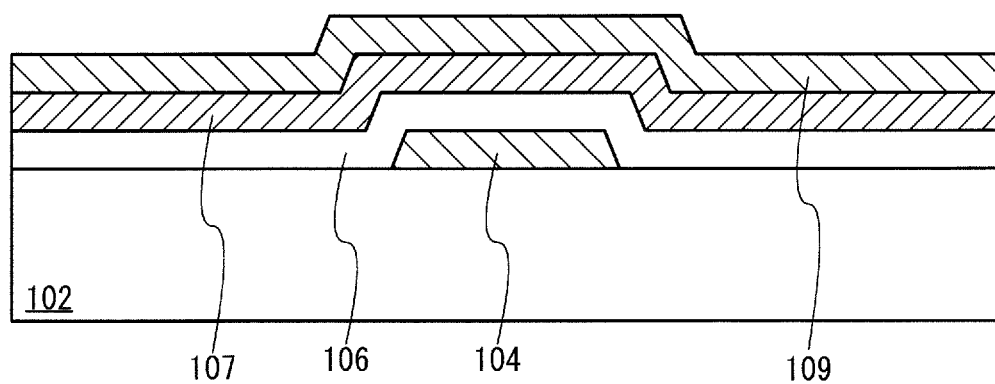
FIG. 2B shows the method for producing the transistor in an embodiment according to the present invention, and shows a stage of forming a first insulating layer, a transparent conductive film, and an oxide semiconductor layer.

FIG. 2B shows a stage of forming the first insulating layer 106, a second conductive film 107, and a third conductive film 109 on the first gate electrode 104. From the second conductive film 107, the first transparent conductive layer 108a and the second transparent conductive layer 108b are formed. From the third conductive film 109, the first line 110a and the second line 110b are formed. The first insulating layer 106 is formed of an inorganic insulating film. For example, the first insulating layer 106 may be a film formed of one or a plurality of materials selected from silicon oxide, silicon nitride, and silicon oxide nitride. In this case, the first insulating layer 106 is formed by plasma CVD (Chemical Vapor Deposition). Alternatively, the first insulating layer 106 may be an aluminum oxide film. In this case, the first insulating layer 106 is formed by sputtering by use of an alumina sputtering target. The first insulating layer 106 is used as a gate insulating layer. Therefore, the first insulating layer 106 is formed to have a thickness of about 100 nm to 500 nm.

The second conductive film 107 used to form the first transparent conductive layer 108a and the second transparent conductive layer 108b is formed of a metal oxide material, a metal nitride material or a metal oxide nitride material, all of which are conductive. The second conductive film 107 is formed by sputtering. The second conductive film 107 used to form the first transparent conductive layer 108a and the second transparent conductive layer 108b is formed of, for example, a conductive metal oxide material to have a thickness of 30 nm to 200 nm. The third conductive film 109 used to form the first line 110a and the second line 110b is formed of a metal material or an alloy material by sputtering. The third conductive film 109 used to form the first line 110a and the second line 110b is formed of a metal material to have a thickness of 200 nm to 2000 nm in order to have a low resistance.

Figure 3A:
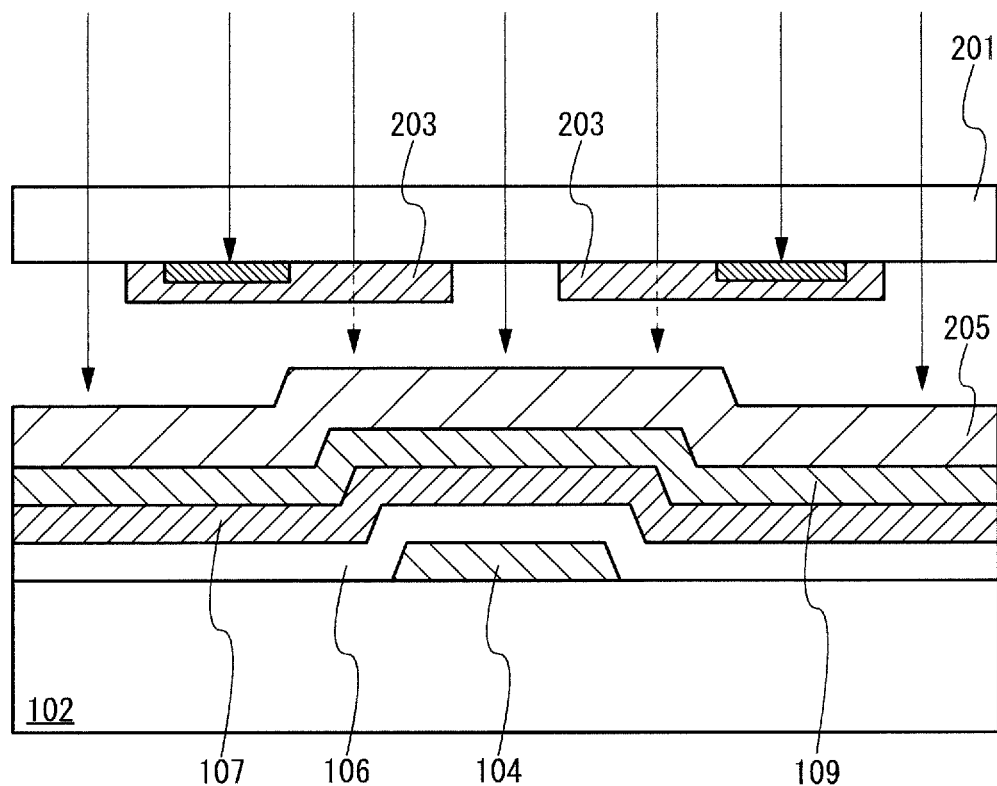
FIG. 3A shows the method for producing the transistor in an embodiment according to the present invention, and shows a stage of exposure performed by use of a multi-gradation photomask.

FIG. 3A shows a lithography step of forming the first line 110a, the second line 110b, the first transparent conductive layer 108a and the second transparent conductive layer 108b. In this example, a multi-gradation exposure method (halftone exposure method) is used. Specifically, the patterns of the first line 110a, the second line 110b, the first transparent conductive layer 108a and the second transparent conductive layer 108b are formed by one photomask.

A positive photoresist film 205 is formed on the third conductive film 109. A multi-gradation photomask 201 is used for exposing the photoresist mask 205 to light. A multi-gradation photomask is available in two types: a gray tone photomask, which has a multi-gradation scale pattern (like a pattern 203) having slits of a resolution equal to, or lower than, the resolution of an exposure device and realizes multi-gradation exposure by the slits blocking a part of light; and a halftone photomask, which realizes multi-gradation exposure by use of a semi-transmissive film. In this embodiment, both types of multi-gradation photomask are usable. As a result of using the multi-gradation photomask 201 for the exposure, the photoresist film 205 has three portions formed therein, namely, an exposed portion, a gradation-exposed portion, and a non-exposed portion.

Figure 3B:
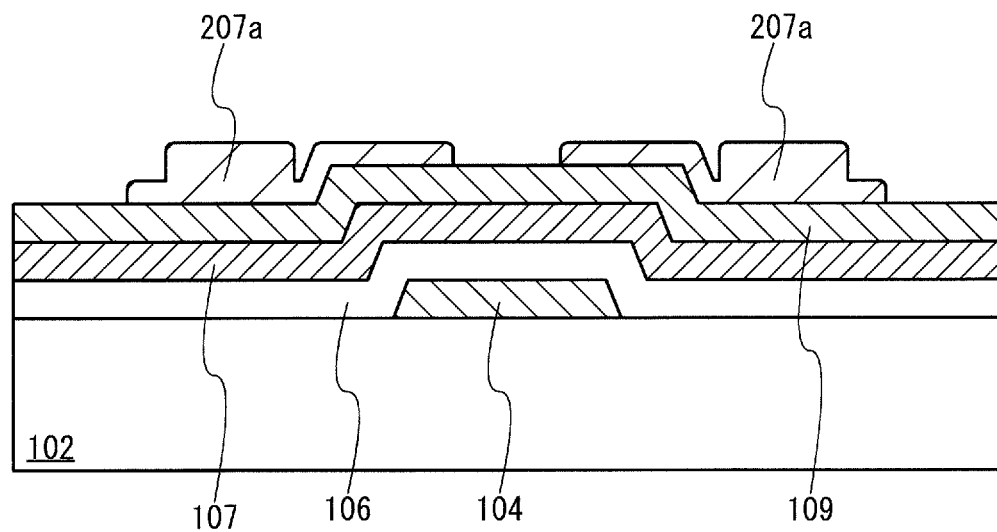
FIG. 3B shows the method for producing the transistor in an embodiment according to the present invention, and shows a stage where a resist mask is formed.

Then, the photoresist film 205 is developed to form a resist mask 207a including regions having different thicknesses as shown in FIG. 3B. As shown in FIG. 3B, the resist mask 207a is thicker in a region corresponding to regions of the third conductive film 109 where the first line 110a and the second line 110b are to be formed, and is thinner in the remaining region.

Figure 4A:
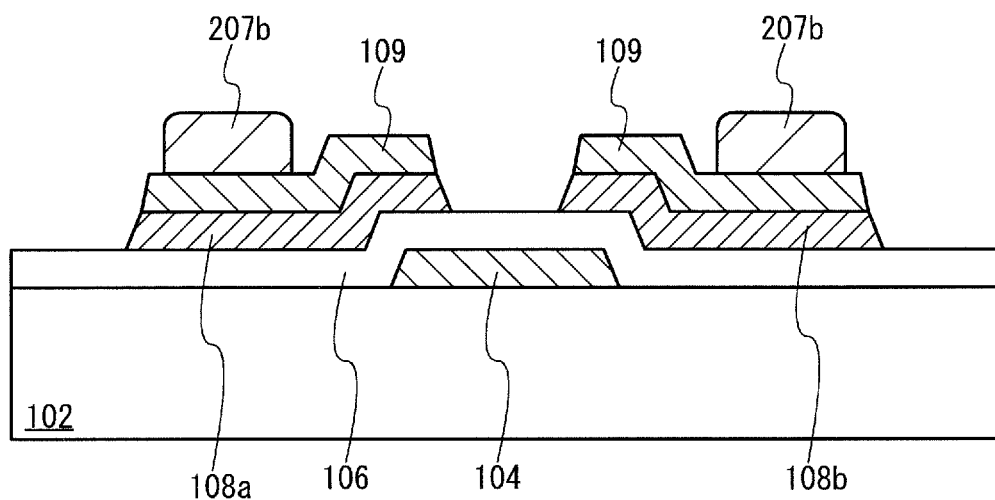
FIG. 4A shows the method for producing the transistor in an embodiment according to the present invention, and shows a stage of etching a second conductive film and a third conductive film.

The third conductive film 109 and the second conductive film 107 are etched by use of the resist mask 207a. There is no specific limitation on the conditions for the etching. For example, the third conductive film 109, which is formed of a metal material, is wet-etched by use of a mixed acid etchant, and the second conductive film 107, which is formed of a metal oxide material, is dry-etched by use of chlorine-based gas. On this stage, the first transparent conductive layer 108a and the second transparent conductive layer 108b are formed. After the etching, an ashing process is performed to remove the thinner region of the resist mask 207a to expose a surface of the third conductive film 109. FIG. 4A shows a resist mask 207b after the ashing process. The resist mask 207b is left on the third conductive film 109.

Figure 4B:
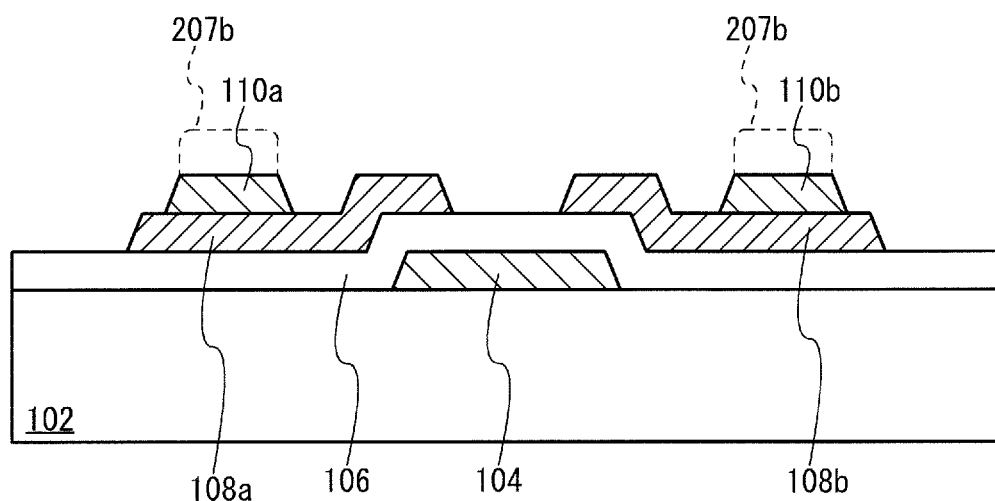
FIG. 4B shows the method for producing the transistor in an embodiment according to the present invention, and shows a stage of etching the third conductive film.

Next, etching is performed on the exposed third conductive film 109. This etching is wet-etching performed by use of, for example, a mixed acid etchant. The second conductive film 107, which is formed of a metal oxide material or the like, is not easily etched away by the mixed acid etchant, and thus the selection ratio is relatively high. Therefore, the shape of the first transparent conductive layer 108a and the second transparent conductive layer 108b below the third conductive film 109 is kept unchanged. FIG. 4B shows a stage where the first line 110a and the second line 110b are formed as a result of the etching performed on the third conductive film 109. After the third conductive film 109 is etched, the resist mask 207b is removed by ashing.

Surfaces of the first transparent conductive layer 108a and the second transparent conductive layer 108b already formed are exposed to oxygen plasma by the ashing process. However, titanium (Ti), tantalum (Ta), hafnium (Hf) or zirconium (Zr) contained as a component of the first transparent conductive layer 108a and the second transparent conductive layer 108b is conductive even when being oxidized. Therefore, even though being exposed to oxygen plasma, the surfaces of the first transparent conductive layer 108a and the second transparent conductive layer 108b form a good contact with the oxide semiconductor layer 112 formed in a later step.

Figure 5A:
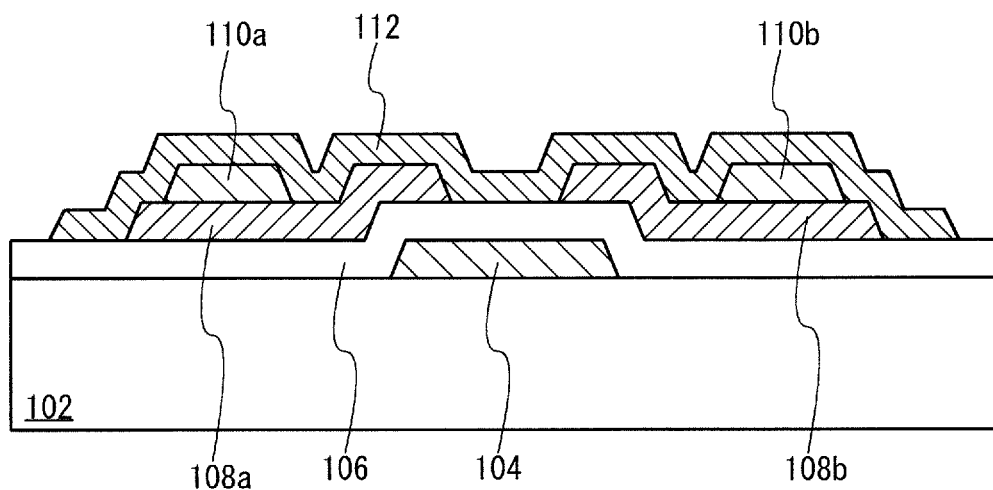
FIG. 5A shows the method for producing the transistor in an embodiment according to the present invention, and shows a stage of forming an oxide semiconductor layer.

FIG. 5A show a stage of forming the oxide semiconductor layer 112. The oxide semiconductor layer 112 is formed to cover the first transparent conductive layer 108a, the second transparent conductive layer 108b, the first line 110a, and the second line 110b. The oxide semiconductor layer 112 is formed by sputtering. As a sputtering target, a sintered oxide semiconductor material is used. The oxide semiconductor layer 112 is formed to have a thickness of 20 nm to 100 nm, for example, 30 nm to 50 nm.

Figure 5B:
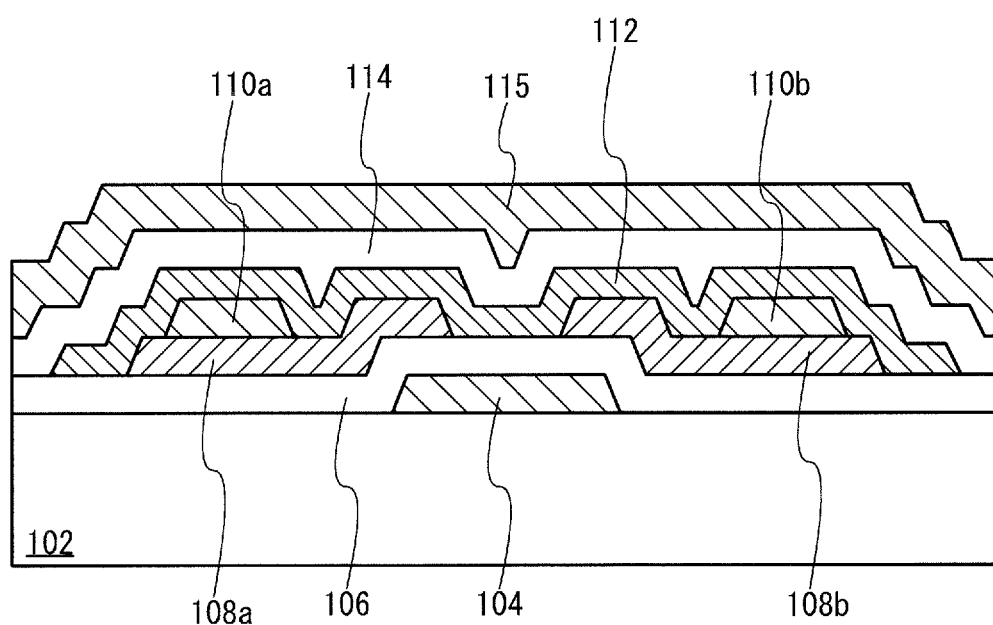
FIG. 5B shows the method for producing the transistor in an embodiment according to the present invention, and shows a stage of forming a second insulating layer and a fourth conductive film.

FIG. 5B shows a stage of forming the second insulating layer 114 and a fourth conductive film 115 on the oxide semiconductor layer 112. The second insulating layer 114 is formed in substantially the same manner as the first insulating layer 106. The fourth conductive film 115 is formed in substantially the same manner as the first conductive film 103. Then, the fourth conductive film 115 is etched to form the second gate electrode 116. Thus, the transistor 110a shown in FIG. 1 is produced.

According to the method for producing the transistor 100a in this embodiment, a multi-gradation photomask is used to decrease the number of photomasks required to produce the transistor 100a. The use of the multi-gradation photomask allows a plurality patterns (the first transparent conductive layer 108a, the second transparent conductive layer 108b, the first line 110a and the second line 110b) to be formed by performing exposure merely once. This increases the productivity of integrated circuit elements each including the transistor 100a and also decreases the production cost.

As shown in FIG. 1, neither the first line 110a nor the second line 110b overlaps the first gate electrode 104 or the second gate electrode 116. The first line 110a and the second line 110b are located as far as possible from the channel region of the transistor 100a (region where the first gate electrode 104 and the second gate electrode 116 overlap the oxide semiconductor layer 112), so that the channel region is prevented from being contaminated with a metal element. For example, copper (Cu), which may be used as a material of the first line 110a and the second line 110b, is a killer impurity to the oxide semiconductor, which is an n-type semiconductor (impurity that deteriorates the characteristics of the oxide semiconductor and destroys the oxide semiconductor). In this embodiment, the first line 110a and the second line 110b are located as far as possible from the channel region of the transistor 110a. Therefore, even if the first line 110a and the second line 110b contain copper (Cu), the oxide semiconductor layer 112 is suppressed from being contaminated with copper (Cu).

Embodiment 2

Figure 6:
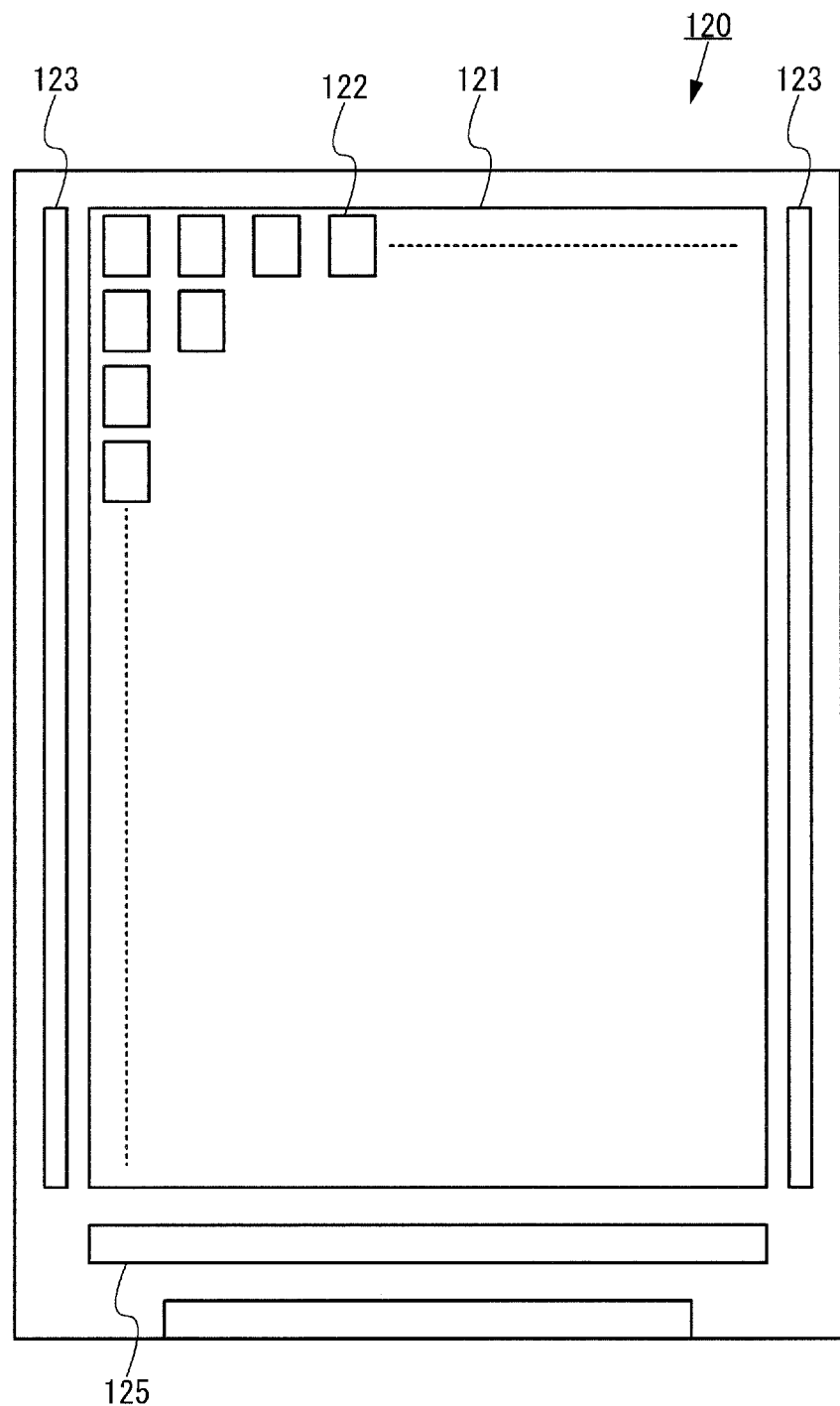
FIG. 6 is a plan view showing a structure of a display device in an embodiment according to the present invention.

In embodiment 2, an example of display device 120 including a transistor having substantially the same structure as that of the transistor described in embodiment 1 will be described. As shown in FIG. 6, the display device 120 includes a display region 121 including a plurality of pixels 122, a scanning line driving circuit 123, and a data line driving circuit 125. Although not shown in FIG. 6, the plurality of pixels 122 each include an organic EL element acting as a display element and a transistor driving the organic EL element.

2-1. Equivalent Circuit

Figure 7:
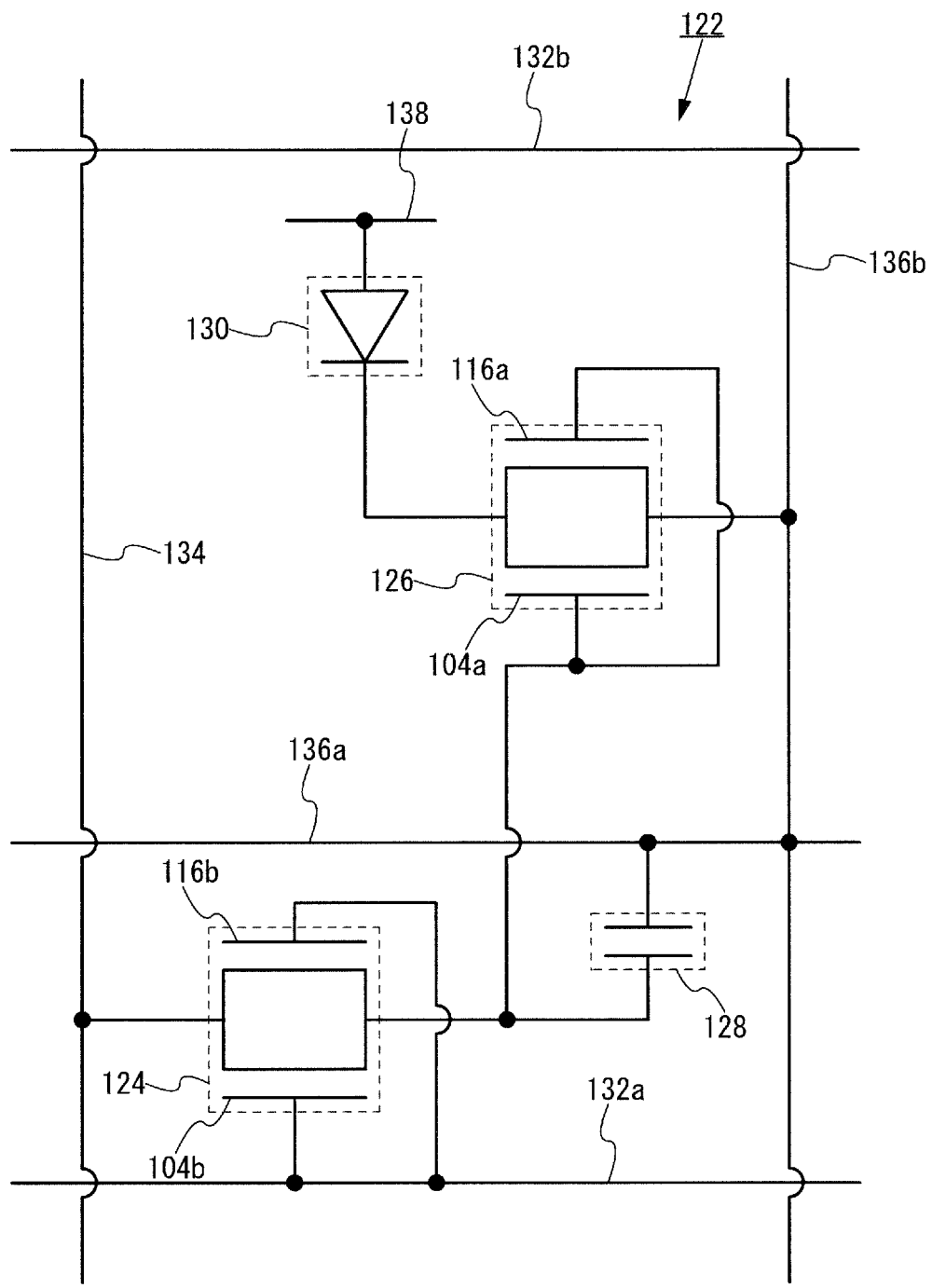
FIG. 7 shows an equivalent circuit of a pixel in the display device in an embodiment according to the present invention.

FIG. 7 is an equivalent circuit diagram of each of the pixels 122 included in the display device 120 in this embodiment. The pixel 122 includes a selection transistor 124, a driving transistor 126, a capacitance element 128, and an organic EL element 130. The selection transistor 124 and the driving transistor 126 each have substantially the same structure as that of the transistor 100a described in embodiment 1. Namely, FIG. 7 shows the transistors of a dual gate structure. The selection transistor 124 includes a first gate electrode 104b and a second gate electrode 116b, and the driving transistor 126 includes a first gate electrode 104a and a second gate electrode 116a.

In FIG. 7, the selection transistor 124 and the driving transistor 126 are each of an n-channel type. Gates of the selection transistor 124 (the first gate electrode 104b and the second gate electrode 116b) are connected with a gate signal line 132a. One of input/output terminals (source and drain) of the selection transistor 124 is connected with a data signal line 134, and the other of the input/output terminals is connected with gates of the driving transistor 126 (the first gate electrode 104a and the second gate electrode 116a). The gates of the driving transistor 126 (the first gate electrode 104a and the second gate electrode 116a) are connected with the other of the input/output terminals of the selection transistor 124. A drain of the driving transistor 126 is connected with the organic EL element 130, and a source of the driving transistor 126 is connected with a second common line 136b. One of two terminals of the capacitance element 128 is connected with the other of the input/output terminals (source and drain) of the selection transistor 124. The other of the two terminals of the capacitance element 128 is connected with a first common line 136a. The first common line 136a and the second common line 136b are supplied with, for example, ground potential.

One of two terminals of the organic EL element 130 is connected with the drain of the driving transistor 126, and the other of the two terminals of the organic EL element 130 is connected with a power supply line 138. The power supply line 138 is supplied with a power supply potential VDD, which is higher than the potential of each of the common lines 136a and 136b. In this embodiment, the terminal of the organic EL element 130 that is connected with the drain of the driving transistor 126 is a cathode electrode, and the terminal of the organic EL element 130 that is connected with the power supply line 138 is an anode electrode.

2-2. Pixel Structure

Figure 8:
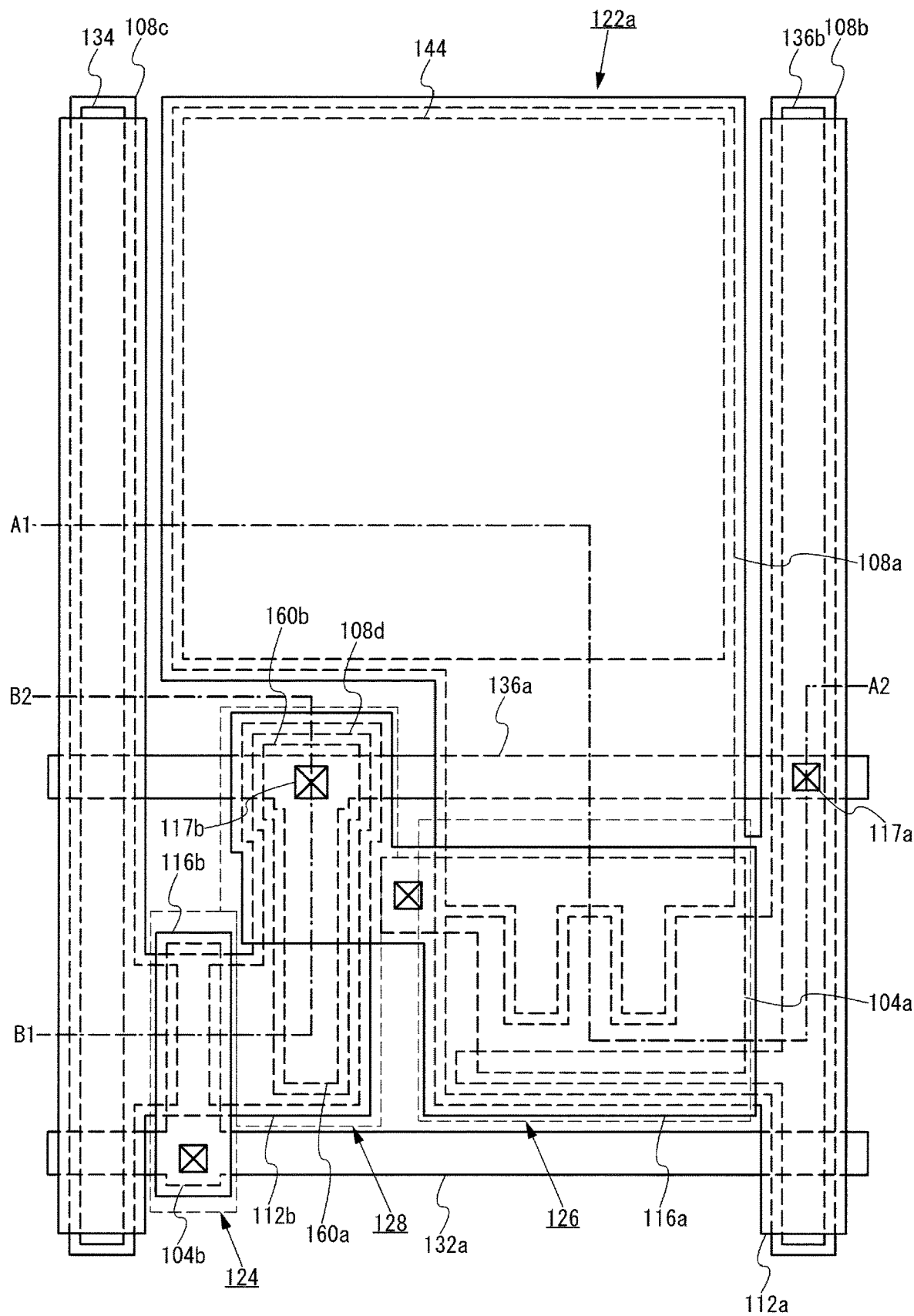
FIG. 8 is a plan view showing a structure of a pixel in the display device in an embodiment according to the present invention.
Figure 9A:
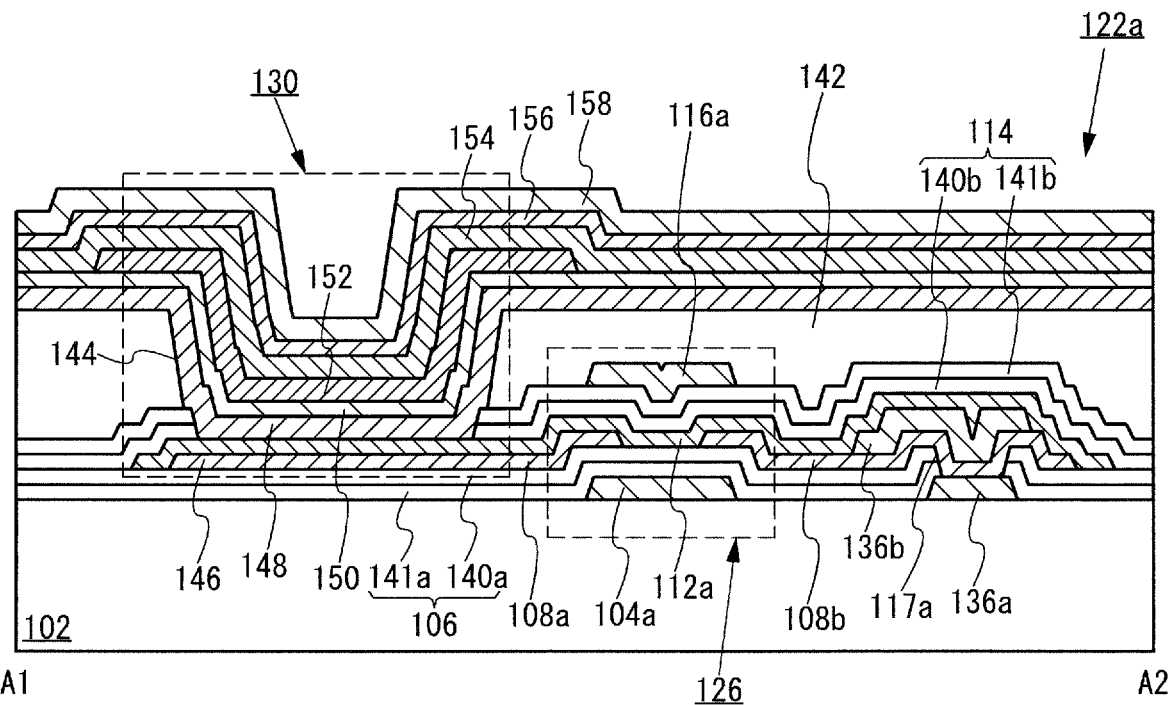
FIG. 9A is a cross-sectional view showing the structure of the pixel in the display device in an embodiment according to the present invention, taken along line A1-A2 in FIG. 8.
Figure 9B:
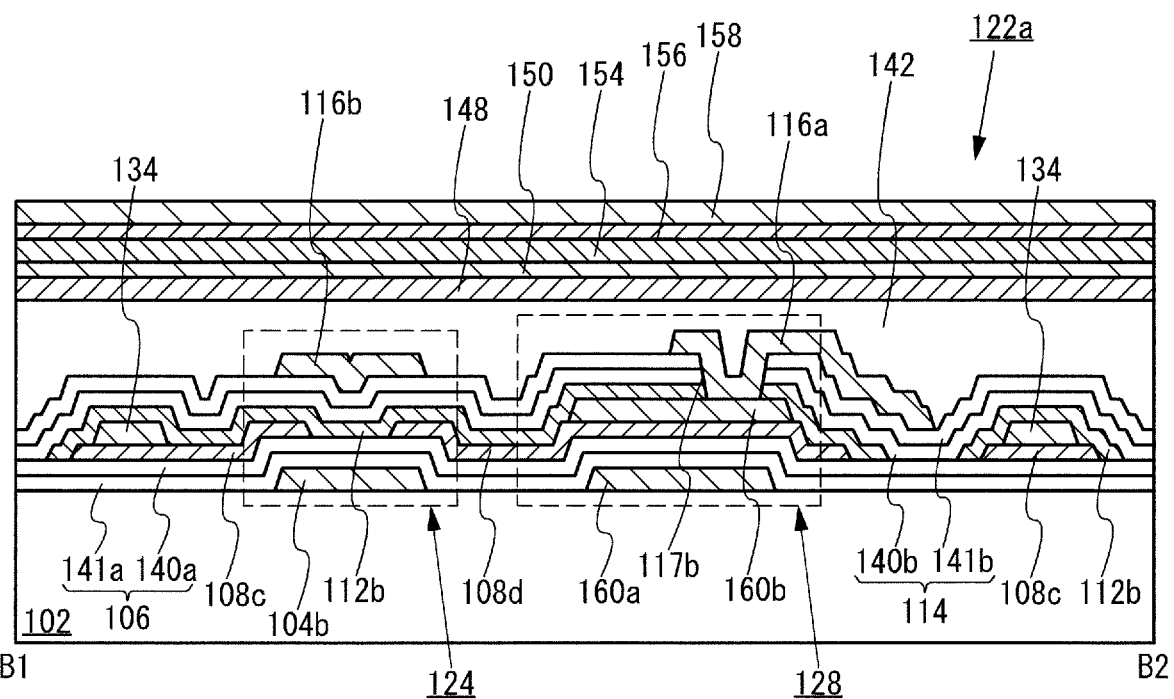
FIG. 9B is a cross-sectional view showing the structure of the pixel in the display device in an embodiment according to the present invention, taken along line B1-B2 in FIG. 8.

FIG. 8 shows an example of planar structure of a pixel 122a corresponding to the equivalent circuit shown in FIG. 7. FIG. 9A shows a cross-sectional structure taken along line A1-A2 in FIG. 8, and FIG. 9B shows a cross-sectional structure taken along line B1-AB in FIG. 8. FIG. 9A shows a cross-sectional structure of the driving transistor 126 and the organic EL element 130. FIG. 9B shows a cross-sectional structure of the selection transistor 124 and the capacitance element 128. The following description will be made with reference to FIG. 8, FIG. 9A and FIG. 9B. In the plan view of the pixel 122a shown in FIG. 8A, the structure of the organic EL element 130 is omitted.

2-2-1. Driving Transistor

The driving transistor 126 has substantially the same structure as that of the transistor 100a described in embodiment 1. Specifically, the driving transistor 126 includes the first gate electrode 104a, the first insulating layer 106, a first oxide semiconductor layer 112a, the second insulating layer 114, and the second gate electrode 116a, which are stacked. The first gate electrode 104a is provided between the substrate 102 and the first insulating layer 106. The second gate electrode 116a is provided on the second insulating layer 114 (on the surface of the second insulating layer 114 opposite to the surface thereof facing the substrate 102).

The first transparent conductive layer 108a and the second transparent conductive layer 108b are provided between the first insulating layer 106 and the first oxide semiconductor layer 112a. The first transparent conductive layer 108a and the second transparent conductive layer 108b are provided to hold the first gate electrode 104a and the second gate electrode 116a therebetween as seen in a plan view. The first transparent conductive layer 108a and the second transparent conductive layer 108b are provided in contact with the first oxide semiconductor layer 112a.

The first transparent conductive layer 108a of the driving transistor 126, or a region of the driving transistor 126 where the first transparent conductive layer 108a is in contact with the first oxide semiconductor layer 112a, is a drain region. The second transparent conductive layer 108b of the driving transistor 126, or a region of the driving transistor 126 where the second oxide semiconductor layer 112b is in contact with the second transparent conductive layer 108b, is a source region.

The second transparent conductive layer 108b of the driving transistor 126 is electrically connected with the first oxide semiconductor layer 112a, the first common line 136a and the second common line 136b. The first common line 136a is provided in the same layer structure as that of the first gate electrode 104a, and the second common line 136b is provided in the same layer structure as that of the data signal line 134 which electrically connected to the selection transistor 124. The first common line 136a and the second transparent conductive layer 108b are electrically connected with each other via a first contact hole 117a formed in the first insulating layer 106. The second common line 136b is in direct contact with a top surface of the second transparent conductive layer 108b.

The first insulating layer 106 includes, for example, a first silicon nitride film 141a and a first silicon oxide film 140a stacked in this order from the substrate 102 side. The second insulating layer 114 includes a second silicon oxide film 140b and a second silicon nitride film 141b stacked in this order from the first oxide semiconductor layer 112a side.

A channel of the driving transistor 126 is formed in a region where the first oxide semiconductor layer 112a overlaps the first gate electrode 104a and the second gate electrode 116a. Therefore, the first oxide semiconductor layer 112a is provided in contact with the silicon oxide films 140a and 140b in the region where the channel is formed. The first oxide semiconductor layer 112a is provided in contact with the insulating oxide films, and thus generation of oxygen deficiency in the first oxide semiconductor layer 112a is suppressed. It is desirable that the silicon oxide films 140a and 140b do not have oxygen deficiency so as not to draw out oxygen from the first oxide semiconductor layer 112a. Rather, it is even preferable that the silicon oxide films 140a and 140b contain an excessive amount of oxygen. A reason for this is that the silicon oxide films 140a and 140b, in the case of containing an excessive amount of oxygen, may be a source of oxygen for the first oxide semiconductor layer 112a. The "silicon oxide film containing an excessive amount of oxygen" encompasses a silicon oxide film containing an excessive amount of oxygen with respect to the chemical stoichiometric composition, and also encompasses a silicon oxide film containing an excessive amount of oxygen in a lattice thereof. The first insulating layer 106 and the second insulating layer 114 may be formed of silicon oxide nitride or aluminum oxide instead of silicon oxide.

The driving transistor 126 is covered with a flattening layer 142. The flattening layer 142 is formed of an organic resin material such as, for example, an acrylic resin, a polyimide resin, an epoxy resin, a polyamide resin or the like. The flattening layer 142 is formed as follows. A composition containing a precursor of an organic resin material is applied, and a surface of the film formed by the composition is flattened by a levelling action of the film. In another embodiment, the flattening layer 142 may be formed as follows. An inorganic insulating film such as a silicon oxide film or the like is formed by plasma CVD or the like, and then a surface of the inorganic insulating film is flattened by chemical mechanical polishing (CMP).

An opening 144 is provided in the flattening layer 142 and the second insulating layer 114. A first electrode 146, which is the cathode electrode of the organic EL element 130, is located to overlap the opening 144. The organic EL element 130 is formed of a plurality of layers stacked in the region of the opening 144.

In this embodiment, the driving transistor 126 has a dual gate structure, and thus improves the current driving capability thereof. Therefore, the driving transistor 126 provides a sufficient level of current to drive the organic EL element 130. Even if the operating point of the organic EL element 130 is changed, the driving transistor 126 provides constant current driving in accordance with the change in the operating point.

2-2-2. Selection Transistor

The selection transistor 124 has substantially the same structure as that of the transistor 100a described in embodiment 1. Specifically, the selection transistor 124 includes the first gate electrode 104b, the first insulating layer 106, a second oxide semiconductor layer 112b, the second insulating layer 114, and the second gate electrode 116b, which are stacked. A channel of the second transistor 124 is formed in a region where the second oxide semiconductor layer 112b overlaps the first gate electrode 104b and the second gate electrode 116b. A third transparent conductive layer 108c and a fourth transparent conductive layer 108d are provided between the first insulating layer 106 and the second oxide semiconductor layer 112b. The third transparent conductive layer 108c and the fourth transparent conductive layer 108d are provided in contact with the second oxide semiconductor layer 112b, and thus act as a source region and a drain region. The third transparent conductive layer 108c and the fourth transparent conductive layer 108d are provided to hold the first gate electrode 104b and the second gate electrode 116b therebetween as seen in a plan view.

The third transparent conductive layer 108c is electrically connected with the data signal line 134. The data signal line 134 is provided in the same layer structure as that of the line layer 110 provided between the transparent conductive layer 108 and the oxide semiconductor layer 112 described in the embodiment 1. The data signal line 134 is in direct contact with a top surface of the third transparent conductive layer 108c. The second oxide semiconductor layer 112b extends to a region where the data signal line 134 is located and covers the data signal line 134. The data signal line 134 is in direct contact with the third transparent conductive layer 108c and thus has a larger contact area size than in the case where the data signal line 134 is connected with the third transparent conductive layer 108c via a contact hole. Therefore, the contact resistance is decreased. A top surface and side surfaces of the data signal line 134 are covered with the second oxide semiconductor layer 112b, and thus the data signal line 134 is not exposed to an oxidizing atmosphere or a reducing atmosphere during the production of the display device 120. Therefore, the data signal line 134 suppresses the resistance at a surface thereof from increasing.

2-2-3. Capacitance Element

The capacitance element 128 includes a first capacitance electrode 160a, the first insulating layer 106, the fourth transparent conductive layer 108d, and a second capacitance electrode 160b. The first capacitance electrode 160a is provided in the same layer structure as that of the first gate electrode 104, and the second capacitance electrode 160b is provided in the same layer structure as that of the data signal line 134. The fourth transparent conductive layer 108d is electrically connected with the second capacitance electrode 160b, and thus substantially acts as the electrode of the capacitance element 128.

The second oxide semiconductor layer 112b and the second insulating layer 114 are provided on the second capacitance electrode 160b. The second capacitance electrode 160b is electrically connected with the second gate electrode 116a via a second contact hole 117b running through the second insulating layer 114 and the second oxide semiconductor layer 112b.

2-2-4. Organic EL Element

The organic EL element 130 includes the first electrode 146 corresponding to the cathode electrode, an electron transfer layer 148, an electron injection layer 150, a light emitting layer 152, a hole transfer layer 154, a hole injection layer 156, and a second electrode 158 corresponding to the anode electrode, which are stacked from the substrate 102 side. A structure of an organic EL element in which a hole transfer layer, a light emitting layer, an electron transfer layer, and a cathode electrode are stacked in this order from the side of the anode electrode close to the substrate is referred to as a "normal stack structure". In the organic EL element 130 in this embodiment, the electron transfer layer 148, the light emitting layer 152, the hole transfer layer 154 and the like are stacked in this order from the side of the cathode electrode close to the substrate 102. This structure is referred to as an "inverted stack structure". In this embodiment, the driving transistor 126 is of an n-channel type. Therefore, if the organic EL element has a normal stack structure, the source is connected with the anode electrode. In this case, there is a problem that the level of drain current of the driving transistor is changed in accordance with the change in the characteristics of the organic EL element. However, in the case where the organic EL element 130 has an inverted stack structure as in this embodiment, the drain of the n-channel type driving transistor 126 is connected with the cathode of the organic EL element 130. Therefore, a circuit configuration in which the drain current is not much influenced by the change in the characteristics of the organic EL element 130 is provided.

On a top surface of the flattening layer 142 and in the opening 144 provided in the flattening layer 142 and the second insulating layer 114, the electron transfer layer 148, the electron injection layer 150, the light emitting layer 152, the hole transfer layer 154, the hole injection layer 156, and the second electrode 158 acting as the anode electrode are stacked. A region where a stacked body including these elements overlaps the first electrode 146 corresponding to the cathode electrode is a light emitting region of the organic EL element 130.

The organic EL element 130 in this embodiment is of a so-called bottom emission type, which outputs light toward the substrate 102. Hereinafter, each of the layers included in the organic EL element 130 will be described in detail.

2-2-4-1. Cathode Electrode

As a material of a cathode electrode of an organic EL element, an aluminum-lithium alloy (AlLi), a magnesium-silver alloy (MgAg) or the like is conventionally used. However, these materials are easily deteriorated by the influence of oxygen or moisture in the air, and thus are difficult to handle. These materials for the cathode electrode are metal materials, and thus are not suitable to an organic EL element that has an inverted stack structure and is of a bottom emission type.

In the organic EL element 130 in this embodiment, the first electrode 146, which is a cathode electrode, is formed of a transparent conductive material, and thus a bottom emission type structure is realized for the organic EL element 130. Specifically, the first transparent conductive layer 108a of the driving transistor 126 extends to the region of the organic EL element 130 to act as the first electrode 146, which is a cathode electrode. With such an arrangement, the driving transistor 126 and the organic EL element 130 are electrically connected with each other with a simple structure. For example, in the case where an interlayer insulating layer is provided between the driving transistor and the organic EL element, a contact hole needs to be provided to connect the driving transistor and the organic EL element. By contrast, the structure of the first pixel 122a in this embodiment does not require a contact hole.

The first electrode 146 as the cathode electrode is formed of the same conductive film as that of the first transparent conductive layer 108a. The first transparent conductive layer 108a is formed of a metal oxide material, a metal nitride material, or a metal oxide nitride material, all of which are conductive. A conductive film formed of such a material has a bandgap of 2.8 eV or greater, preferably of 3.0 eV or greater, and therefore transmits almost all of light of a visible region. Therefore, such a material is usable for an electrode on the light output side of the organic EL element 130.

On the first electrode 146 corresponding to the cathode electrode, the first oxide semiconductor layer 112a extending from the driving transistor 126 may be provided. The oxide semiconductor layer 112a has a bandgap of 3 eV or greater, and thus is visible light-transmissive. As described below, in this embodiment, the electron transfer layer 148 is formed of a metal oxide. The first oxide semiconductor layer 112a formed of the same material, or the same type of material, as the electron transfer layer 148 is located between the electron transfer layer 148 and the first electrode 146 corresponding to the cathode electrode, so that formation of an electron injection barrier is prevented. In other words, the first oxide semiconductor layer 112a extending from the channel region of the driving transistor 126 may be used as a part of the electron transfer layer 148 in contact with the first electrode 146 corresponding to the cathode electrode.

2-2-4-2. Electron Transfer Layer

The electron transfer layer 148 is formed of a metal oxide material. Examples of the metal oxide material usable for the electron transfer layer 148 include substantially the same materials described in embodiment 1, specifically, a four-component oxide material, a three-component oxide material, a two-component oxide material, and a one-component oxide material. These metal oxide materials may be in an amorphous state, a crystalline state or a mixed phase of an amorphous state and a crystalline state. The electron transfer layer 148 is formed of, for example, one or a plurality of materials selected from an oxide of indium, an oxide of zinc, an oxide of gallium (Ga), and an oxide of tin (Sn). Such a metal oxide material should not absorb visible light and needs to be transparent, and thus is required to have a bandgap of 3.0 eV or greater. The electron transfer layer 148 may have a maximum possible thickness to prevent short circuiting between the anode electrode and the cathode electrode. The electron transfer layer 148 may be formed by sputtering, vacuum vapor deposition, application or the like. The electron transfer layer 148 is formed by such a method to have a thickness of 50 nm to 1000 nm.

The electron transfer layer 148 has a carrier concentration of $1/10$ or less, preferably $1/100$ or less, of that of the oxide semiconductor layer 112a. In other words, the carrier concentration of the region where the oxide semiconductor layer 112a is in contact with the electron transfer layer 148 is at least 10 times, preferably 100 times, the carrier concentration of the electron transfer layer 148. Specifically, the carrier concentration of the electron transfer layer 148 is $10^{13}$ to $10^{17}/cm^3$, whereas the carrier concentration of the oxide semiconductor layer 112a is $10^{15}$ to $10^{19}/cm^3$. The difference between the carrier concentrations of the electron transfer layer 148 and the oxide semiconductor layer 112a is at least one digit, preferably at least two digits. The oxide semiconductor layer 112a has a carrier concentration of is $10^{15}$ to $10^{19}/cm^3$, and thus decreases the resistance loss in the electric connection between the driving transistor 126 and the organic EL element 130, and suppresses the driving voltage from increasing. In the case where the carrier concentration of the electron transfer layer 148 is $10^{20}/cm^3$ or greater, the excited state in the light emitting layer 152 is deactivated and the light emission efficiency is decreased. By contrast, in the case where the carrier concentration of the electron transfer layer 148 is less than $10^{13}/cm^3$, the number of carriers supplied to the light emitting layer 152 is decreased and thus a sufficient level of luminance is not provided. As described above, the oxide semiconductor layer 112a extending from the driving transistor 126 is provided in contact with the electron transfer layer 148, and the carrier concentrations of the oxide semiconductor layer 112a and the electron transfer layer 148 are made different from each other, so that the driving voltage is prevented from increasing and the light emission efficiency of the organic EL element 130 is improved.

2-2-4-3. Electron Injection Layer

In an organic EL element, an electron injection layer is used in order to decrease the energy barrier and thus to inject the electrons from the cathode electrode into an electron transfer material. In this embodiment, the electron injection layer 150 is used in order to allow the electrons to be injected easily from the electron transfer layer 148 formed of an oxide semiconductor into the light emitting layer 152. Thus, the electron injection layer 150 is provided between the electron transfer layer 148 and the light emitting layer 152.

It is desirable that the electron injection layer 150 is formed of a material having a small work function in order to allow the electrons to be injected easily into the light emitting layer 150 formed of an organic material. The electron injection layer 150 is formed of an oxide of calcium (Ca) and an oxide of aluminum (Al). The electron injection layer 150 is preferably formed of, for example, C12A7 ($12CaO \cdot 7Al_2O_3$) electride. C12A7 ($12CaO \cdot 7Al_2O_3$) electride has semiconductor characteristics, is controllable to have a desired level of resistance from a high resistance to a low resistance, and has a work function of 2.4 eV to 3.2 eV, which is about the same as that of an alkaline metal. For these reasons, C12A7 ($12CaO \cdot 7Al_2O_3$) electride is preferably usable for the electron injection layer 150.

The electron injection layer 150 of C12A7 electride is formed by sputtering by use of a polycrystal of C12A7 electride as a target. C12A7 electride has semiconductor characteristics, and thus the electron injection layer 150 may be formed to have a thickness of 1 nm to 100 nm. Regarding C12A7 electride, it is preferable that the molar ratio of Ca:Al is in the range of 13:13 to 11:16. C12A7 electride is formed by sputtering and thus is preferably amorphous. Alternatively, C12A7 electride may be crystalline.

C12A7 electride is stable in the atmosphere, and thus has an advantage of being easier to handle than an alkaline metal compound conventionally used for an electron injection layer such as lithium fluoride (LiF), lithium oxide ($Li_2O$), sodium chloride (NaCl), potassium chloride (KCl), or the like. Use of C12A7 electride makes it unnecessary to work in dry air or inactive gas during the formation of the organic EL element 130. The conditions for the formation of the organic EL element 130 are alleviated.

C12A7 electride has a large ionization potential. Therefore, the electron injection layer 150, when being located to face the hole transfer layer 154 while having the light emitting layer 152 between the electron injection layer 150 and the hole injection layer 154 therebetween, acts as a hole block layer. Namely, the electron injection layer 150 formed of C12A7 electride is provided between the electron transfer layer 148 and the light emitting layer 152, so that holes injected into the light emitting layer 152 are suppressed from running to the first 146 as the cathode electrode, and thus the light emission efficiency is improved.

2-2-4-4. Light Emitting Layer

The light emitting layer 152 may be formed of any of various materials. For example, the light emitting layer 152 may be formed of a fluorescent compound emitting fluorescence or phosphorescent compound emitting phosphorescence.

Examples of light emitting material emitting blue light usable for the light emitting layer 152 include N,N'-bis[4-(9H-carbazole-9-yl)phenyl-N,N'-diphenylstilbene-4,4'-diamine (YGAS2S), 4-(9H-carbazole-9-yl)-4'-(10-phenyl-9-anthryl)triphenylamine (YGAPA), and the like. Examples of light emitting material emitting green light usable for the light emitting layer 152 include N-(9,10-diphenyl-2-anthryl)-N,9-diphenyl-9H-carbazole-3-amine (2PCAPA), N-[9,10-bis(1,1'-biphenyl-2-yl)-2-anthryl]-N,9-diphenyl-9H-carbazole-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), N-[9.10-bis(1,1'-biphenyl-2-yl)]-N-[4-(9H-carbazole-9-yl)phenyl]-N-phenylanthracene-2-amine (2YGABPhA), N,N,9-triphenylanthracene-9-amine (DPhAPhA), and the like. Examples of light emitting material emitting red light usable for the light emitting layer 152 include N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like. A phosphorescent material such as bis[2-(2'-benzo[4,5-α]thienyl)pyridinatho-N, $C^{3'}$]iridium(III)acetylacetonate ($Ir(btp)_2(ac$-ac)) or the like is also usable.

The light emitting layer 152 may be formed of any of various known materials other than the above-listed materials. The light emitting layer 152 may be formed by vapor deposition, transfer, spin-coating, spray-coting, gravure printing, or the like. The light emitting layer 152 may have an optionally selected thickness, and has a thickness of, for example, 10 nm to 100 nm.

2-2-4-5. Hole Transfer Layer

The hole transfer layer 154 is formed of a material having hole transferability. The hole transfer layer 154 is formed of, for example, an arylamine-based compound, an amine compound containing a carbozole group, an amine compound containing a fluorene derivative, or the like. Examples of materials usable for the hole transfer layer 154 include organic materials such as
4,4'-bis[N-(naphtyl)-N-phenyl-amino]biphenyl (α-NPD),
N,N'-bis(3-methylphenyl)-(1,1'-biphenyl)-4,4'-diamine (TPD), 2-TNANA,
4,4',4''-tris(N-(3-methylphenyl)N-phenylamino)triphenylamine (MTDATA),
4,4'-N,N'-dicarbazolebiphenyl (CBP),
4,4'-bis[N-(9,9-dimethylfluorene-2-yl)-N-phenylamino]biphenyl (DFLDPBi),
4,4'bis[N-(spiro-9,9'-bifluorene-2-yl)-N-phenylamino]biphenyl (BSPB), spiro-NPD, spiro-TPD, apiro-TAD, TNB, and the like.

The hole transfer layer 154 is formed of a common film formation method such as vacuum vapor deposition, application or the like. The hole transfer layer 154 is formed by such a method to have a thickness of 10 nm to 500 nm. The hole transfer layer 154 may be omitted.

2-2-4-6. Hole Injection Layer

The hole injection layer 156 is formed of a material having a high capability of injecting holes into an organic layer. Examples of materials having a high capability of injecting holes and usable for the hole injection layer 156 include metal oxides such as an oxide of molybdenum, an oxide of vanadium, an oxide of ruthenium, an oxide of tungsten, an oxide of manganese and the like. Examples of materials having a high capability of injecting holes and usable for the hole injection layer 156 also include organic compounds such as phthalocyanine ($H_2Pc$), copper (II) phthalocyanine (CuPc), vanadylphthalocyanine (VoPc), 4,4', 4''-tris(N,N-diphenylamino)triphenylamine (TDATA), 4,4', 4''-tris(N-(3-methylphenyl)-N-phenylamino]triphenylamine (MTDATA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino) biphenyl (DNPTD), 1,3,5-tris[N-(4-diphenylaminophenyl)-N-phenylamino]benzene (DPA3B), 3-[N-(9-phenylcarbozole-3-yl)-N-phenylamino]-9-phenylcarbazole (PCzPCA1), 3,6-bis [N-(9-phenylcarbazole-3-yl)-N-phenylamino]-9-phenylcarbazole (PCzPCA2), 3-[N-(1-naphtyl)-N-(9-phenylcarbazole-3-yl)amino]-9-phenylcarbazole (PCzPCN1), 2,3,6,7, 10,11-hexacyano-1,4,5,8,9,12-hexaazatriphenylene (HAT-CN), and the like.

The hole injection layer 156 is formed of a common film formation method such as vacuum vapor deposition, application or the like. The hole injection layer 156 is formed by such a method to have a thickness of 1 nm to 100 nm.

2-2-4-7. Anode Electrode

The second electrode 158 corresponding to the anode electrode is formed of a metal material, an alloy or a conductive compound having a high work function (specifically, 4.0 eV or greater). The second electrode 158 corresponding to the anode electrode is formed of, for example, indium tin oxide (ITO), indium zinc oxide (IZO), indium oxide containing tungsten oxide and zinc oxide (IWZO), or the like. The second electrode 158 corresponding to the anode electrode of such a conductive metal oxide material is formed by vacuum vapor deposition or sputtering. In this embodiment, the organic EL element 130 is of a bottom emission type. Therefore, it is preferable that the second electrode 158 corresponding to the anode electrode is light reflective or has a light reflective surface. A film of a conductive metal oxide such as indium tin oxide (ITO), indium zinc oxide (IZO) or the like is light-transmissive. Therefore, the second electrode 158 may include a metal film of aluminum (Al), silver (Ag) or the like at a surface thereof that is opposite to a surface facing the hole injection layer 156. Although not shown in FIG. 8, FIG. 9A and FIG. 9B, a passivation layer blocking transmission of oxygen ($O_2$) or moisture ($H_2O$) may be provided on the second electrode 158 corresponding to the anode electrode in substantially the entirety of the display region 121.

As described above, in this embodiment, the pixel 122a in which the driving transistor 126 exhibiting n-channel type conductivity and the organic EL element 130 are electrically connected with each other is realized. In this case, the organic EL element 130 may have an inverted stack structure, in which the electron transfer layer 148, the electron injection layer 150, the light emitting layer 152, the hole transfer layer 154, the hole injection layer 156 and the like are stacked appropriately from the side of the first electrode 146, which is the cathode electrode. Since the first electrode 146, which is the cathode electrode, does not need to be formed of an alkaline metal material, the reliability of the display device 120 is improved. In addition, the electron transfer layer 148 and the electron injection layer 150, which are located in lower layers, are formed of an inorganic insulating material. Therefore, even if an organic layer is formed on these inorganic insulating layers, the characteristics are suppressed from decreasing by denaturing or the like. Thus, the characteristics of the organic EL element are stabilized.

2-3. Transistor Structure

As shown in FIG. 9A and FIG. 9B, the pixel 122a in this embodiment has a structure in which the anode electrode 158 covers the entire surfaces of the driving transistor 126 and the selection transistor 124. The driving transistor 126 and the selection transistor 124 each have a dual gate structure; specifically, the oxide semiconductor layer 112, where the channel region is formed, is provided between the first gate electrode 104 and the second gate electrode 116.

Figure 10A:
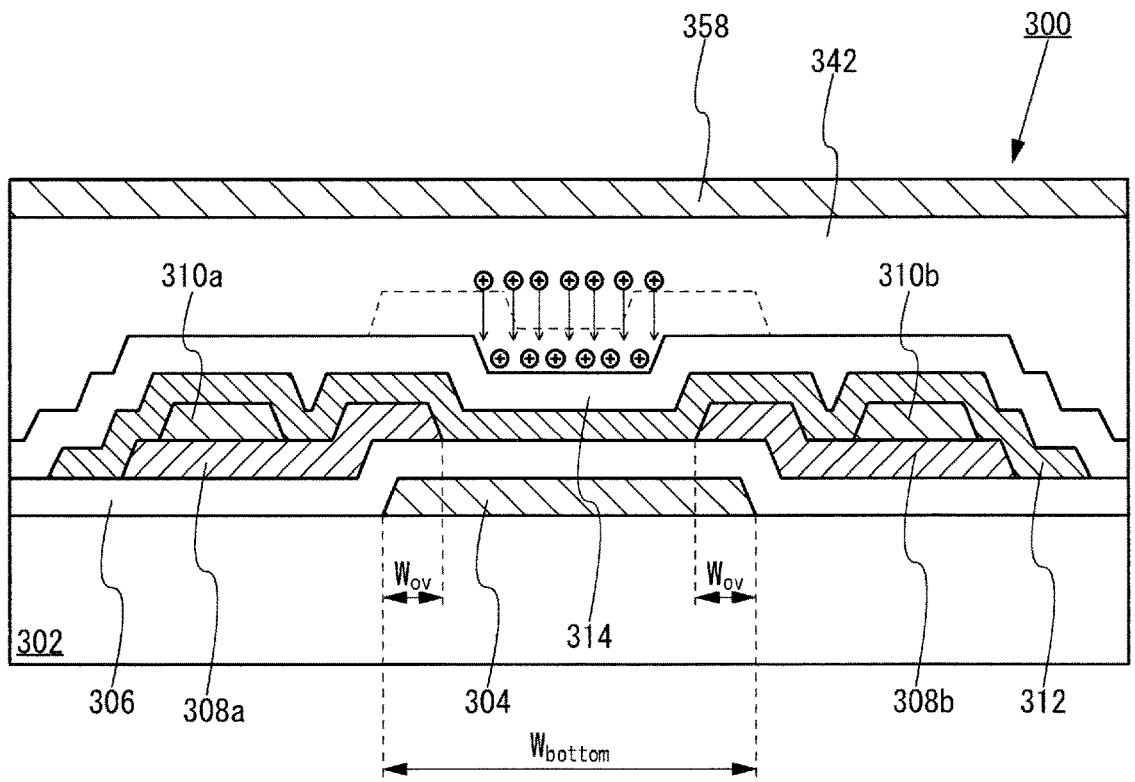
FIG. 10A shows a structure of a display device and an influence of charges during an operation of the display device.

FIG. 10A is a cross-sectional view of a bottom gate type transistor 300. The transistor 300 includes a gate electrode 304, a first electrode 306, a first transparent conductive layer 308a, a second transparent conductive layer 308b, a first line 310a, a second line 310b, an oxide semiconductor layer 312, a second insulating layer 314, a flattening layer 342, and an anode electrode 358, which are stacked on a substrate 302. In the bottom gate type transistor 300, the back channel side (the side of the oxide semiconductor layer 312 facing the anode electrode 358) is likely to be influenced by the anode electrode 358. Specifically, the anode electrode 358 has a positive potential, and an interface between the oxide semiconductor layer 312 and the second insulating layer 314 (back channel interface), and the anode electrode 358, are separated from each other by an interval of about 3 µm to 5 µm. Therefore, positive charges are accumulated on the back channel side of the oxide semiconductor layer 312. When the positive charges are easily accumulated on the back channel side, there occurs a problem that the threshold voltage of the transistor 300 is shifted to a negative side (the transistor 300 becomes a normally-off transistor).

Figure 10B:
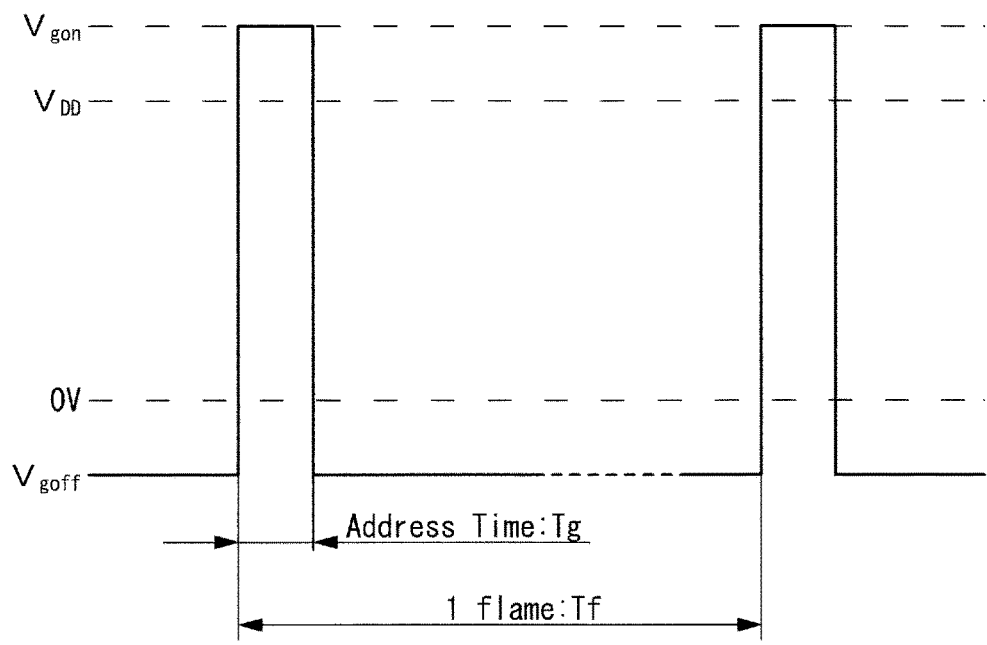
FIG. 10B shows a period in which a signal is applied to a gate electrode during the operation of the display device.

This phenomenon will be described with reference to FIG. 10B based on a method for driving a display device. While the display device is driven, as shown in FIG. 10B, a period Tg in which an on-voltage $V_{gon}$ is applied to the gate electrode 304 of the transistor 300 that drives the organic EL element 300 is much shorter than one frame period Tf (Tf>Tg). In a period, other than the period in which a positive on-voltage $V_{gon}$ is applied to the gate electrode 304 of the transistor 300, namely, in the period (Tf-Tg), a negative off-voltage $V_{goff}$ is applied to the gate electrode 304. To the anode electrode 358, a positive constant voltage (VDD) is kept applied. Therefore, charges in the second insulating layer 314 and the flattening layer 342 are drifted by an electric field generated in the anode electrode 358 and the gate electrode 304, and as a result, the positive charges are accumulated on the back channel side.

In order to solve such an inconvenience, it is preferable that gate electrodes are provided above and below the oxide semiconductor layer 112 as in this embodiment. In this case, the second gate electrode 116 is grounded to have a constant potential or is supplied with the same voltage as that of the first electrode 104, so that the potential on the back channel side is stabilized.

Figure 11A:
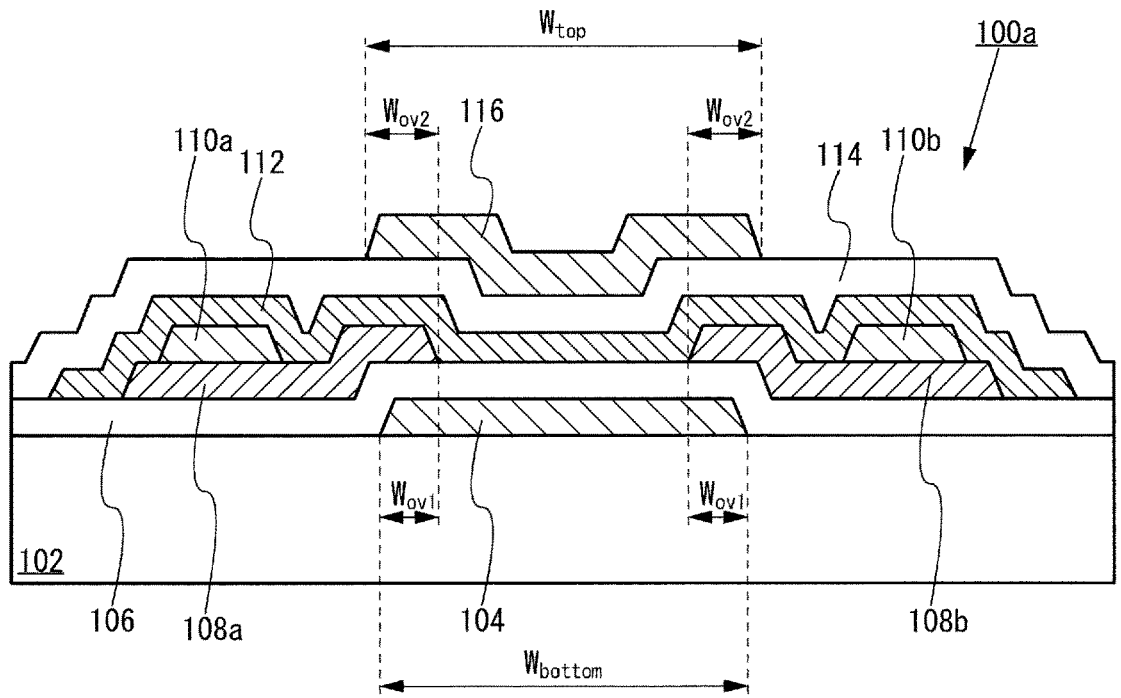
FIG. 11A shows a cross-sectional structure of a transistor in an embodiment according to the present invention.

FIG. 11A shows an embodiment of the transistor 100a. In this embodiment, the transistor 100a has a structure in which the first gate electrode 104 in a lower layer and the second gate electrode 116 in an upper layer each overlap both of the first transparent conductive layer 108a and the second transparent conductive layer 108b, which correspond to the source and drain electrodes. The first gate electrode 104 having width $W_{bottom}$ in a channel length direction overlaps each of the first transparent conductive layer 108a and the second transparent conductive layer 108b by width $W_{ov1}$. The second gate electrode 116 having width $W_{top}$ in the channel length direction overlaps each of the first transparent conductive layer 108a and the second transparent conductive layer 108b by width $W_{ov2}$. Since the first gate electrode 104 and the second gate electrode 116 each partially overlap both of the first transparent conductive layer 108a and the second transparent conductive layer 108b, the channel region in the oxide semiconductor layer 112 is substantially blocked against the external electric field. Therefore, even if the anode electrode 158 is located to cover the entire surface of the transistor 100a, the transistor 100a is not influenced by the electric field of the anode electrode 158. Thus, the threshold voltage of the transistor 100a is prevented from being changed along with time.

Figure 11B:
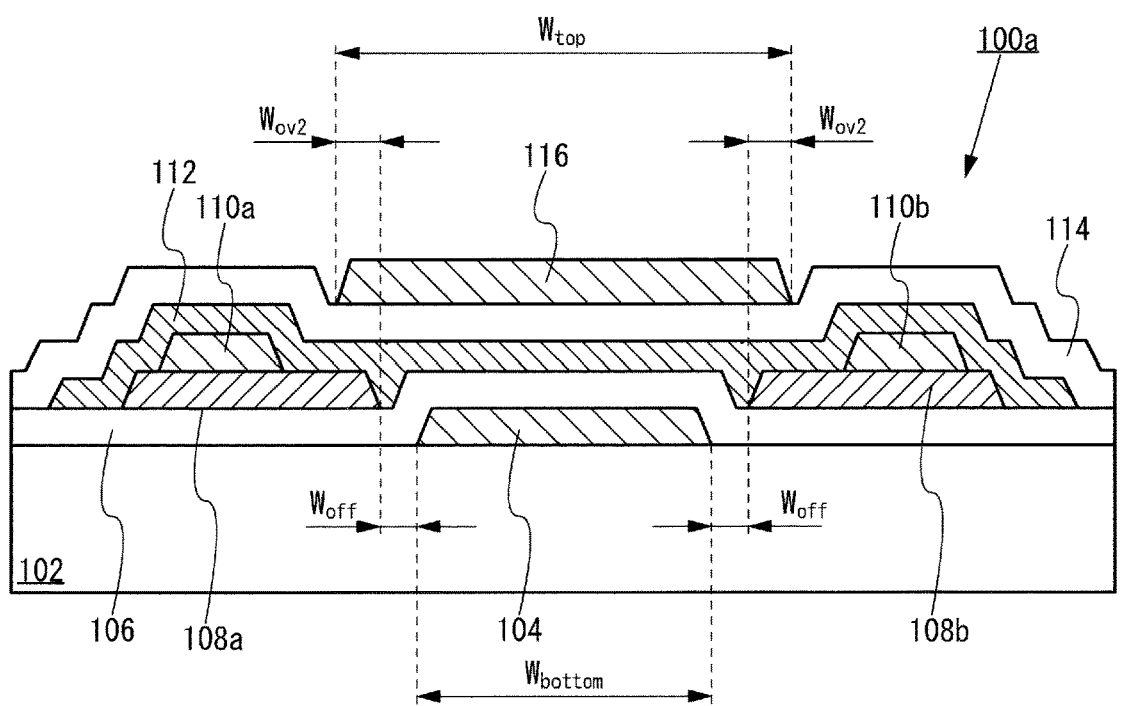
FIG. 11B shows a cross-sectional structure of a transistor in an embodiment according to the present invention.

FIG. 11B shows an embodiment of the transistor 100a. In this embodiment, the transistor 100a has a structure in which the second gate electrode 116 in an upper layer overlaps both of the first transparent conductive layer 108a and the second transparent conductive layer 108b corresponding to the source and drain electrodes, and the first gate electrode 104 overlaps neither the first transparent conductive layer 108a nor the second transparent conductive layer 108b. The second gate electrode 116 having width $W_{top}$ in the channel length direction overlaps each of the first transparent conductive layer 108a and the second transparent conductive layer 108b by width $W_{ov2}$. By contrast, width $W_{bottom}$ of the first gate electrode 104 in the channel length direction is narrower than the interval between the first transparent conductive layer 108a and the second transparent conductive layer 108b, and the first gate electrode 104 is offset by width Wott from the first transparent conductive layer 108a and the second transparent conductive layer 108b. Since at least the second gate electrode 116 partially overlaps both of the first transparent conductive layer 108a and the second transparent conductive layer 108b, the channel region in the oxide semiconductor layer 112 is substantially blocked against the external electric field. Therefore, the threshold voltage of the transistor 100a is prevented from being changed along with time. Specifically, the area size of the region where the second gate electrode 116 overlaps the oxide semiconductor layer 112 is larger than the area size of the region where the first gate electrode 104 overlaps the oxide semiconductor layer 112. For this reason, the influence of the charges that may be accumulated on the back channel side is blocked. In other words, the first gate electrode 104 and the second gate electrode 116 overlap each other as seen in a plan view, and the second gate electrode 116 covers the first gate electrode 104, and therefore, the influence of the charges that may be accumulated on the back channel side is blocked.

In consideration of the alignment precision of a photomask in a lithography step, it is preferable that width $W_{top}$ of the second gate electrode 116 is larger than width $W_{bottom}$ of the first gate electrode 104 ($W_{top}$>$W_{bottom}$). The width of the second gate electrode 116 is made larger than the width of the first gate electrode 104, so that there is a margin for the alignment precision of the photomask in the lithography step. Therefore, the channel region formed in the oxide semiconductor layer 112 is covered with the second gate electrode 116 with certainty.

2-4. Method for Producing the Display Device

An example of method for producing the display device 120 in an embodiment according to the present invention will be described. In the following description, the same explanations as those on the method for producing the transistor 100a provided in embodiment 1 will be omitted, and only the differences will be provided.

Figure 12:
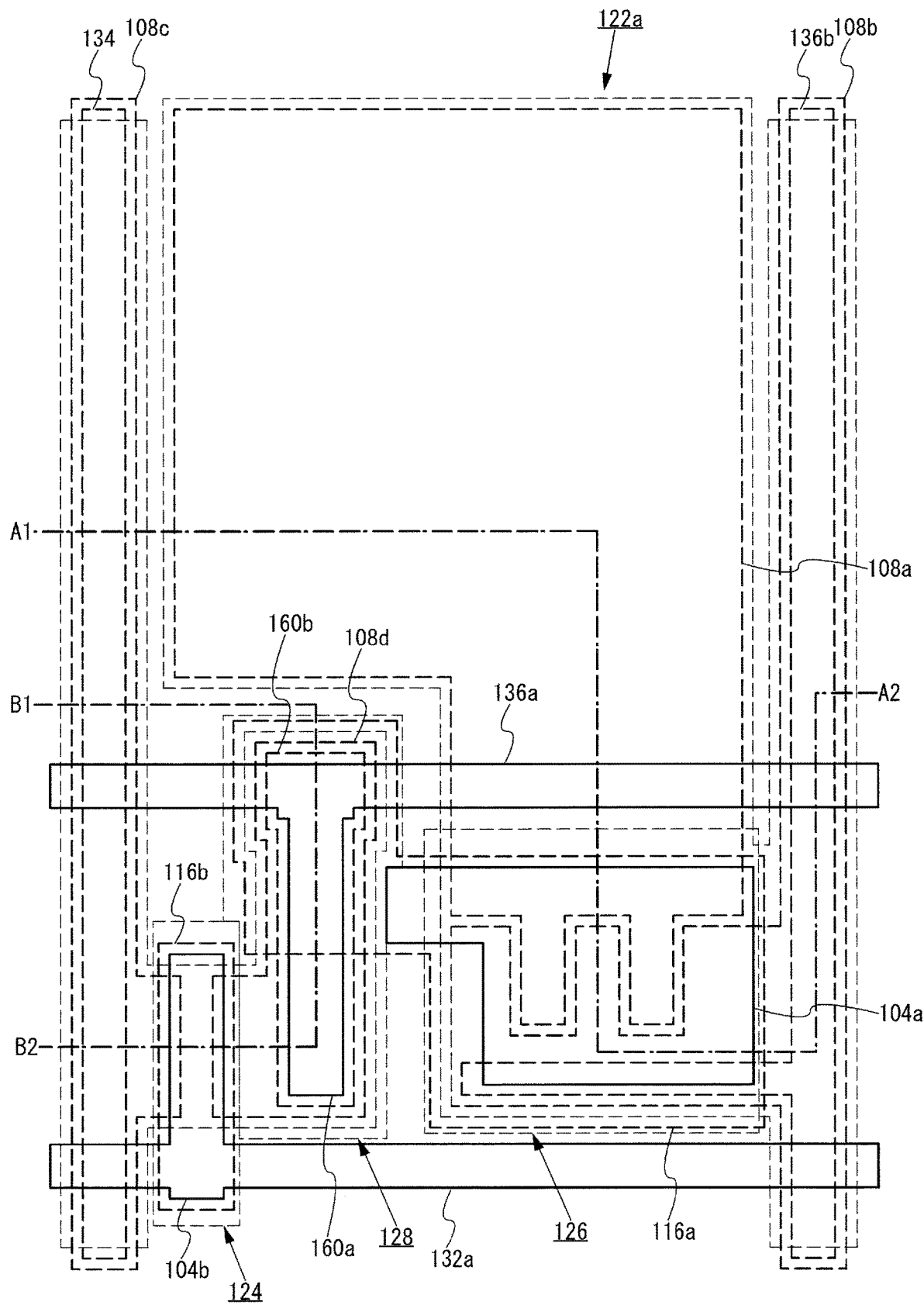
FIG. 12 is a plan view showing a method for producing the display device in an embodiment according to the present invention.
Figure 13A:
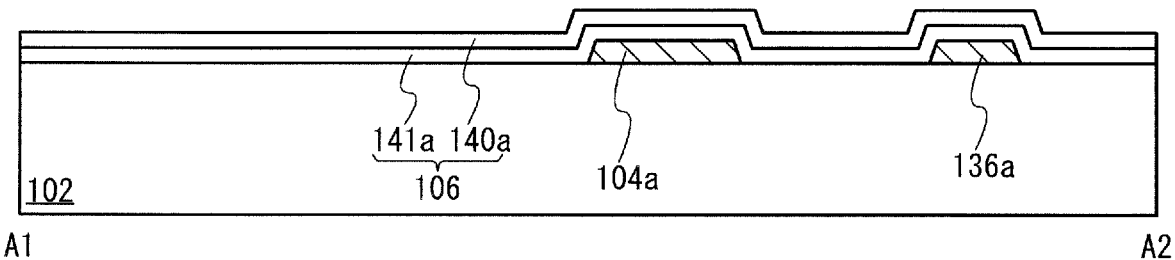
FIG. 13A is a cross-sectional view showing the method for producing the display device in an embodiment according to the present invention, taken along line A1-A2 in FIG. 12.
Figure 13B:
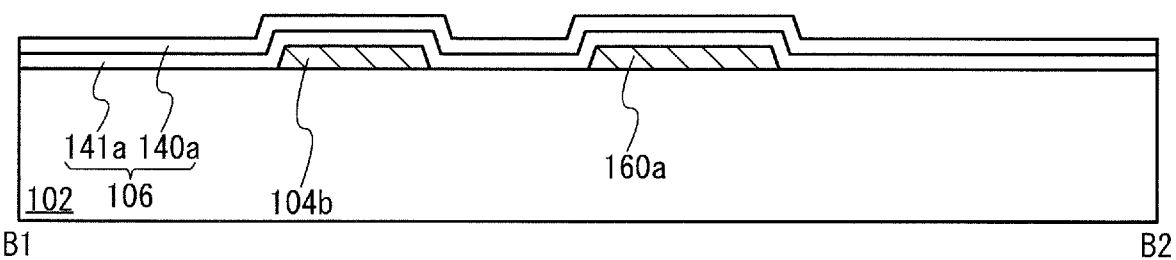
FIG. 13B is a cross-sectional view showing the method for producing the display device in an embodiment according to the present invention, taken along line B1-B2 in FIG. 12.

FIG. 12, FIG. 13A and FIG. 13B show a stage of forming the first gate electrodes 104a and 104b, the first capacitance electrode 160a and the first common line 136a on the substrate 102, and a stage of forming the first insulating layer 106. FIG. 12 is a plan view of a region corresponding to one pixel 122a. FIG. 13A is a cross-sectional view taken along line A1-A2 in FIG. 12, and FIG. 13B is a cross-sectional view taken along line B1-B2 in FIG. 12.

As shown in FIG. 12, FIG. 13A and FIG. 13B, the first common line 136a and the first capacitance electrode 160a are formed of the same conductive film as that of the first gate electrodes 104a and 104b. Therefore, the first gate electrode 104a and the gate signal line 132a are formed as one continuous pattern formed of a conductive film in the same layer. Similarly, the first common line 136a and the first capacitance electrode 160a are formed as one continuous pattern formed of a conductive film in the same layer.

The first insulating layer 106 is formed on the first gate electrodes 104a and 104b, the first common line 136a, and the first capacitance electrode 160a. For example, the first insulating layer 106 is formed by stacking the first silicon nitride film 141a and the first silicon oxide film 140a from the substrate 102 side. The first silicon nitride film 141a is formed by plasma CVD by use of gas such as $SiH_4$, $NH_3$, $N_2$ or the like as source gas. The first silicon oxide film 140a is also formed by plasma CVD by use of SiH$_4$, N$_2$O, Si(OC$_2$H$_5$)$_4$ (tetraethoxysilane), Si(OCH$_3$)$_4$ (tetramethoxysilane) or the like optionally. The first insulating layer 106 is formed on substantially the entire surface of the substrate 102.

Figure 14A:
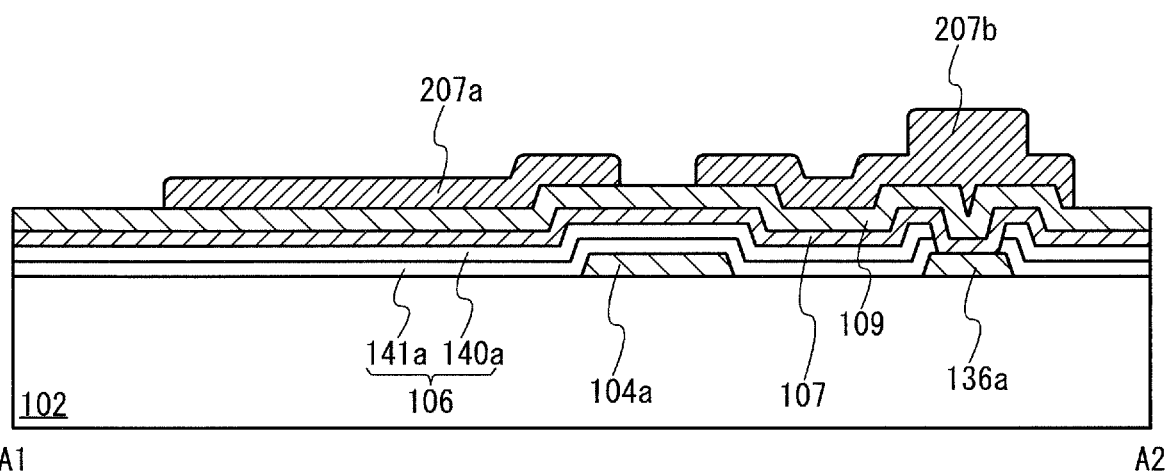
FIG. 14A is a cross-sectional view showing the method for producing the display device in an embodiment according to the present invention, taken along line A1-A2 in FIG. 12.
Figure 14B:
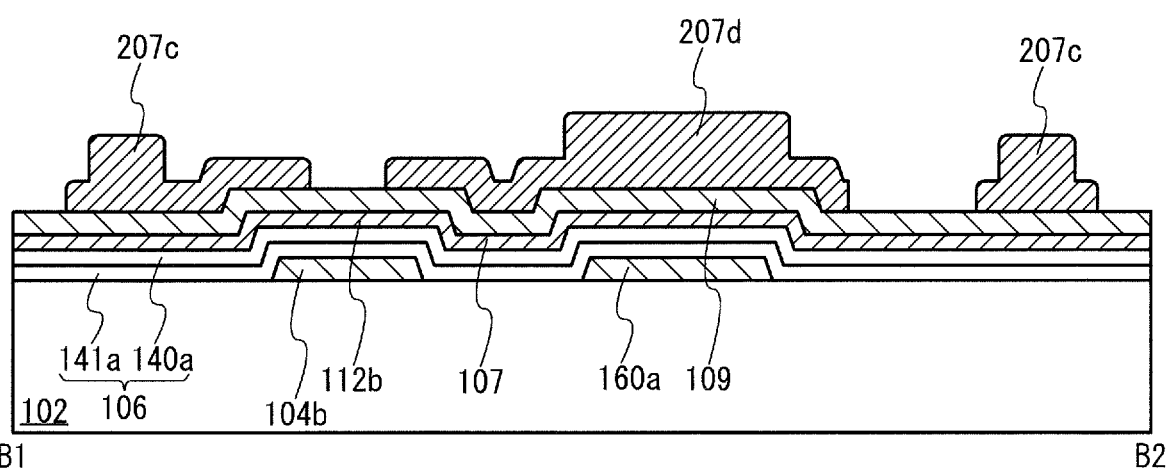
FIG. 14B is a cross-sectional view showing the method for producing the display device in an embodiment according to the present invention, taken along line B1-B2 in FIG. 12.

FIG. 14A and FIG. 14B show a stage where the second conductive film 107 and the third conductive film 109 are formed on the first insulating layer 106, and the resist mask 207a, the resist mask 207b, a resist mask 207c and a resist mask 207d are formed thereon by use of a multi-gradation photomask. As shown in FIG. 14A, the first contact hole 117a is formed in advance in the first insulating layer 106 in order to expose the first common line 136a. The resist masks 207a, 207b, 207c and 207d are formed such that regions thereof corresponding to regions of the third conductive film 109 that are to become the second common line 136b (FIG. 14A) and the data signal line 134 (FIG. 14B) are thicker than the remaining region. The second conductive film 107 is formed of a transparent conductive material, and the third conductive film 109 is formed of a metal material.

Figure 15:
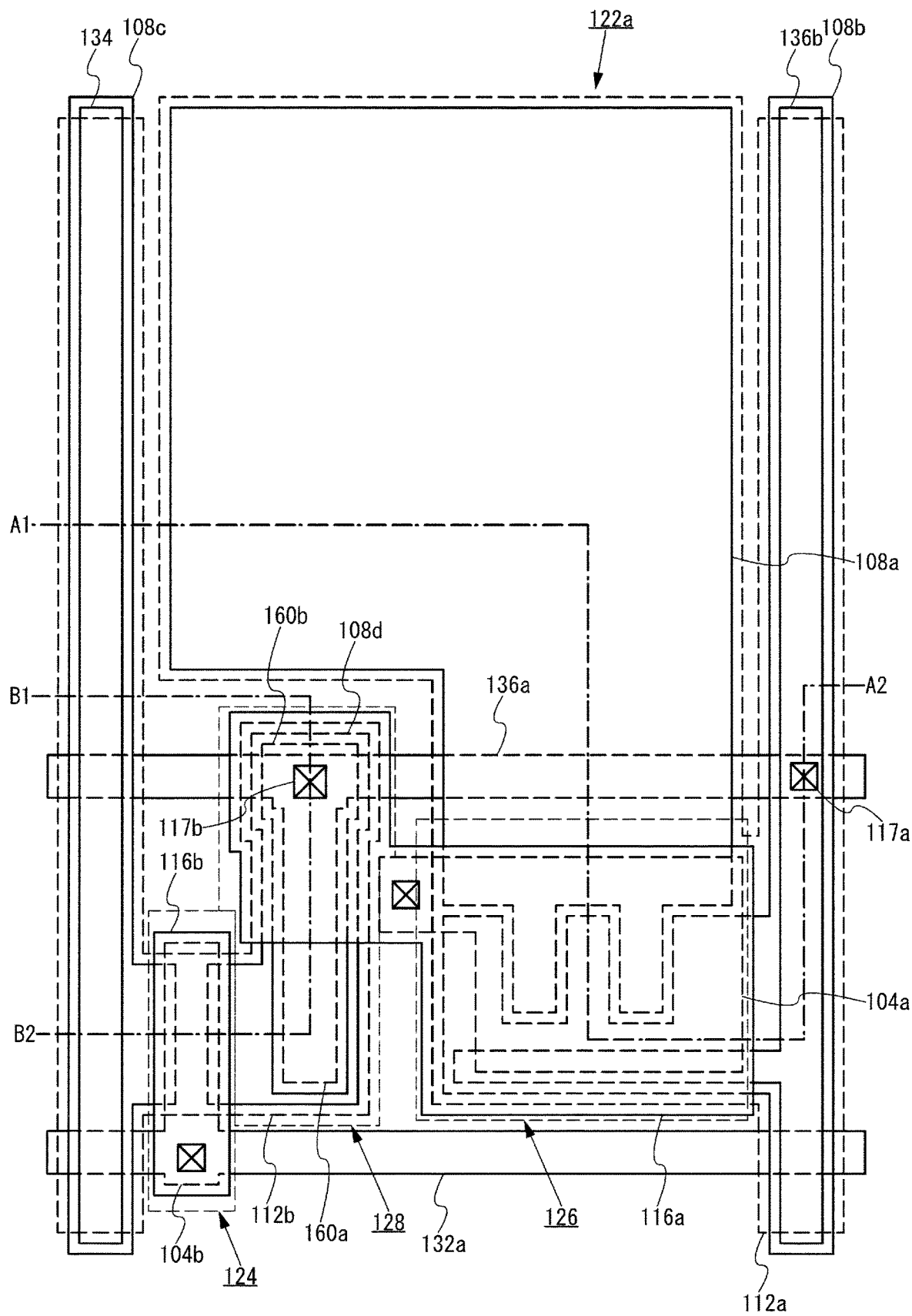
FIG. 15 is a plan view showing the method for producing the display device in an embodiment according to the present invention.
Figure 16A:
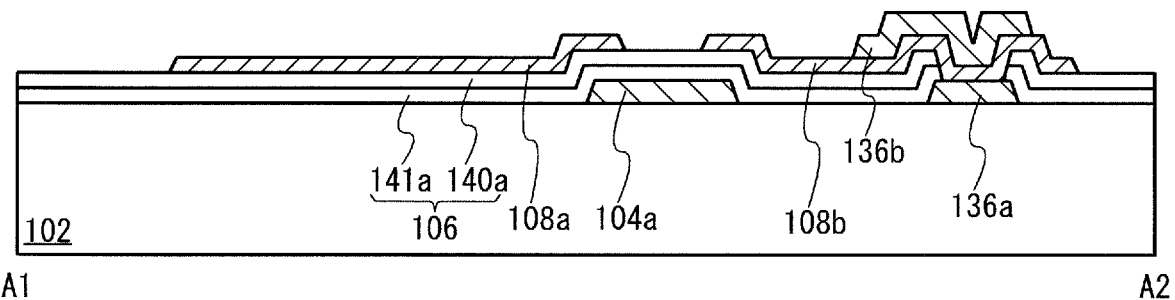
FIG. 16A is a cross-sectional view showing the method for producing the display device in an embodiment according to the present invention, taken along line A1-A2 in FIG. 15.
Figure 16B:
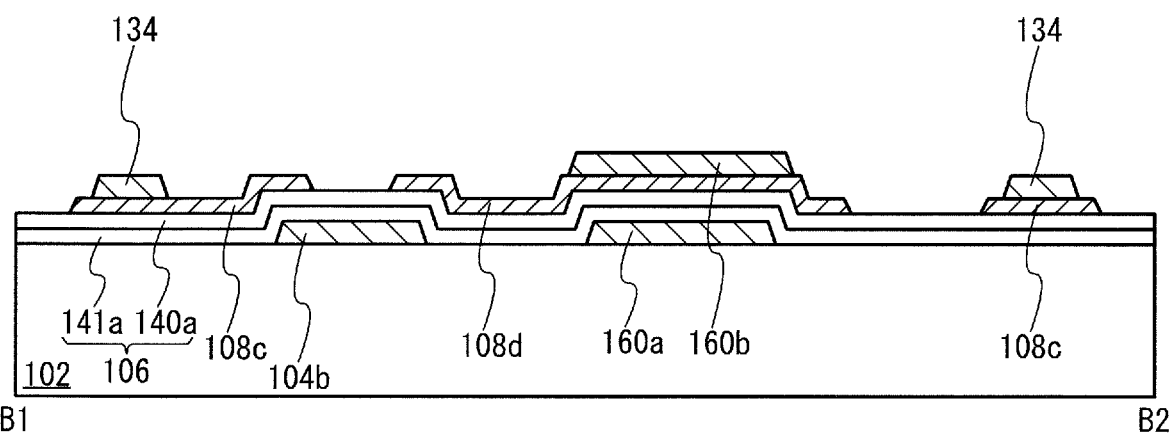
FIG. 16B is a cross-sectional view showing the method for producing the display device in an embodiment according to the present invention, taken along line B1-B2 in FIG. 15.

FIG. 15, FIG. 16A and FIG. 16B show a state where the third conductive film 109 and the second conductive film 107 are etched by use of the resist masks 207a, 207b, 207b and 207d. FIG. 15 is a plan view of a region corresponding to one pixel 122a. FIG. 16A is a cross-sectional view taken along line A1-A2 in FIG. 15, and FIG. 16B is a cross-sectional view taken along line B1-B2 in FIG. 15.

The first transparent conductive layer 108a, the second transparent conductive layer 108b, the third transparent conductive layer 108c and the fourth transparent conductive layer 108d are formed on the first insulating layer 106. The first transparent conductive layer 108a and the second transparent conductive layer 108b are formed such that ends of the first transparent conductive layer 108a and the second transparent conductive layer 108b overlap the first gate electrode 104a while having the first insulating layer 106 between the first transparent conductive layer 180a/the second transparent conductive layer 108b and the first gate electrode 104a. The third transparent conductive layer 108c and the fourth transparent conductive layer 108d are formed such that ends of the third transparent conductive layer 108c and the fourth transparent conductive layer 108d overlap the first gate electrode 104b while having the first insulating layer 106 between the third transparent conductive layer 108c/the fourth transparent conductive layer 108d and the first gate electrode 104b. The second common line 136b is formed on the second transparent conductive layer 108b. The second common line 136b is formed on the surface of the second transparent conductive layer 108b. In this state, the first common line 136a, the second transparent conductive layer 108b and the second common layer 136b are electrically connected with each other.

The second capacitance electrode 160b is formed in contact with a top surface of the fourth transparent conductive layer 108d. The second capacitance electrode 160b is located to at least partially overlap the first capacitance electrode 160a while having the fourth transparent conductive layer 108d and the first insulating layer 106 between the second capacitance electrode 160b and the first capacitance electrode 160a. The capacitance element is formed in a region where the first capacitance electrode 160a and the second capacitance electrode 160b overlap each other while having the first insulating layer 106 therebetween.

The data signal line 134 is formed of the third conductive film 109. The data signal line 134 is formed in contact with a top surface of the third transparent conductive layer 108c. In this state, the third transparent conductive layer 108c and the data signal line 134 are electrically connected with each other. The third transparent conductive layer 108c is provided along the data signal line 134, and thus is electrically connected with the data signal line 134 with certainty.

An end of the second common line 136b is located inner to an end of the second transparent conductive layer 108b. With such an arrangement, even though the second transparent conductive layer 108b and the second common line 136b are stacked on each other, the ends thereof form a stepped portion. Therefore, the step coverage of the oxide semiconductor layer 112 and the second insulating layer 114 formed in a later stage is in a good state. Similarly, an end of the data signal line 134 is located inner to an end of the third transparent conductive layer 108c, and an end of the second capacitance electrode 160b is located inner to an end of the fourth transparent conductive layer 108d. Therefore, the step coverage of the oxide semiconductor layer 112 and the second insulating layer 114, which are to be formed on these ends in a later stage, are in a good state.

Figure 17:
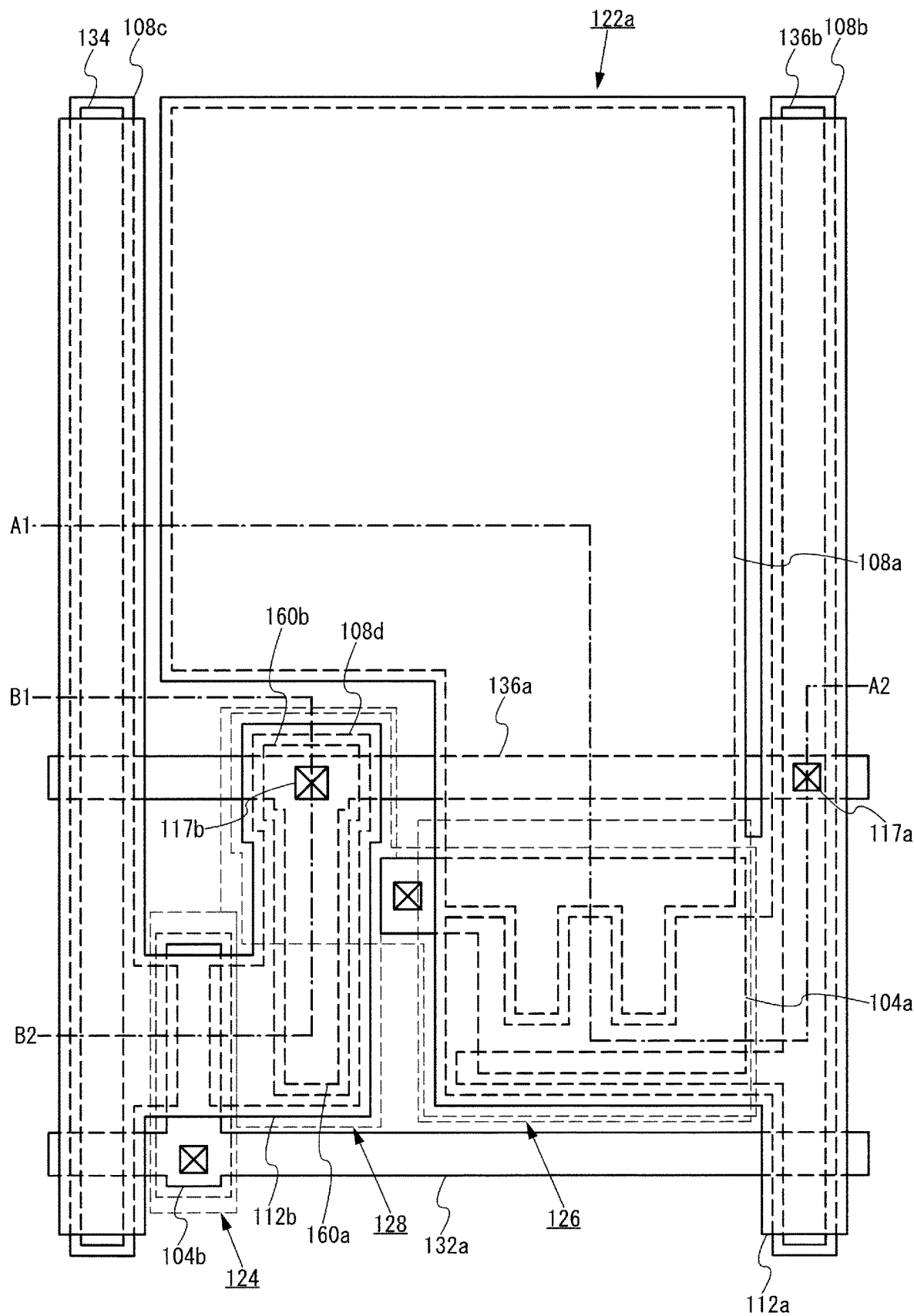
FIG. 17 is a plan view showing a method for producing the display device in an embodiment according to the present invention.
Figure 18A:
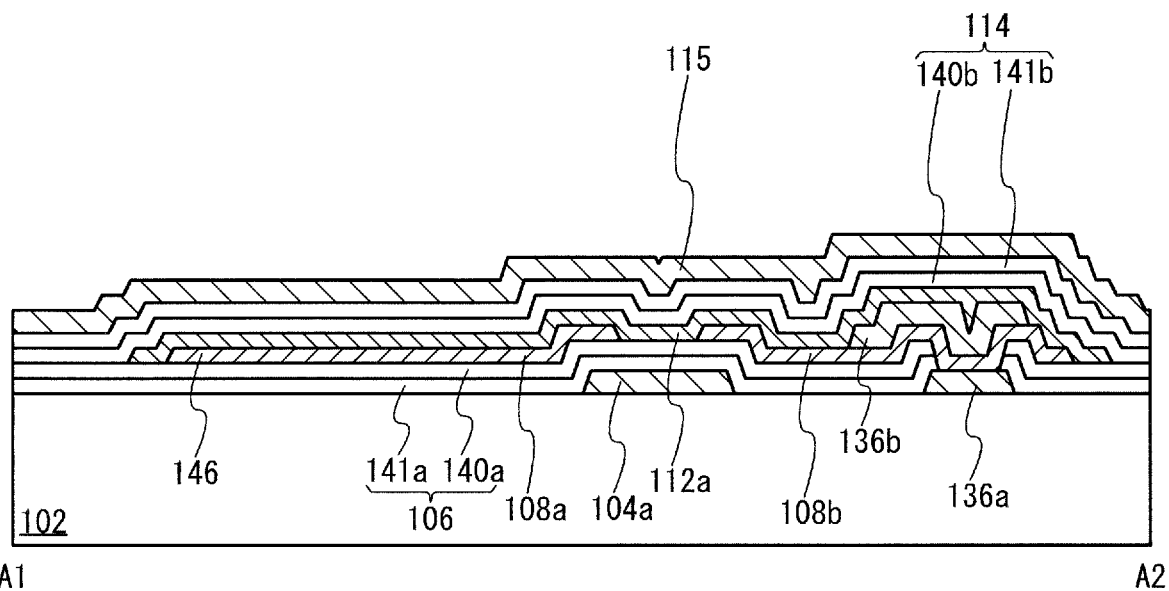
FIG. 18A is a cross-sectional view showing the method for producing the display device in an embodiment according to the present invention, taken along line A1-A2 in FIG. 17.
Figure 18B:
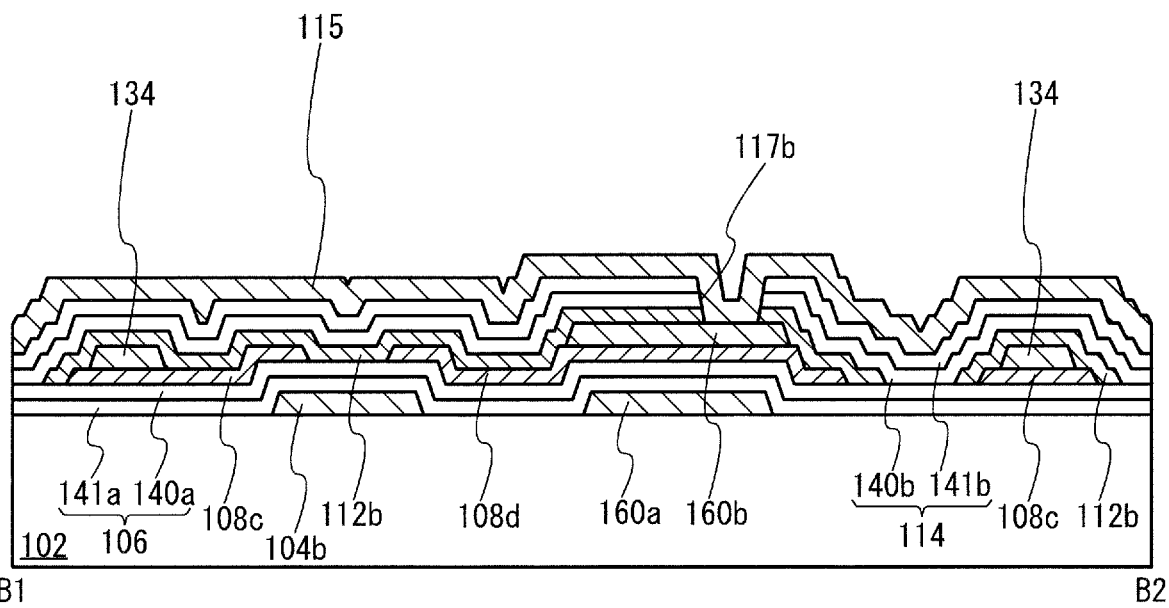
FIG. 18B is a cross-sectional view showing the method for producing the display device in an embodiment according to the present invention, taken along line B1-B2 in FIG. 17.

FIG. 17, FIG. 18A and FIG. 18B show a stage of forming the oxide semiconductor layer 112, the second insulating layer 114 and the fourth conductive film 115. FIG. 17 is a plan view of a region corresponding to one pixel 122a. FIG. 18A is a cross-sectional view taken along line A1-A2 in FIG. 17, and FIG. 18B is a cross-sectional view taken along line B1-B2 in FIG. 17.

The first oxide semiconductor layer 112a is formed to cover substantially the entire surfaces of the first transparent conductive layer 108a and the second transparent conductive layer 108b. The second oxide semiconductor layer 112b is formed to cover substantially the entire surfaces of the third transparent conductive layer 108c and the fourth transparent conductive layer 108d. The first oxide semiconductor layer 112a and the second oxide semiconductor layer 112b are formed as follows. An oxide semiconductor film is formed by sputtering by use of an oxide semiconductor as a target, and is subjected to a lithography step. As a result, the first oxide semiconductor layer 112a and the second oxide semiconductor layer 112b having a predetermined shape described above are formed. The first oxide semiconductor layer 112a is formed in contact with, and thus is electrically connected with, the first transparent conductive layer 108a and the second transparent conductive layer 108b. The second oxide semiconductor layer 112b is formed in contact with, and thus is electrically connected with, the third transparent conductive layer 108c and the fourth transparent conductive layer 108d.

The second insulating layer 114 is formed on the first oxide semiconductor layer 112a and the second oxide semiconductor layer 112b. The second insulating layer 114 is formed by, for example, stacking the second silicon oxide film 140b and the second silicon nitride film 141b in this order from the oxide semiconductor layer 112 side. As a result, the first silicon oxide film 140a is formed below the oxide semiconductor layer 112, and the second silicon oxide film 140b is formed above the oxide semiconductor layer 112. The oxide semiconductor layer 112 is held between the oxide insulating films, and thus is suppressed from having a defect (donor level) caused thereto by oxygen deficiency.

It is desirable that the silicon oxide films 140a and 140b do not have oxygen deficiency so as not to draw out oxygen from the first oxide semiconductor layer 112a. Rather, it is even preferable that the silicon oxide films 140a and 140b contain an excessive amount of oxygen. The second insulating layer 114, after being formed, is heat-treated at a temperature of 250° C. to 400° C., and thus oxygen is diffused from the first silicon oxide film 140a and the second silicon oxide film 140b to the first oxide semiconductor 112a and the second oxide semiconductor layer 112b. Since such heat treatment is performed, even if the oxide semiconductor layer 112 includes oxygen deficiency, the oxygen deficiency is compensated for by oxygen diffused from the oxide semiconductor layer 112, and the defect, which would become a donor level, is extinguished. Therefore, the resistance is increased.

In the second layer 114, the second contact hole 117b is formed in a region overlapping the second capacitance electrode 160b. Then, the fourth conductive film 115 is formed. The fourth conductive film 114 is formed in substantially the same manner as the first conductive film 103.

Figure 19:
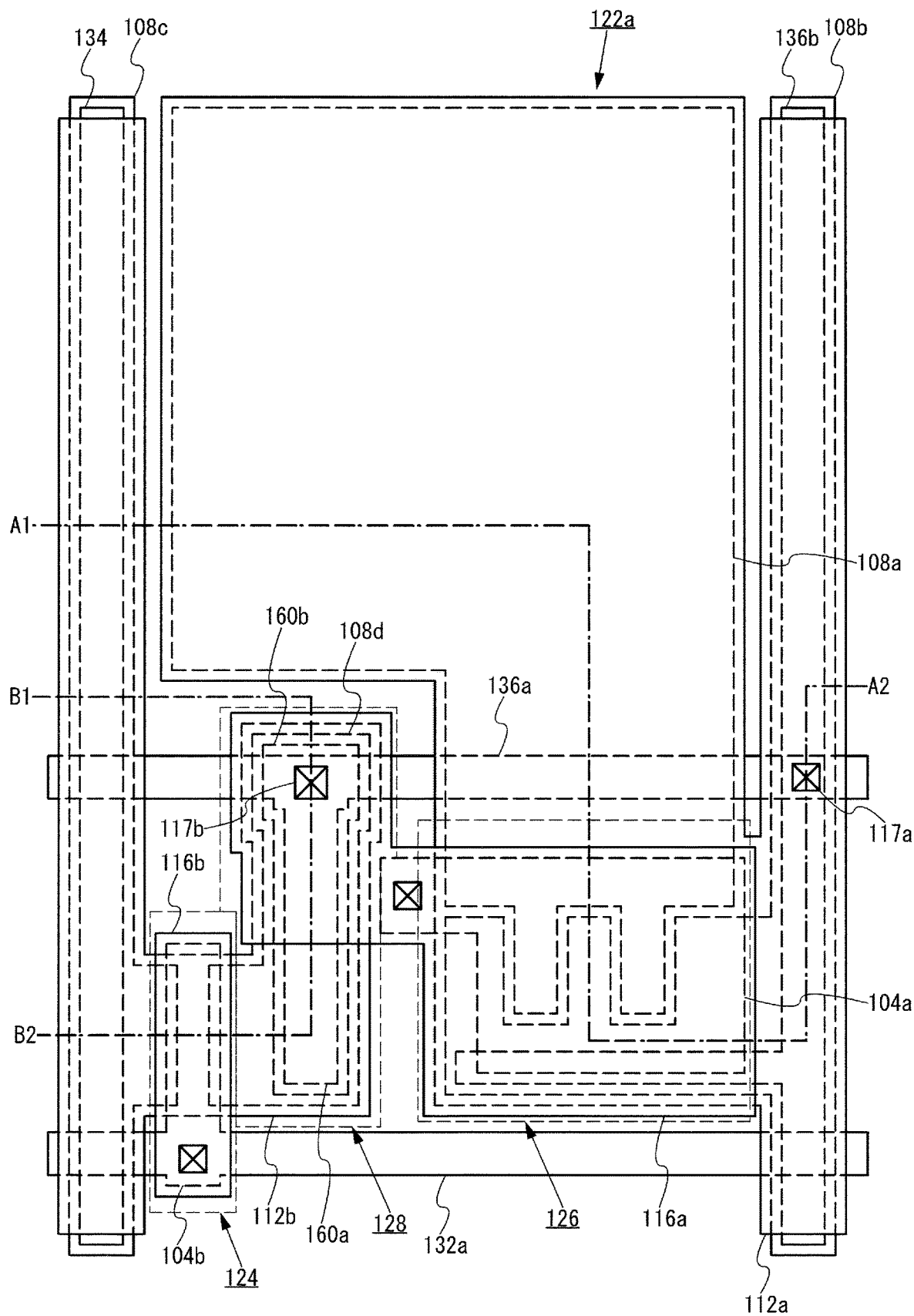
FIG. 19 is a plan view showing the method for producing the display device in an embodiment according to the present invention.
Figure 20A:
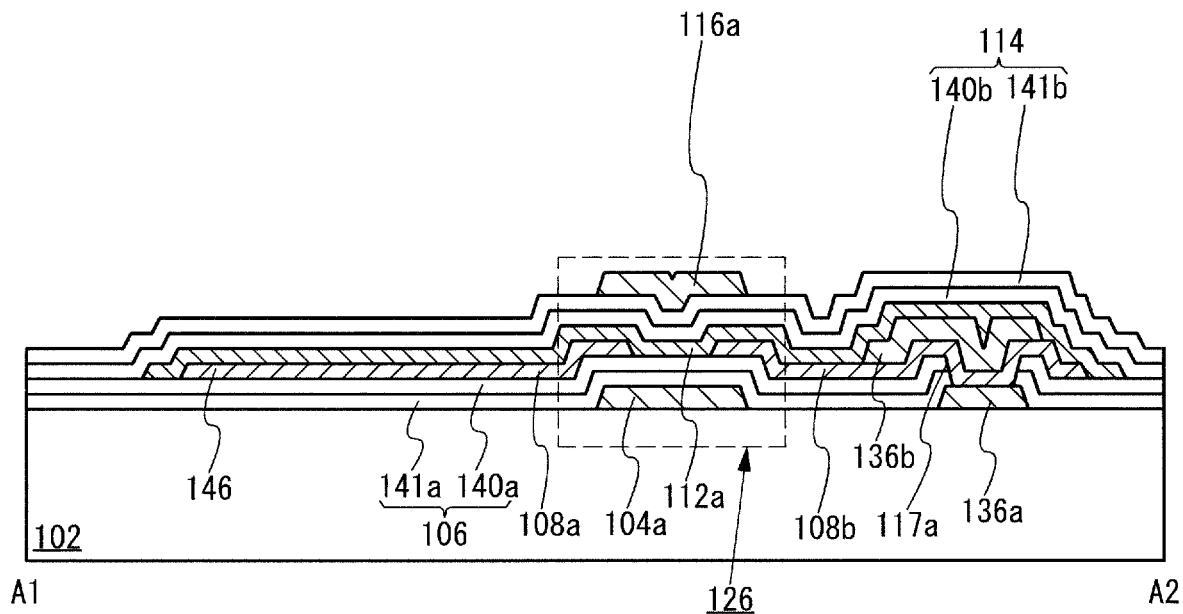
FIG. 20A is a cross-sectional view showing the method for producing the display device in an embodiment according to the present invention, taken along line A1-A2 in FIG. 19.
Figure 20B:
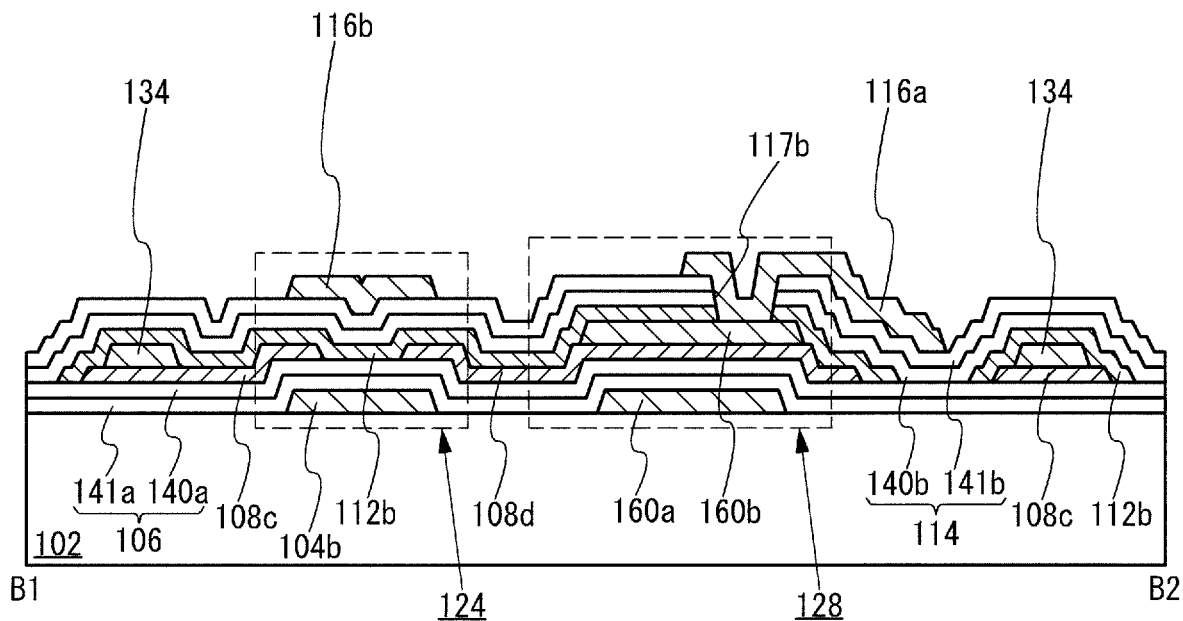
FIG. 20B is a cross-sectional view showing the method for producing the display device in an embodiment according to the present invention, taken along line B1-B2 in FIG. 19.

FIG. 19, FIG. 20A and FIG. 20B show a stage of forming the second gate electrode 116. FIG. 19 is a plan view of a region corresponding to one pixel 122a. FIG. 20A is a cross-sectional view taken along line A1-A2 in FIG. 19, and FIG. 20B is a cross-sectional view taken along line B1-B2 in FIG. 19.

The second gate electrode 116 is formed by a lithography step and an etching step performed on the fourth conductive film 115. The second gate electrode 116a is formed to include a region overlapping the first gate electrode 104a. The second gate electrode 116b is formed to include a region overlapping the first gate electrode 104b. As a result, the driving transistor 126 and the selection transistor 124 are formed. The capacitance element 128 is electrically connected with the second gate electrode 116a via the contact hole 117b.

Figure 21A:
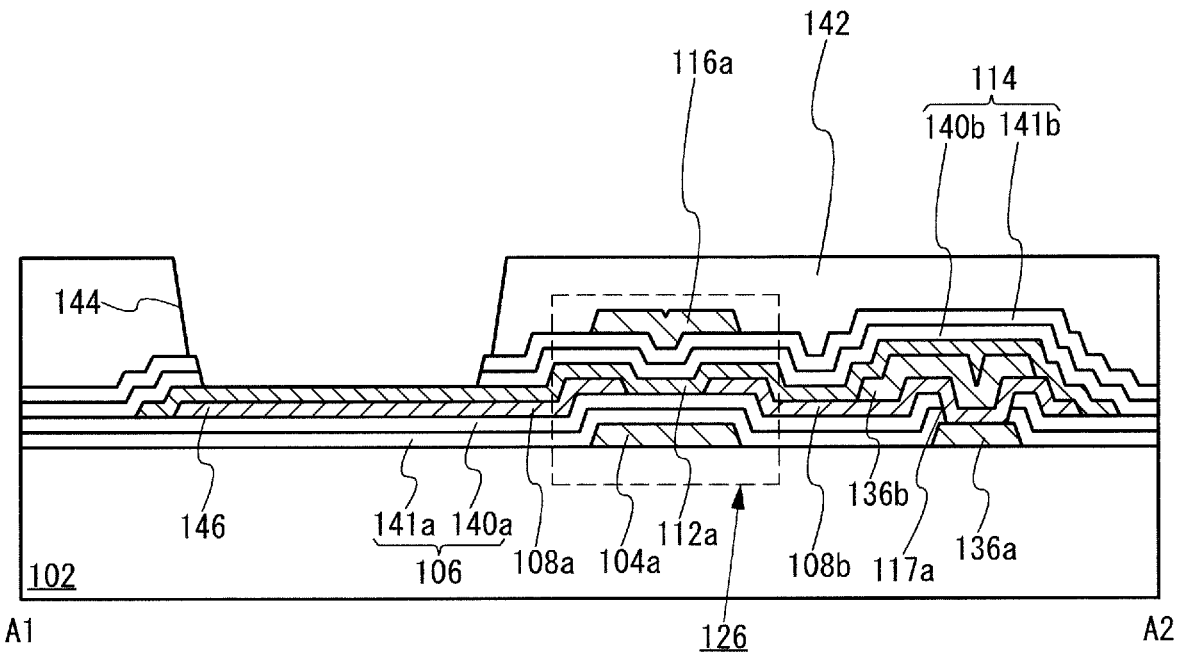
FIG. 21A is a cross-sectional view showing the method for producing the display device in an embodiment according to the present invention, taken along line A1-A2 in FIG. 19.
Figure 21B:
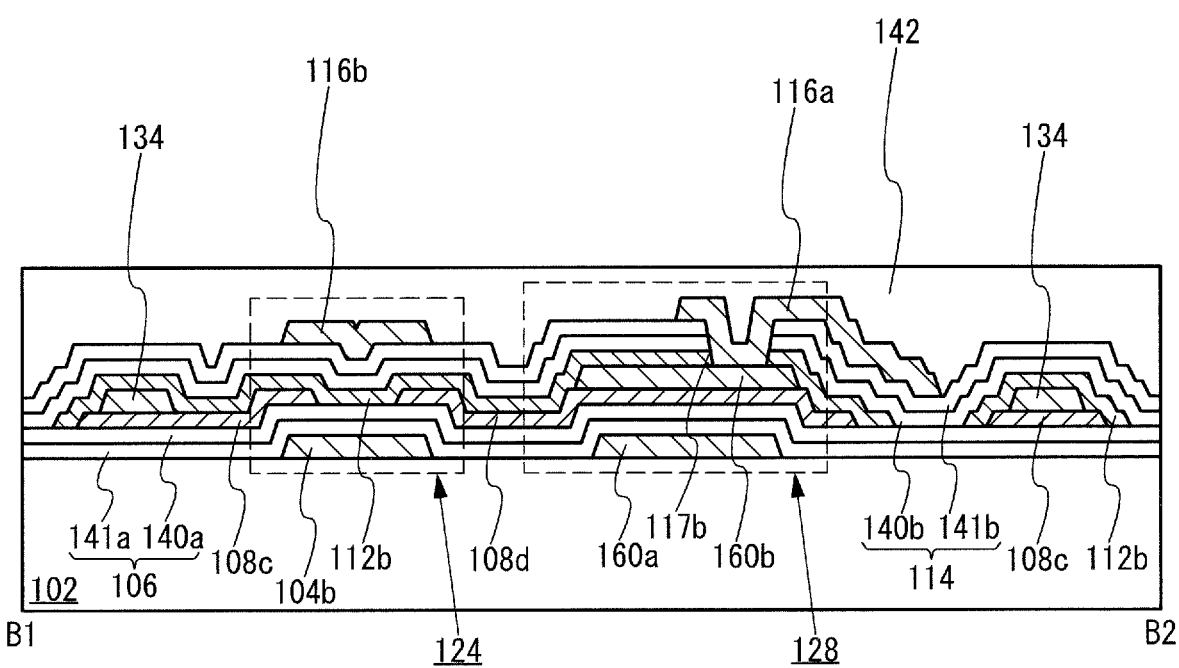
FIG. 21B is a cross-sectional view showing the method for producing the display device in an embodiment according to the present invention, taken along line B1-B2 in FIG. 19.

As shown in FIG. 21A and FIG. 21B, the flattening layer 142 is formed to bury the selection transistor 124, the driving transistor 126 and the capacitance element 128. The flattening layer 142 is formed of an organic resin material such as, for example, an acrylic resin, a polyimide resin, an epoxy resin, a polyamide resin or the like. In the flattening layer 142, the opening 144 is formed in a region overlapping the first electrode 146, which is the cathode electrode, in order to expose the first oxide semiconductor layer 112a. In the case where the flattening layer 142 is formed of a photosensitive resin material, the opening 144 is formed by exposure to light by use of a photomask. Before the flattening layer 142 is formed, an opening is formed in advance in the second insulating layer 114 in a region corresponding to the opening 144. Alternatively, an opening that exposes the first oxide semiconductor layer 112a may be formed in the second insulating layer 114 in the step of forming the opening 144 in the flattening layer 142. It is preferable that the opening 144 in the flattening layer 142 has a tapered inner wall in order to allow the organic EL element 130 to be formed easily.

Figure 22A:
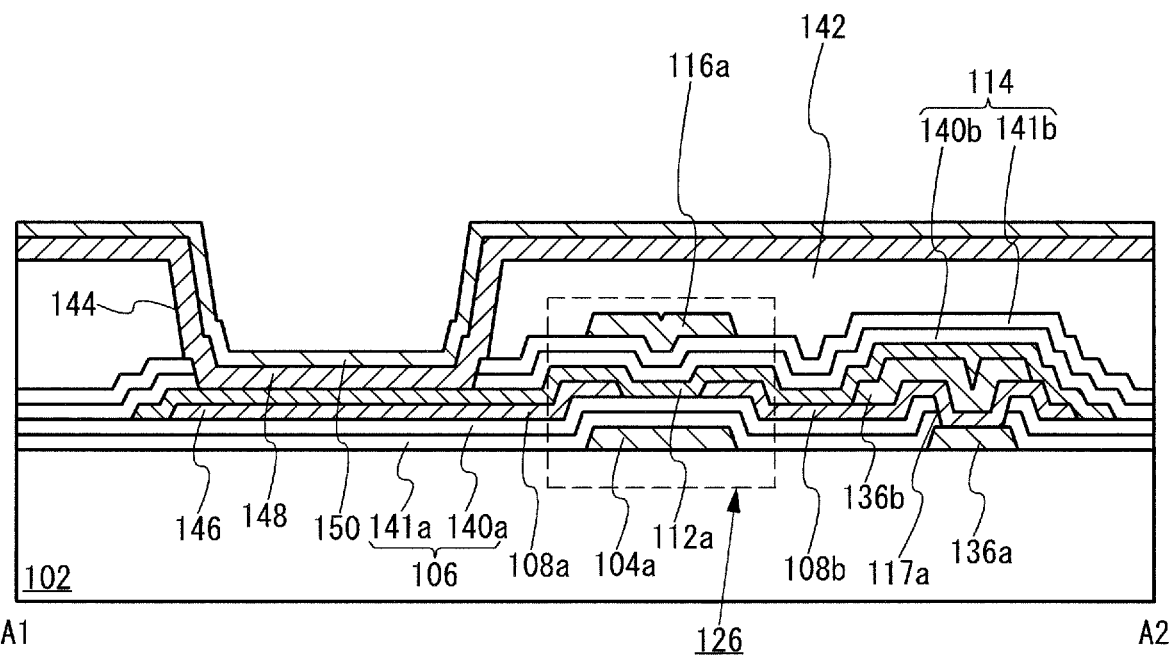
FIG. 22A is a cross-sectional view showing the method for producing the display device in an embodiment according to the present invention, taken along line A1-A2 in FIG. 19.
Figure 22B:
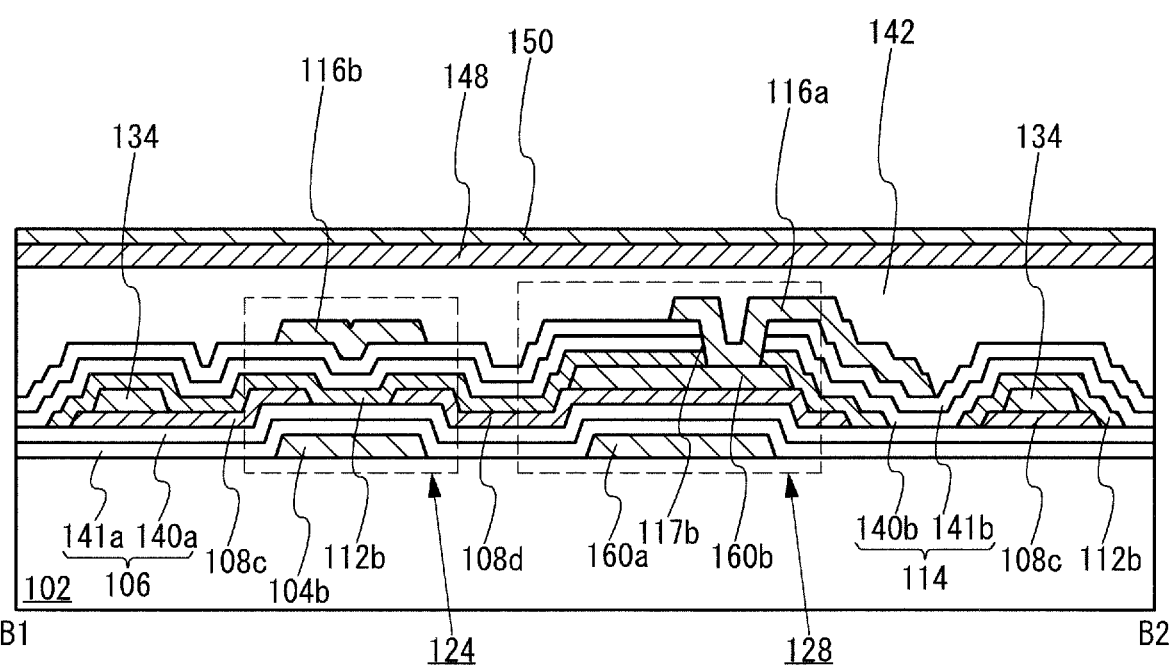
FIG. 22B is a cross-sectional view showing the method for producing the display device in an embodiment according to the present invention, taken along line B1-B2 in FIG. 19.

FIG. 22A and FIG. 22B show a stage of forming the electron transfer layer 148 and the electron injection layer 150. The electron transfer layer 148 is formed of a metal oxide material. Examples of the metal oxide material usable for the electron transfer layer 148 include substantially the same materials described in embodiment 1, specifically, a four-component oxide material, a three-component oxide material, a two-component oxide material, and a one-component oxide material. The electron transfer layer 148 is formed by sputtering by use of any of the above-listed materials as a sputtering target. The electron injection layer 150 is formed of C12A7 electride. The electron injection layer 150 may be formed by sputtering by use of C12A7 electride as a sputtering target. In this case, the sputtering may be performed by use of at least one type of gas selected from the group consisting of He (helium), Ne (neon), $N_2$ (nitrogen), Ar (argon), NO (nitrogen monoxide), Kr (krypton), and Xe (xenon). The electron transfer layer 148 and the electron injection layer 150 are used commonly in a plurality of pixels 122a, and therefore are formed on substantially the entirety of a region where the pixels 122a are located.

Then, the light emitting layer 152, the hole transfer layer 154, the hole injection layer 156 and the second electrode 158 as the anode electrode are formed. As a result, the pixel structure shown in FIG. 9A and FIG. 9B is formed. The light emitting layer 152 is formed of different light emitting materials for red pixels, green pixels and blue pixels. In the case where light emitted from the light emitting layer 152 has a white light emission spectrum, the light emitting layer 152 may be formed in substantially the entirety of the display region 121 as a layer common to all the pixels 122a. The hole transfer layer 154 and the hole injection layer 156 are each formed on substantially the entirety of the region where the pixels 122a are located, as layers common to all the pixels 122a. The second electrode 158 as the anode electrode is used as a common electrode to the pixels 122a, and therefore is formed on substantially the entirety of the region where the pixels 122a.

According to the method for producing the display device 120 in this embodiment, a multi-gradation photomask is used to decrease the number of photomasks required to produce the display device 120. The use of the multi-gradation photomask allows a plurality patterns (the first transparent conductive layer 108a, the second transparent conductive layer 108b, the third transparent conductive layer 108c, the fourth transparent conductive layer 108d, the data signal line 134, the second common line 136b, and the like) to be formed by performing exposure merely once. This increases the productivity of display devices 120 and also decreases the production cost.

In this embodiment, both of the selection transistor 124 and the driving transistor 126 are of a dual gate type. The present invention is not limited to this. For example, the selection transistor 124 may be a top gate type transistor with no first gate electrode 104b. The pixel circuit is not limited to having a configuration shown in FIG. 7. The transistors and the organic EL element in this embodiment are applicable to a pixel circuit including three transistors for one pixel.

Embodiment 3

In embodiment 3, another embodiment of the method for producing the display device 120 according to the present invention will be described. In the following description, differences from embodiment 2 will be described.

Figure 23A:
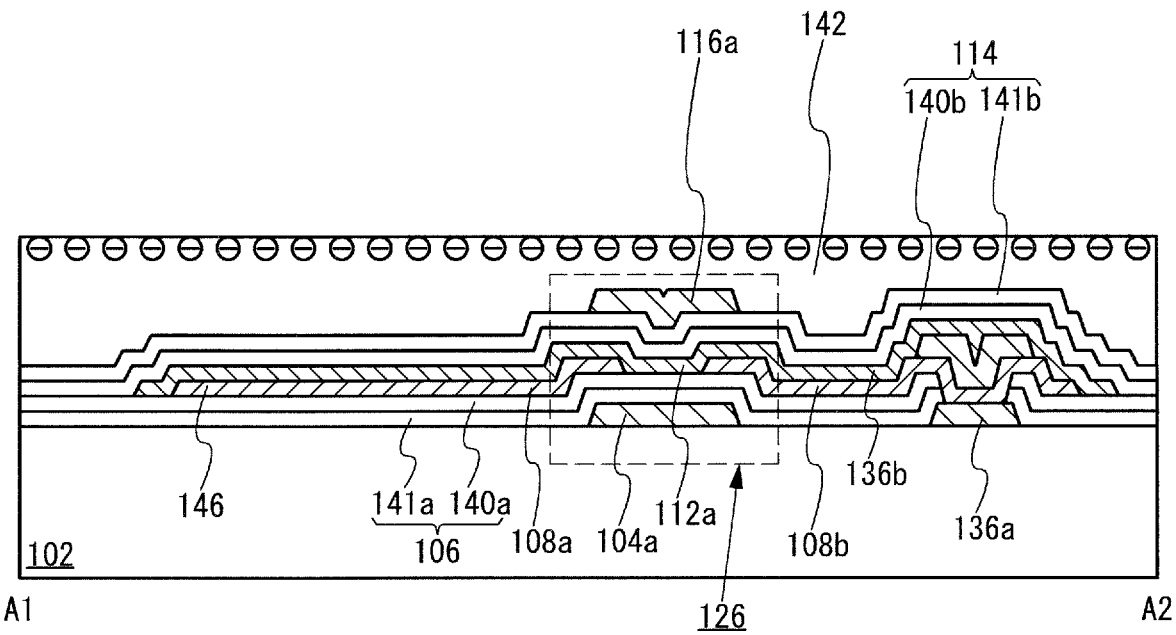
FIG. 23A is a cross-sectional view showing a method for producing a display device in an embodiment according to the present invention, taken along line A1-A2 in FIG. 19.

This method is substantially the same as in embodiment 2 until the stage of forming the second gate electrode 116. On the second gate electrode 116, the flattening layer 142 is formed. FIG. 23A is a cross-sectional structure taken along line A1-A2 in FIG. 19, and shows the stage of forming the flattening layer 142.

In this embodiment, the flattening layer 142 is formed of an insulating film having polarity. The flattening layer 142 is formed of, for example, a straight chain-type fluorine organic material. Example of the straight chain-type fluorine organic material usable for the flattening layer 142 include a fluroalkylsilane (FAS)-based material. Example of the fluroalkylsilane (FAS)-based material include H,1H,2H,2H-perfluorodecyltrichlorosilane (FDTS), tridecafluoro-1,1,2,2-tetrahydrooctyltrichlorosilane (FOTS), and the like.

The flattening layer 142 is formed of a straight chain-type fluorine organic material, and thus has a liquid-repelling surface. In more detail, the flattening layer 142 contains bipolar molecules and side chains, and therefore, as schematically shown in FIG. 23A, negative charges are generated at the surface of the flattening layer 142 because of a microlayer separation phenomenon. The opening 144 exposing the first oxide semiconductor layer 112a is formed in the flattening layer 142, and then, the electron transfer layer 148 is formed.

Figure 23B:
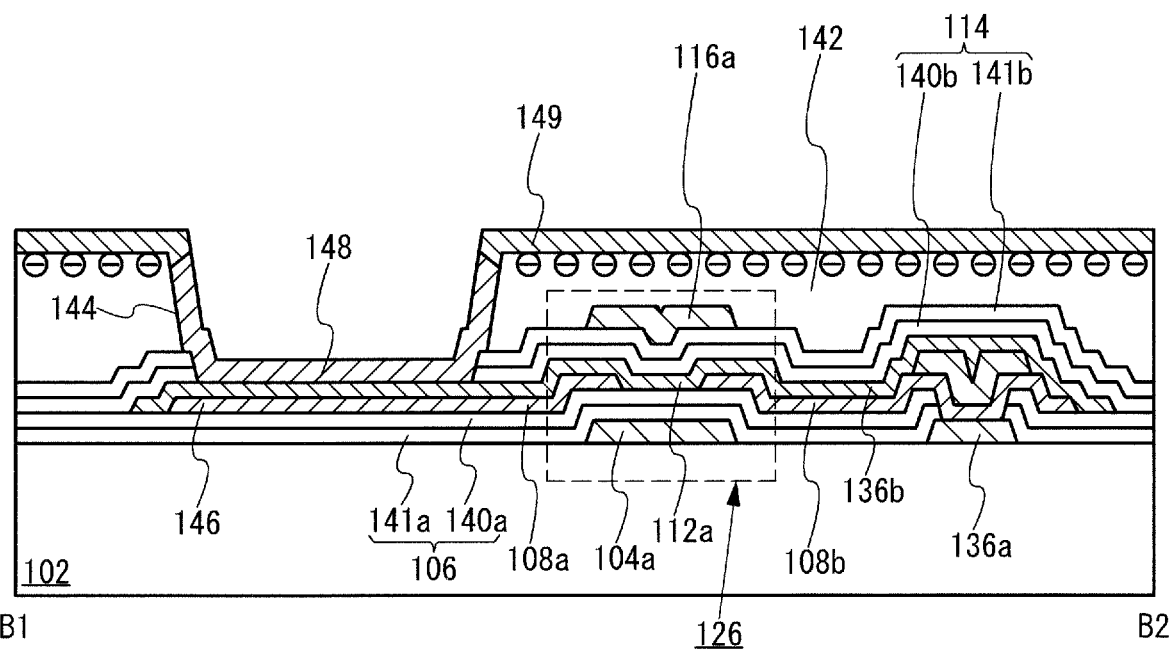
FIG. 23B is a cross-sectional view showing the method for producing the display device in an embodiment according to the present invention, taken along line B1-B2 in FIG. 19.

FIG. 23B shows a stage where the electron transfer layer 148 is formed. The electron transfer layer 148 is formed of a metal oxide material. Examples of the metal oxide material usable for the electron transfer layer 148 include substantially the same materials described in embodiment 1, specifically, a four-component oxide material, a three-component oxide material, a two-component oxide material, and a one-component oxide material. These oxide materials are each a type of degenerate semiconductor, and have n-type conductivity, with which the major carrier is an electron.

Negative charges are generated at the surface of the flattening layer 142 because of the microlayer separation phenomenon. As a result, a region, of the electron transfer layer 148 having an n-type conductivity, that is in contact with the surface of the flattening layer 148 is depleted. Such a depleted region 149 of the electron transfer layer 148 becomes a high resistance region with almost no carrier. By contrast, a region, of the electron transfer layer 148, that is in contact with the oxide semiconductor layer 112a, remains as it is without being depleted. The electron transfer layer 148 having an n-type conductivity is formed in substantially the entirety of the display region 121. The depleted region 149 of the electron transfer layer 148 is in positional correspondence with a region between the pixels. The pixels adjacent to each other are insulated from each other by the depleted region 149. Therefore, the level of leak current flowing laterally via the electron transfer layer 148 is decreased.

Conventionally, it is considered that in order to produce an organic EL element, a hole injection layer, a hole transfer layer, a light emitting layer, an electron transfer layer, an electron injection layer and a cathode electrode need to be continuously formed in vacuum without being exposed to the air. By contrast, in this embodiment according to the present invention, the electron transfer layer 148 and the electron injection layer 150 are formed of an oxide semiconductor, which is stable even when being exposed to the air. Thus, the conditions for producing an organic EL element have a certain degree of freedom. Specifically, in this embodiment according to the present invention, the organic EL element may be produced as follows. First, the electron transfer layer 148 and the electron injection layer 150 are formed in vacuum by use of a sputtering device. Then, after the pressure is returned to the atmospheric pressure, the hole transfer layer 154, the hole injection layer 156 and the anode electrode 158 are formed by another film formation device. Therefore, a device for producing the organic EL element is prevented from being enlarged, and the line balance of the production process is easily adjusted. This embodiment according to the present invention has various advantages that, for example, the production adjustment is easily done while maintenance of the production device is performed, and that the production efficiency is improved.

Embodiment 4

In embodiment 4, the pixel structure is different from that in embodiment 2. In the following description, differences from embodiment 2 will be described.

4-1. Pixel Structure 1

Figure 24A:
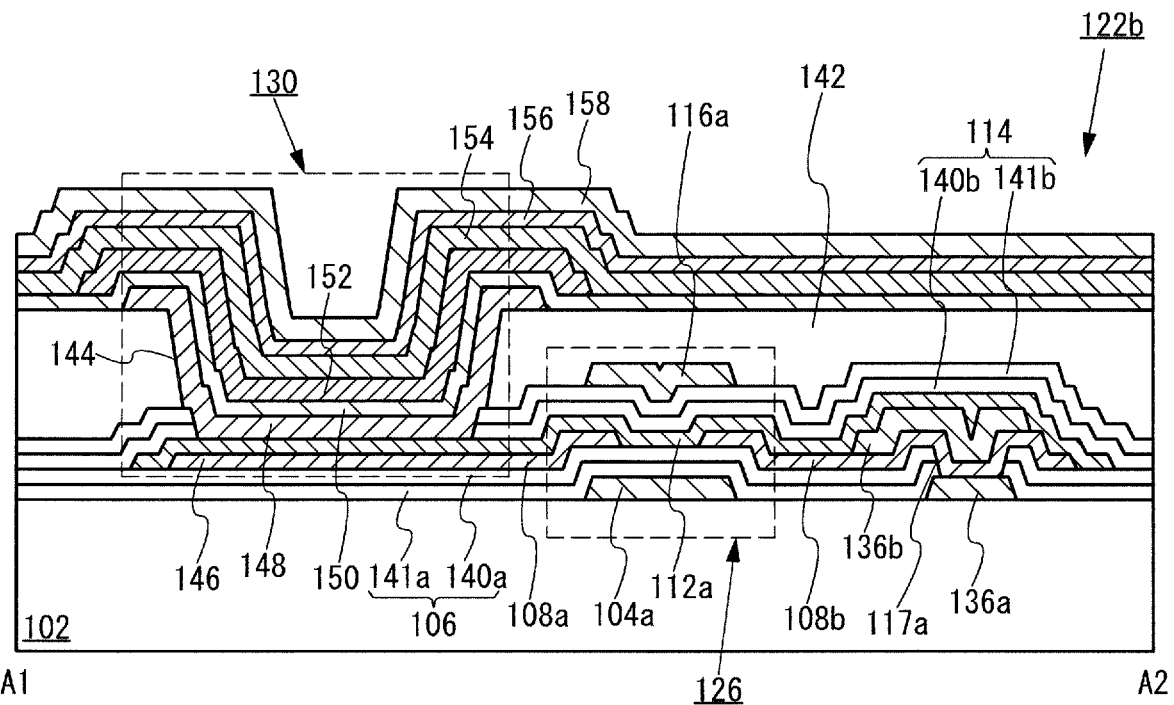
FIG. 24A is a cross-sectional view showing a method for producing a display device in an embodiment according to the present invention, taken along line A1-A2 in FIG. 19.
Figure 24B:
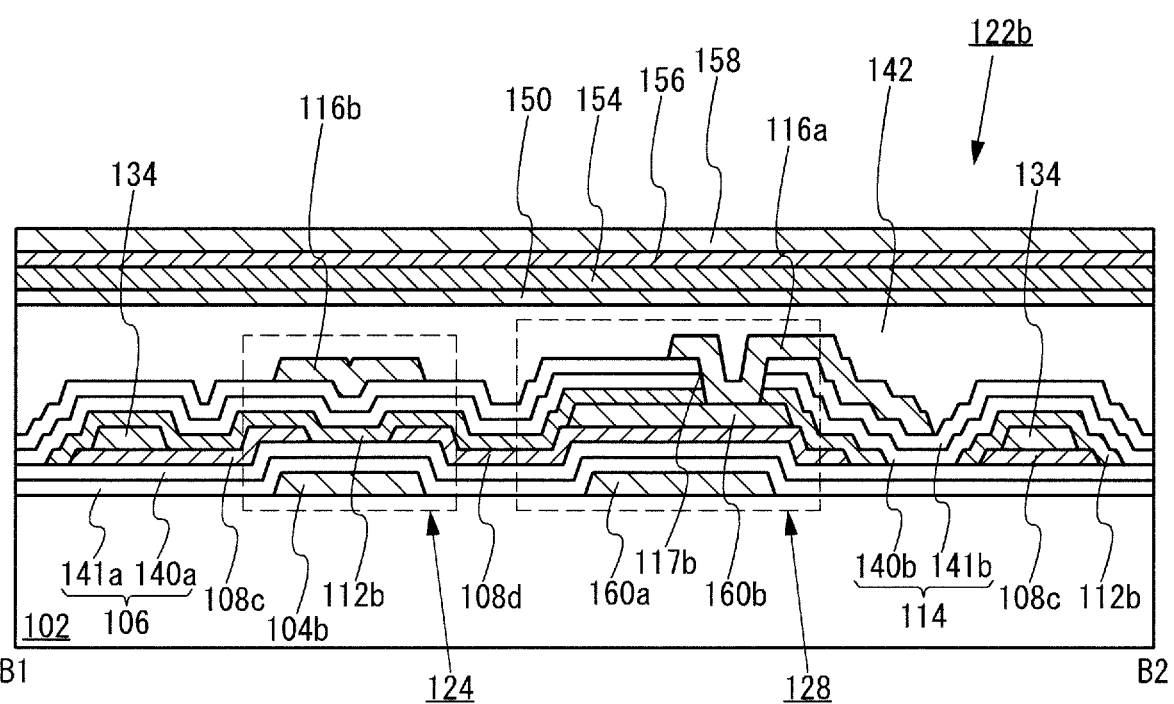
FIG. 24B is a cross-sectional view showing the method for producing the display device in an embodiment according to the present invention, taken along line B1-B2 in FIG. 19.

FIG. 24A and FIG. 24B shows a structure of a pixel 122b in a display device in this embodiment. FIG. 24A shows a cross-sectional structure taken along line A1-A2 in the plan view of FIG. 8, and FIG. 24B shows a cross-sectional structure taken along line B1-B2 in the plan view of FIG. 8.

As shown in FIG. 24A, in the pixel 122b, the electron transfer layer 148 is individually provided in correspondence with each organic EL element 130. In other words, the electron transfer layer 148 is not provided in substantially the entirety of the display region 121, but one electron transfer layer 148 is individually provided for each pixel 122b. In this case, it is preferable that the electron transfer layer 148 has an area size larger than that of the opening 144 and smaller than the light emitting layer 152. Namely, it is preferable that an end of the electron transfer layer 148 is located outer to an end of the opening 144 and inner to an end of the light emitting layer 152. Therefore, as shown in FIG. 24B, the electron transfer layer 148 is not located in a region where the selection transistor 124 is provided. Since the electron transfer layer 148 is formed to be larger than the opening 144, the light emitting layer 152 is prevented from contacting the oxide semiconductor layer 122a. Since the electron transfer layer 148 is formed to be smaller than the light emitting layer 152, the hole transfer layer 154 is prevented from contacting the electron transfer layer 148.

The electron transfer layer 148 is formed of a metal oxide material. A resist mask is formed by a lithography step, and dry etching or wet etching is performed to easily form the electron transfer layer 148. The electron transfer layer 148 is formed of a metal oxide material and therefore has an n-type conductivity. As shown in FIG. 24A, since the electron transfer layer 148 is formed individually for each pixel 122b, the level of leak current between the pixels 122b is decreased. In the case where the electron injection layer 150 is formed of C12A7 electride, the electron injection layer 150 does not increase the level of leak current between adjacent pixels 122b because C12A7 electride has a high resistance. Therefore, in the case of being formed of C12A7 electride, the electron injection layer 150 may be provided in substantially the entirety of the display region 121 without causing the problem of leak current.

As described above, the electron transfer layer 148 is individually provided for the organic EL element 130 in each pixel 122b, so that the undesirable possibility that the leak current between the pixels 122b (in other words, crosstalk) is generated is solved.

4-2. Pixel Structure 2

Figure 25A:
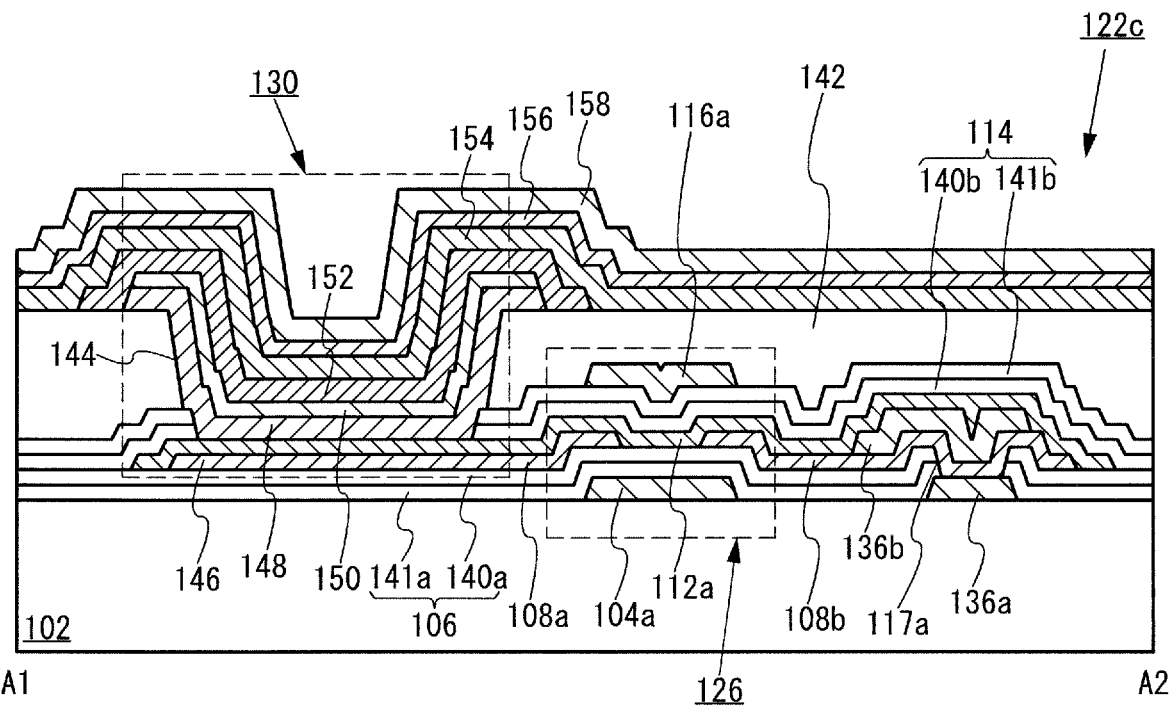
FIG. 25A is a cross-sectional view showing a method for producing a display device in an embodiment according to the present invention, taken along line A1-A2 in FIG. 19.
Figure 25B:
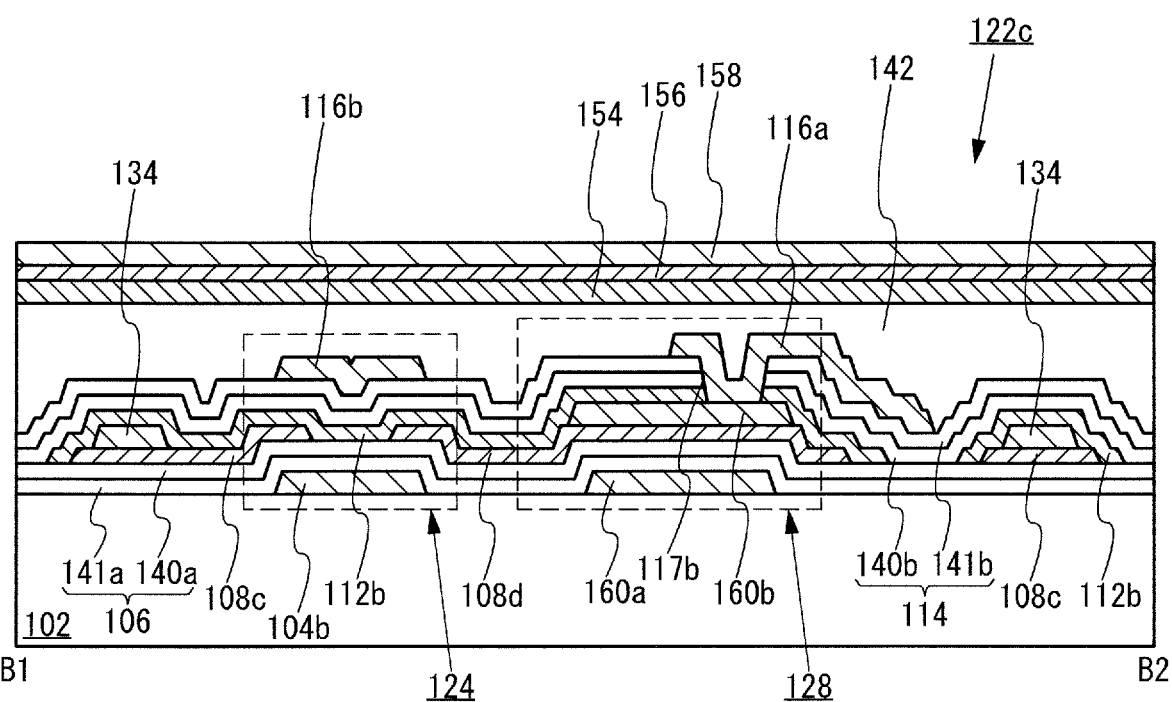
FIG. 25B is a cross-sectional view showing the method for producing the display device in an embodiment according to the present invention, taken along line B1-B2 in FIG. 19.

The two layers of the electron transfer layer 148 and the electron injection layer 150 may be formed by a lithography step and an etching step. FIG. 25A and FIG. 25B shows a structure of the pixel 122c in such a case. FIG. 25A shows a cross-sectional structure taken along line A1-A2 in the plan view of FIG. 8. FIG. 25B shows a cross-sectional structure taken along line B1-B2 in the plan view of FIG. 8.

In the case where the electron transfer layer 148 and the electron injection layer 150 are individually provided for each pixel 122b, it is preferable that the electron transfer layer 148 and the electron injection layer 150 each have an area size smaller than that of the light emitting layer 152. Namely, it is preferable that ends of the electron transfer layer 148 and the electron injection layer 150 are located outer to the end of the opening 144 and inner to the end of the light emitting layer 152. In other words, it is preferable that the electron transfer layer 148 and the electron injection layer 150 each have such a size that is covered with the light emitting layer 152. The electron transfer layer 148 and the electron injection layer 150 are each smaller than the light emitting layer 152, so that the hole transfer layer 154 is prevented from contacting the electron transfer layer 148.

The electron transfer layer 148 and the electron injection layer 150 are individually provided for the organic EL element 130 in each pixel 122b, so that the undesirable possibility that the leak current between the pixels 122b (in other words, crosstalk) is generated is solved.

In this embodiment, the electron transfer layer 148 and the electron injection layer 150 are formed of an oxide semiconductor, and thus are allowed to be patterned by a lithography step so as to be provided individually for the organic EL element 130 in each pixel 122b. Namely, the generation of the leak current between the pixels 122b (in other words, crosstalk) is prevented and the image quality of the display device is improved merely by adding one photomask for the production process.

Embodiment 5

In embodiment 5, one of, or both of, the electron transfer layer 148 and the electron injection layer 150 are individually provided for each pixel, but in a different form from that of embodiment 4. In the following description, mainly differences from embodiment 4 will be described.

5-1. Pixel Structure 1

Figure 26:
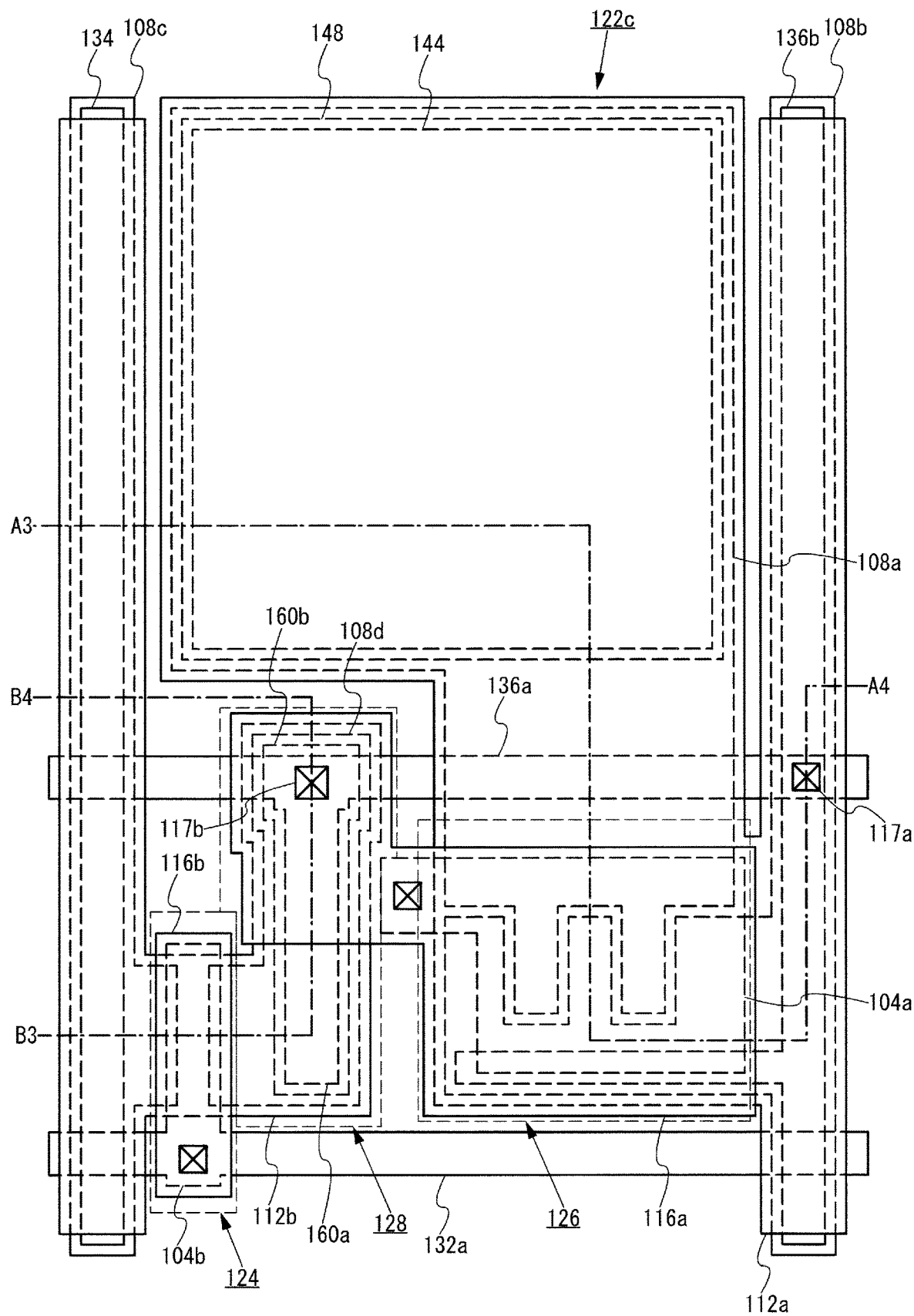
FIG. 26 is a plan view showing a method for producing a display device in an embodiment according to the present invention.
Figure 27A:
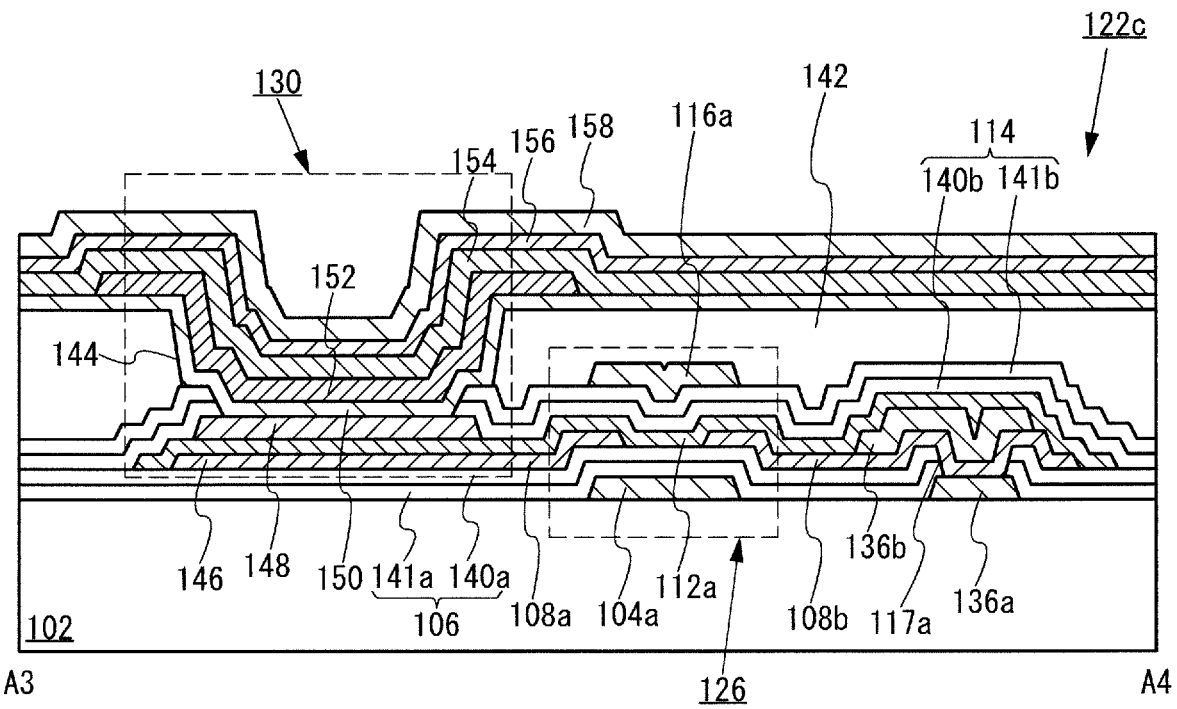
FIG. 27A is a cross-sectional view showing the method for producing the display device in an embodiment according to the present invention, taken along line A3-A4 in FIG. 26.
Figure 27B:
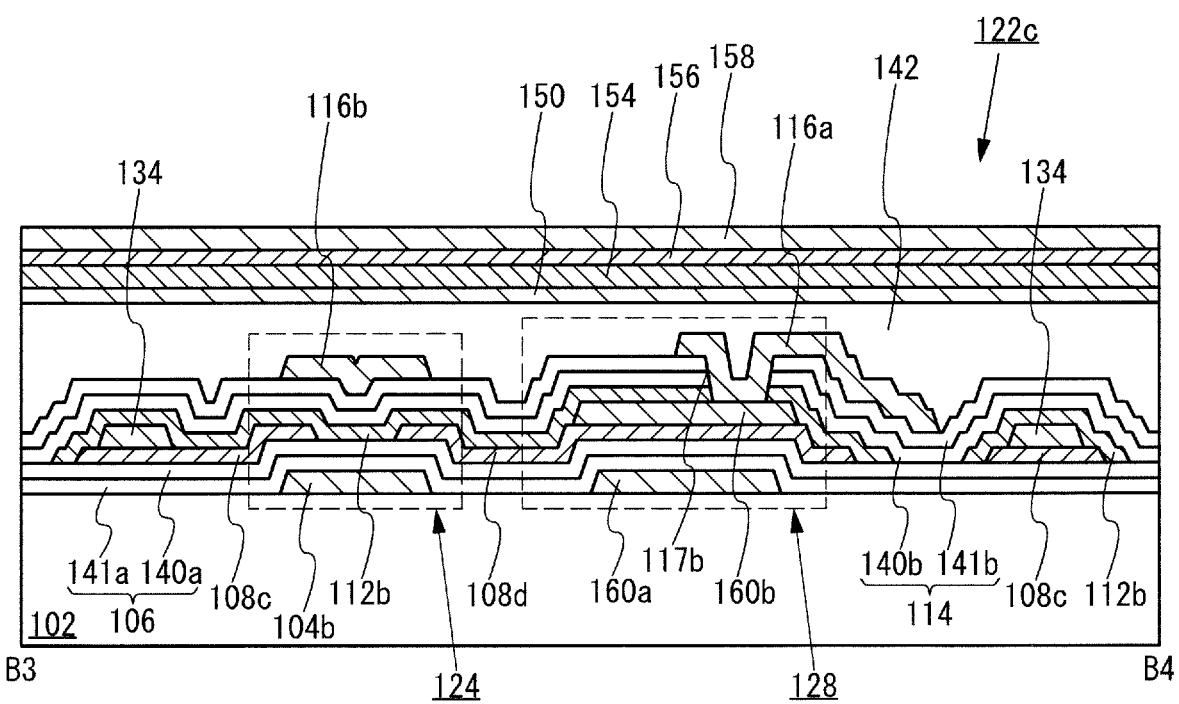
FIG. 27B is a cross-sectional view showing the method for producing the display device in an embodiment according to the present invention, taken along line B3-B4 in FIG. 26.

FIG. 26 shows an example of planar structure of a pixel 122c in this embodiment. FIG. 27A shows a cross-sectional structure taken along line A3-A4 in FIG. 26, and FIG. 27B shows a cross-sectional structure taken along line B3-B4 in FIG. 26. FIG. 27A shows the cross-sectional structure of the driving transistor 126 and the organic EL element 130. FIG. 27B shows the cross-sectional structure of the selection transistor 124 and the capacitance element 128. The following description will be made with reference to FIG. 26, FIG. 27A and FIG. 27B when necessary. The plan view of the pixel 122c shown in FIG. 26 omits the organic EL element 130.

As shown in FIG. 26 and FIG. 27A, the electron transfer layer 148 is in contact with a top surface of the oxide semiconductor layer 112a, and is individually provided for each of the pixels 122c. Therefore, as shown in FIG. 27B, the electron transfer layer 148 is not provided in a region where the selection transistor 124 is provided.

The electron transfer layer 148 is formed of an oxide semiconductor, like the oxide semiconductor layer 112a. In this case, the oxide semiconductor material used for the electron transfer layer 148 and the oxide semiconductor material used for the oxide semiconductor layer 112a are made different from each other, so that the electron transfer layer 148 is selectively processed on the oxide semiconductor layer 112a. Specifically, the electron transfer layer 148 is formed of an oxide semiconductor that is etched faster than the oxide semiconductor for the oxide semiconductor layer 112a, so that the electron transfer layer 148 is selectively processed.

It is preferable that the electron transfer layer 148 is formed of, for example, a zinc (Zn)-based oxide semiconductor not containing tin (Sn) (e.g., $ZnSiO_x$, $ZnMgO_x$, $ZnGaO_x$, etc.) and the oxide semiconductor layer 112a is formed of, for example, a tin (Sn)-based oxide semiconductor not containing zinc (Zn), magnesium (Mg) or the like (e.g., $InGaSnO_x$, $InWSnO_x$, $InSiSnO_x$, etc.). In other words, it is preferable that the electron transfer layer 148 contains zinc oxide and at least one selected from silicon oxide, magnesium oxide and gallium oxide, and that the oxide semiconductor layer 112a contains tin oxide, indium oxide, and at least one selected from gallium oxide, tungsten oxide and silicon oxide. With such an arrangement, the etching rate on the oxide semiconductor used for the electron transfer layer 148 is made different from the etching rate on the oxide semiconductor used for the oxide semiconductor layer 112a, and thus the selection ratio is made high. Specifically, the etching rate on the electron transfer layer 148 is made higher than that on the oxide semiconductor layer 112a. The bandgap relationship between the electron transfer layer 148 and the oxide semiconductor layer 112a is made optimal. Specifically, the bandgap of the electron transfer layer 148 is made larger than that of the oxide semiconductor layer 112a. For example, in the case where the bandgap of the oxide semiconductor layer 112a is 3.0 eV or greater, the bandgap of the electron transfer layer 148 is preferably greater than, or equal to, the bandgap of the oxide semiconductor layer 112a, and more preferably 3.4 eV or greater. In the case where the bandgap of the electron transfer layer 148 is 3.4 eV or greater, blue light is not absorbed and thus the reliability is improved.

Before the flattening layer 142 is formed, the electron transfer layer 148 is formed by patterning performed by a lithography step and an etching step. Thus, the electron transfer layer 148 is formed by microscopic processing. Since the electron transfer layer 148 is individually provided for each pixel, the level of leak current flowing between adjacent pixels is decreased to suppress the generation of crosstalk like in embodiment 4.

5-2. Pixel Structure 2

Figure 28A:
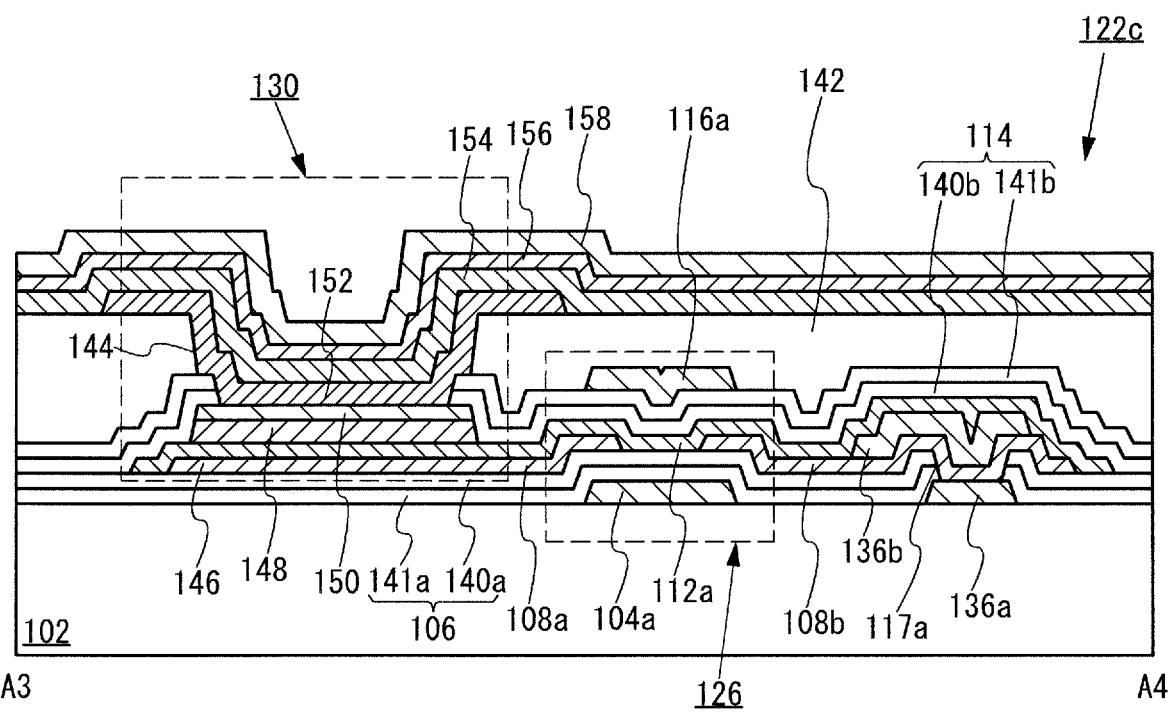
FIG. 28A is a cross-sectional view showing a method for producing a display device in an embodiment according to the present invention, taken along line A3-A4 in FIG. 26.
Figure 28B:
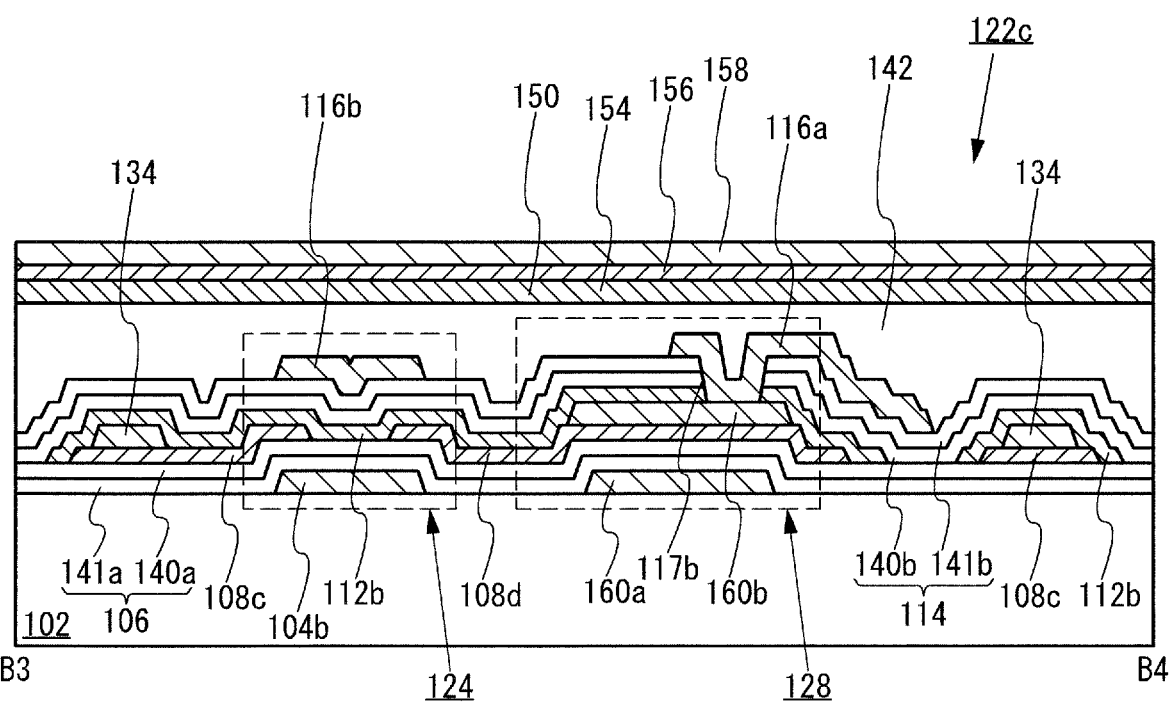
FIG. 28B is a cross-sectional view showing the method for producing the display device in an embodiment according to the present invention, taken along line B3-B4 in FIG. 26.

The two layers of the electron transfer layer 148 and the electron injection layer 150 may be individually formed, for each of the pixels 122c, on the oxide semiconductor layer 112a. FIG. 28A and FIG. 28B show the structure of the pixel 122c in such a case. FIG. 28A shows a cross-sectional structure taken long line A3-A4 in the plan view of FIG. 26, and FIG. 28B shows a cross-sectional structure taken long line B3-B4 in the plan view of FIG. 26.

As shown in FIG. 28A, the electron transfer layer 148 and the electron injection layer 150 are individually provided, for each pixel 122c, on the oxide semiconductor layer 112a. Therefore, as FIG. 28B, neither the electron transfer layer 148 nor the electron transfer layer 148 and the electron injection layer 150 is provided in a region where the selection transistor 124 is provided. In this manner, the electron transfer layer 148 and the electron injection layer 150 are individually provided for the organic EL element in each pixel, so that the level of leak current flowing between adjacent pixels is decreased to suppress the generation of crosstalk.

5-3-1. Production Method 1

A method for producing the display device in this embodiment will be described with reference to the drawings. In the following description, mainly differences from embodiment 2 will be described.

Figure 29:
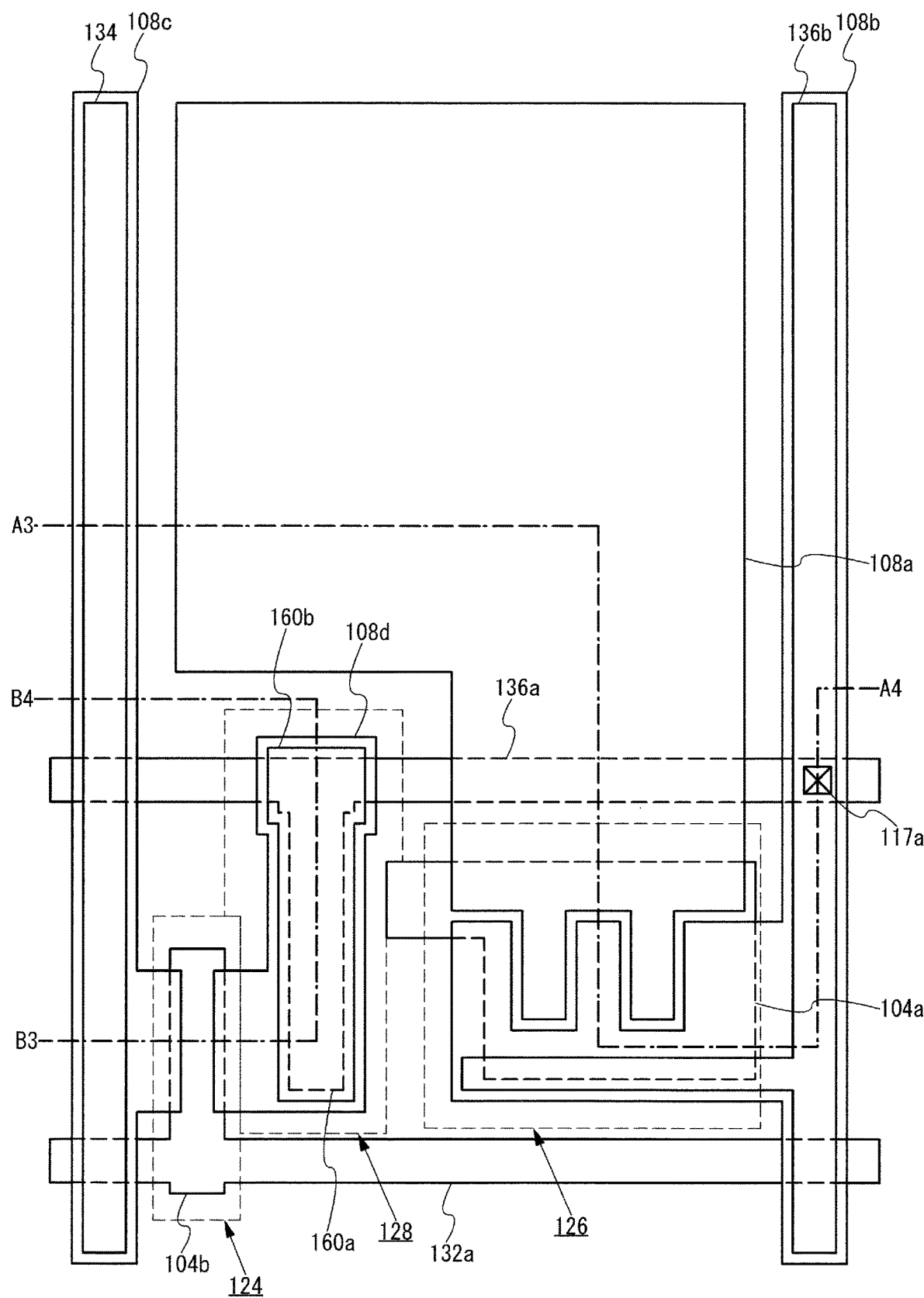
FIG. 29 is a plan view showing a method for producing the display device in an embodiment according to the present invention.
Figure 30A:
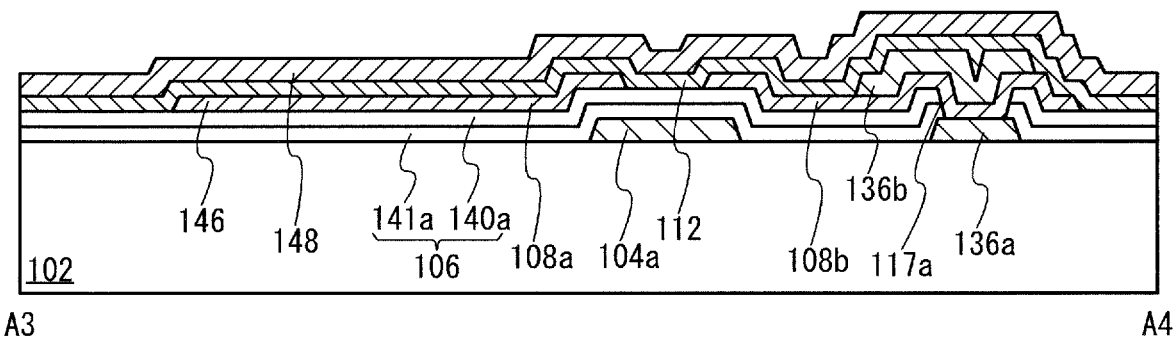
FIG. 30A is a cross-sectional view showing the method for producing the display device in an embodiment according to the present invention, taken along line A3-A4 in FIG. 29.
Figure 30B:
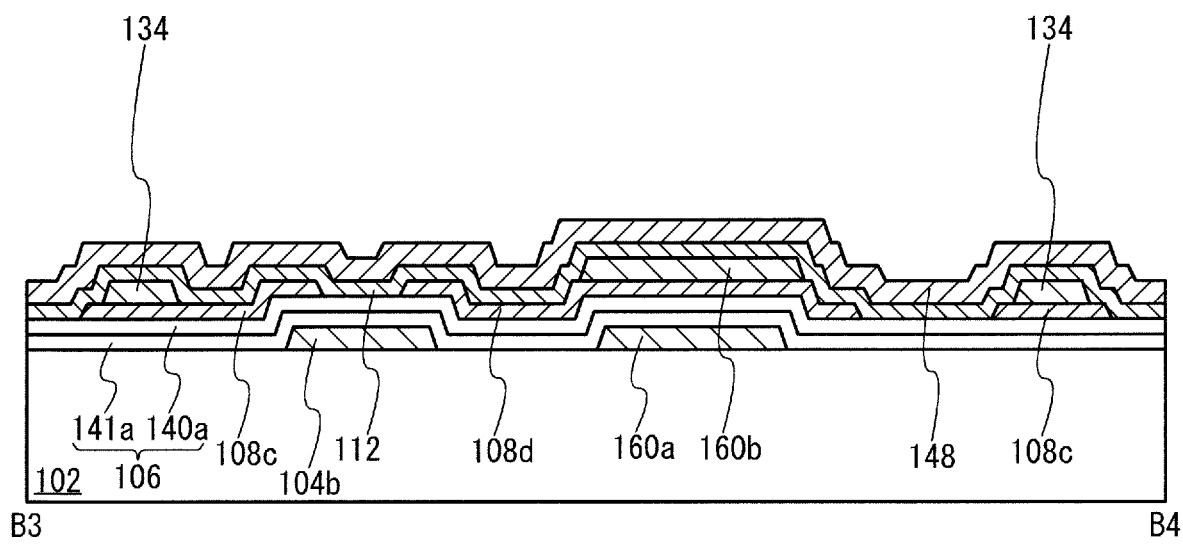
FIG. 30B is a cross-sectional view showing the method for producing the display device in an embodiment according to the present invention, taken along line B3-B4 in FIG. 29.

FIG. 29, FIG. 30A and FIG. 30B show a stage where the gate electrodes 104 (the first gate electrode 104a and the second gate electrode 104b), the first insulating layer 106, the transparent conductive layers 108 (the first transparent conductive layer 108a through the fourth transparent conductive layer 108d), the data signal line 134, the first common line 136a, and the second common line 136b are formed on the substrate 102, and a layer to become the oxide semiconductor layer 112 and a layer to become the electron transfer layer 148 are formed on substantially the entire surface of the substrate 102. FIG. 29 is a plan view on this stage (the first insulating layer 106, the layer to become the oxide semiconductor layer 112 and the layer to become the electron transfer layer 148 formed on substantially the entire surface of the substrate 102 are omitted). FIG. 30A shows a cross-sectional structure taken along line A3-A4 in FIG. 29, and FIG. 30B shows a cross-sectional structure taken along line B3-B4 in FIG. 29.

The layer to become the oxide semiconductor layer 112 and the layer to become the electron transfer layer 148 are formed of a metal oxide material, and thus may be continuously formed by use of a sputtering device. In this case, as described above, it is preferable that the layer to become the oxide semiconductor layer 112 and the layer to become the electron transfer layer 148 are formed of different metal oxide materials (in other words, different oxide semiconductor materials).

Figure 31A:
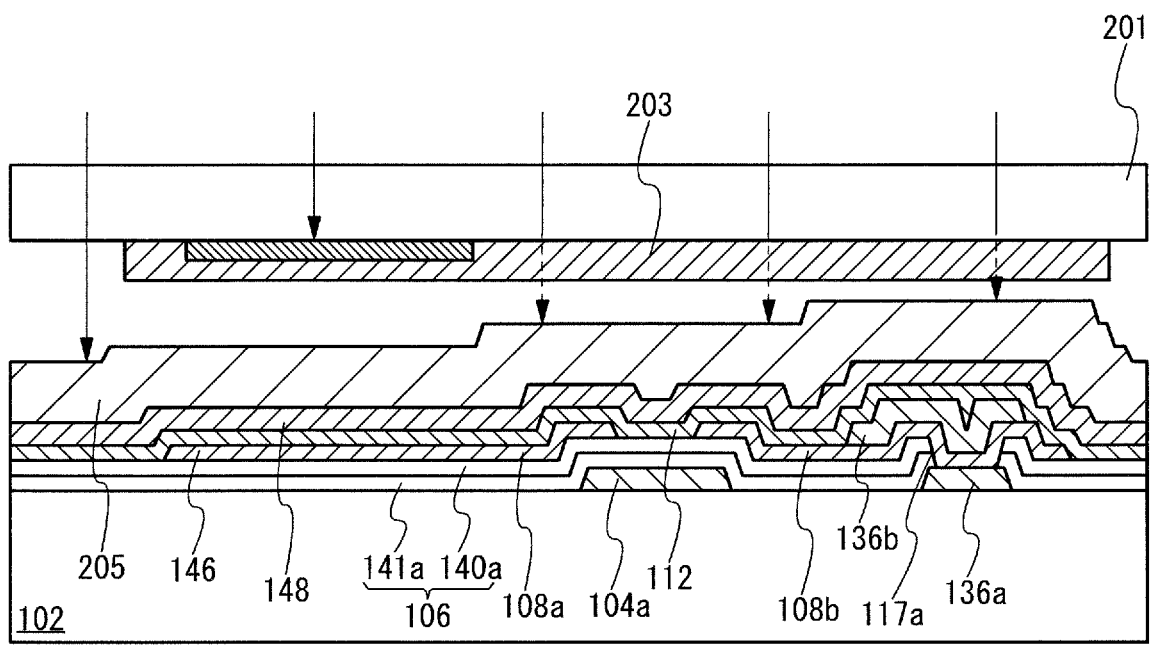
FIG. 31A is a cross-sectional view showing the method for producing the display device in an embodiment according to the present invention, taken along line A3-A4 in FIG. 29.
Figure 31B:
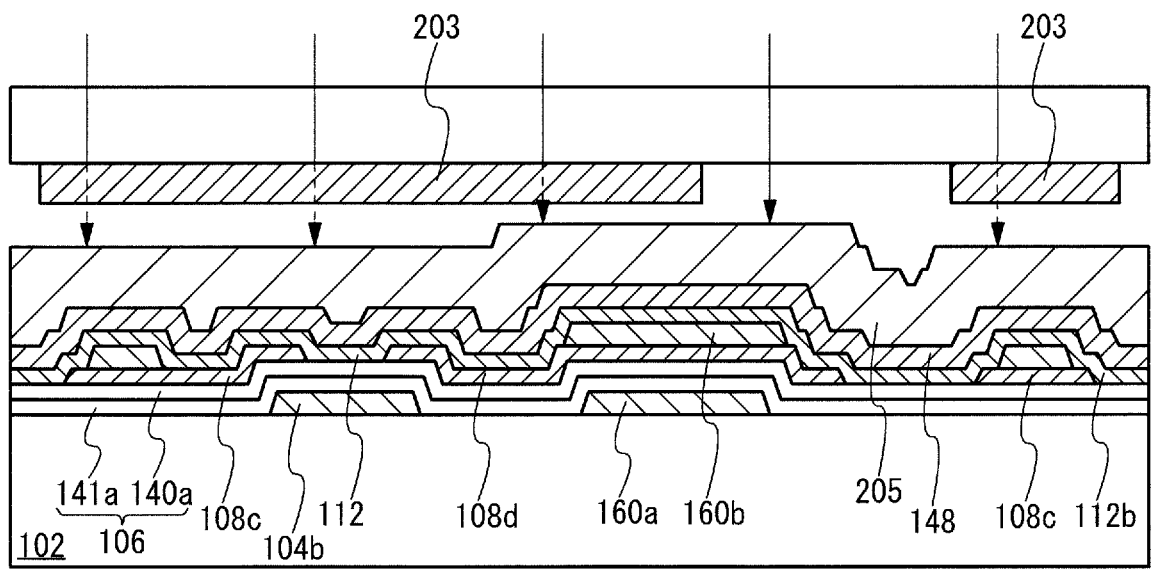
FIG. 31B is a cross-sectional view showing the method for producing the display device in an embodiment according to the present invention, taken along line B3-B4 in FIG. 29.

FIG. 31A and FIG. 31B show a stage of forming a photoresist film 205 on the layer to become the oxide semiconductor layer 112 and the layer to become the electron transfer layer 148 and exposing the photoresist film 205 by use of a photomask. As the photomask, the multi-gradation photomask 201 having the multi-gradation pattern 203 is used like in embodiment 1. In this case, a middle exposed portion of the multi-gradation photomask 201 corresponds to the oxide semiconductor layer 112, and the non-exposed portion of the multi-gradation photomask 201 corresponds to the electron transfer layer 148.

Figure 32A:
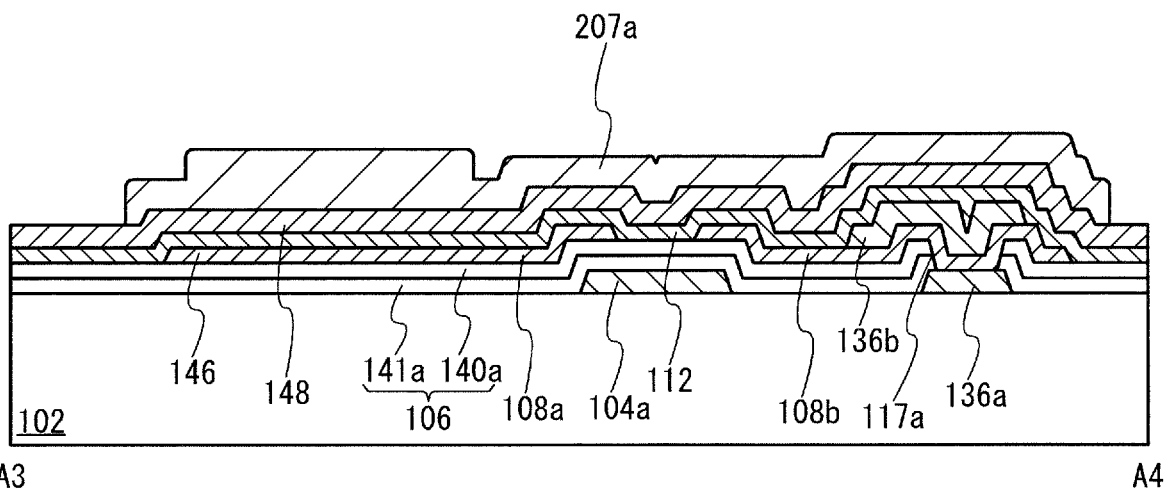
FIG. 32A is a cross-sectional view showing the method for producing the display device in an embodiment according to the present invention, taken along line A3-A4 in FIG. 29.
Figure 32B:
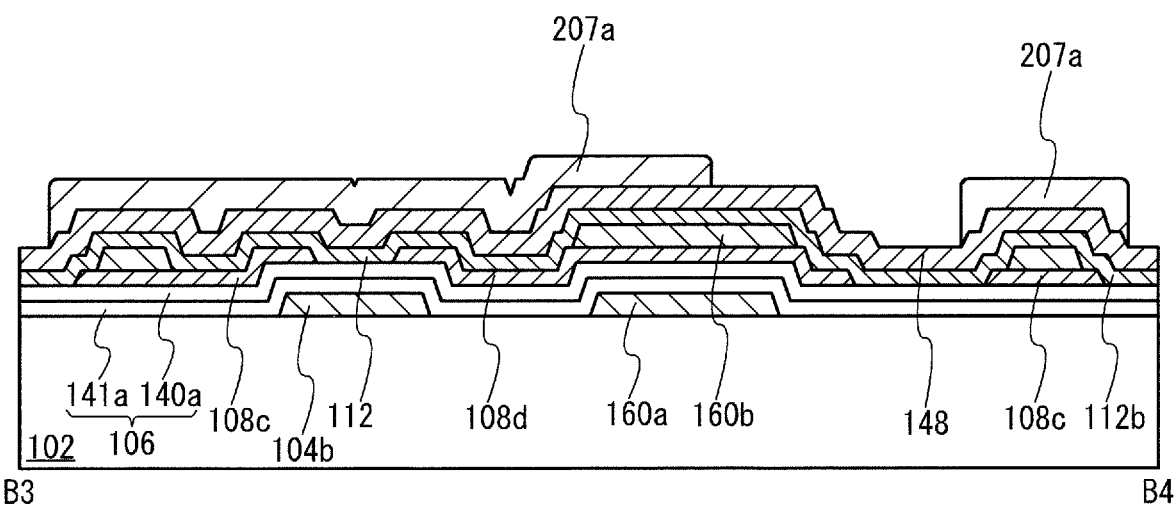
FIG. 32B is a cross-sectional view showing the method for producing the display device in an embodiment according to the present invention, taken along line B3-B4 in FIG. 29.

Then, the photoresist mask 205 is developed to form a resist mask 207a as shown in FIG. 32A and FIG. 32B. The resist mask 207a has portions of different thicknesses. FIG. 32A shows a state where the resist mask 207a is thicker in a portion corresponding to a region where the electron transfer layer 148 is to be formed, and is thinner in a portion corresponding to a region where the first oxide semiconductor layer 112a and the second oxide semiconductor layer 112b are to be formed.

Figure 33A:
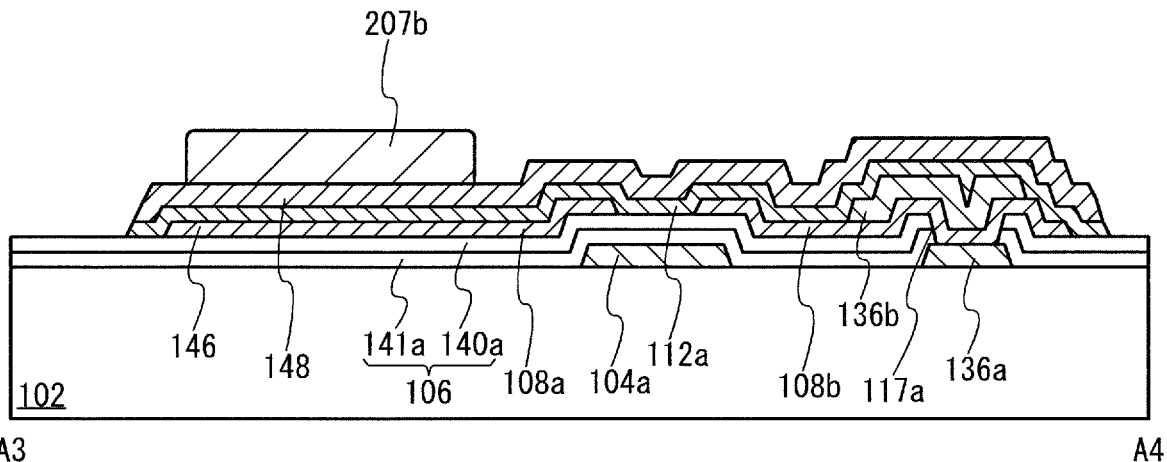
FIG. 33A is a cross-sectional view showing the method for producing the display device in an embodiment according to the present invention, taken along line A3-A4 in FIG. 29.
Figure 33B:
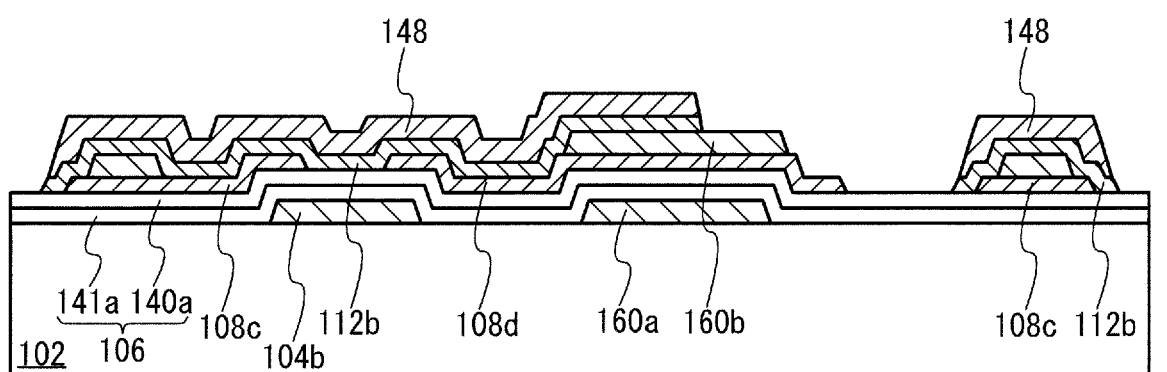
FIG. 33B is a cross-sectional view showing the method for producing the display device in an embodiment according to the present invention, taken along line B3-B4 in FIG. 29.

The layer to become the electron transfer layer 148 and the layer to become the oxide semiconductor layer 112 are etched by use of the resist mask 207a. On this stage, the first oxide semiconductor layer 112a and the second oxide semiconductor layer 112b are formed. The layer to become the electron transfer layer 148 remains in substantially the same pattern as that of the first oxide semiconductor layer 112a and the second oxide semiconductor layer 112b. After the etching, an ashing process is performed to remove the thinner portion of the resist mask 207a and thus to expose a surface of the layer to become the electron transfer layer 148. FIG. 33A and FIG. 33B show the resist mask 207a after the ashing process. As shown in FIG. 33A, the resist mask 207a remains while covering a part of the layer to become the electron transfer layer 148.

Figure 34:
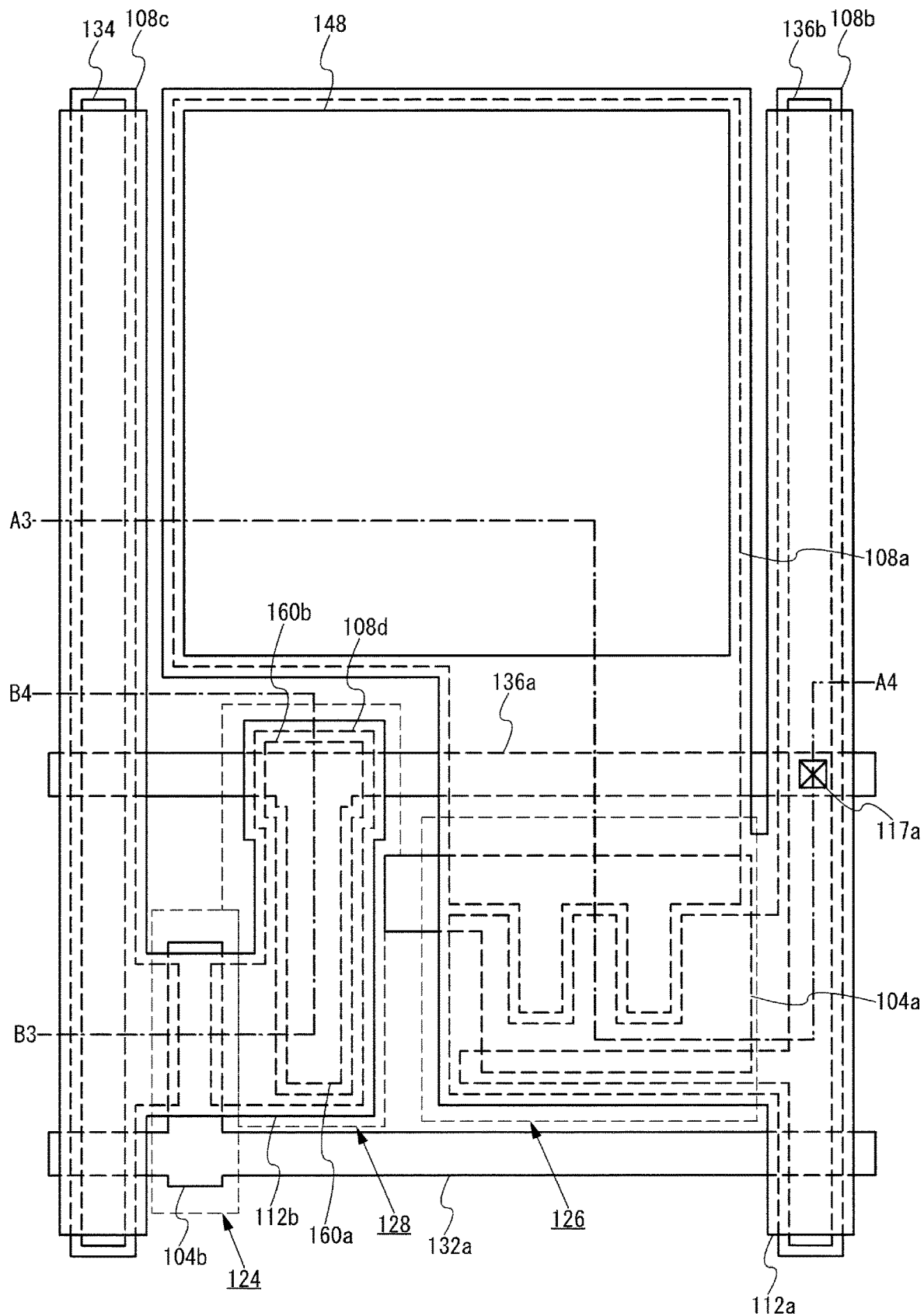
FIG. 34 is a plan view showing the method for producing the display device in an embodiment according to the present invention.
Figure 35A:
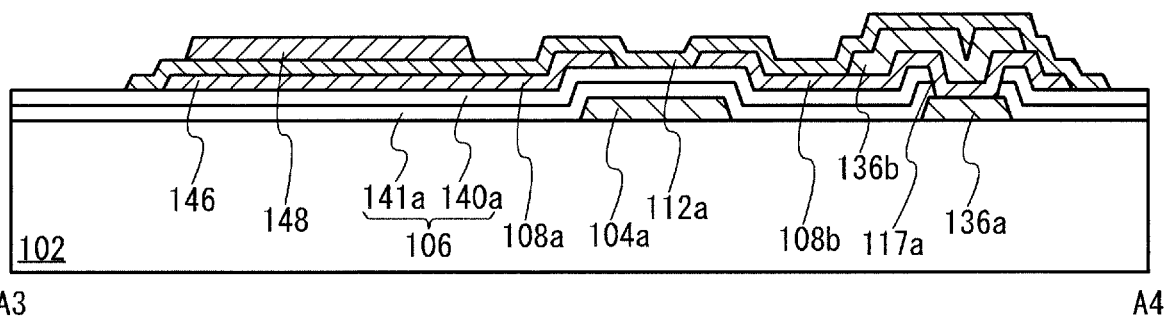
FIG. 35A is a cross-sectional view showing the method for producing the display device in an embodiment according to the present invention, taken along line A3-A4 in FIG. 34.
Figure 35B:
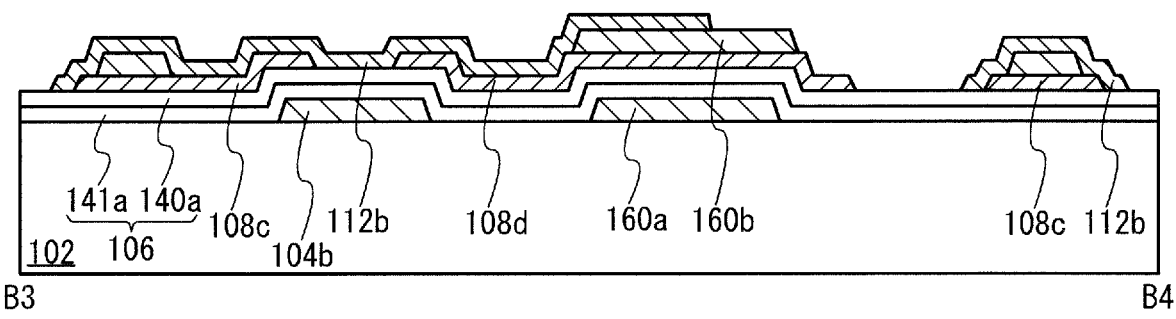
FIG. 35B is a cross-sectional view showing the method for producing the display device in an embodiment according to the present invention, taken along line B3-B4 in FIG. 34.

Then, the exposed portion of the layer to become the electron transfer layer 148 is etched. As shown in FIG. 34 (plan view) and FIG. 35A and FIG. 35B (cross-sectional views), the electron transfer layer 148 is selectively formed on the first oxide semiconductor layer 112a as a result of the etching. As described above, the electron transfer layer 148 is formed of a material having a higher etching rate than that of the material of the first oxide semiconductor layer 112a. With such an arrangement, the electron transfer layer 148 is formed on the first oxide semiconductor layer 112a while the first oxide semiconductor layer 112a and the second oxide semiconductor layer 112b remain without being etched away. After the electron transfer layer 148 is formed by etching, the resist mask 207a is removed by an ashing process.

Figure 36A:
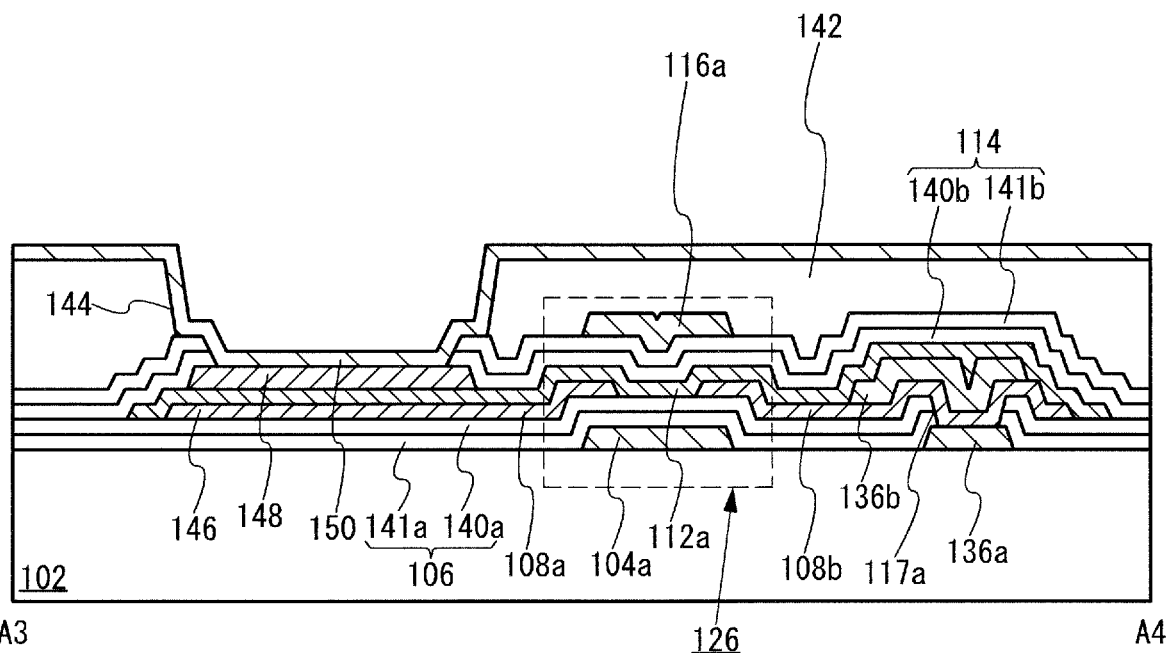
FIG. 36A is a cross-sectional view showing the method for producing the display device in an embodiment according to the present invention, taken along line A3-A4 in FIG. 34.
Figure 36B:
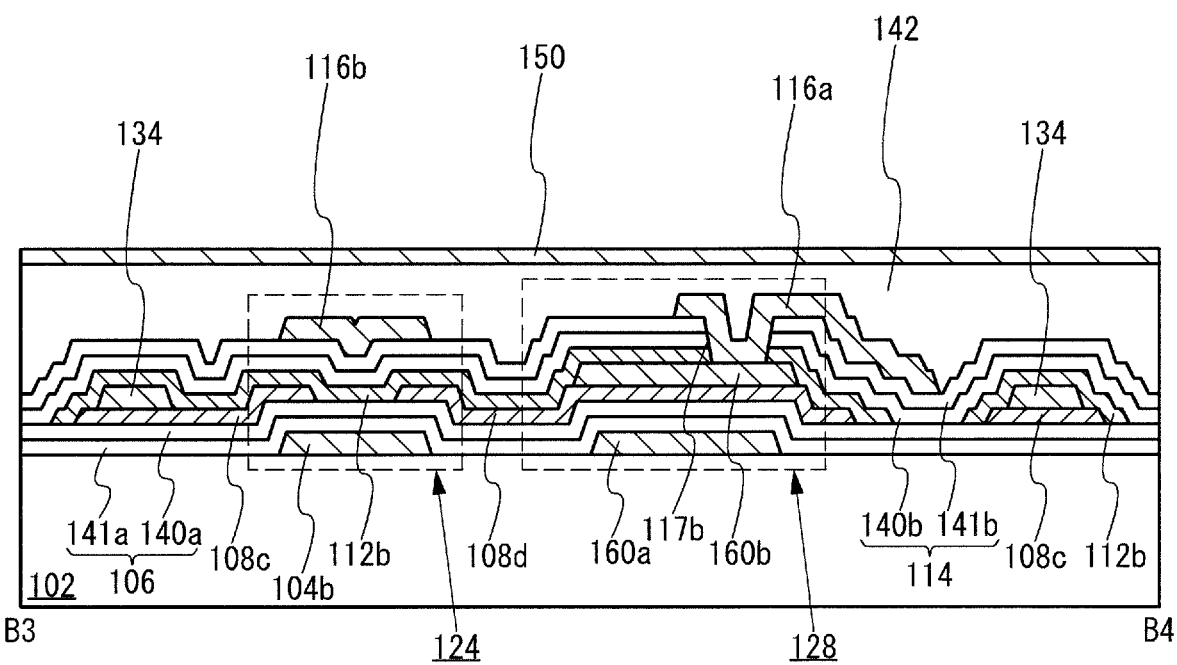
FIG. 36B is a cross-sectional view showing the method for producing the display device in an embodiment according to the present invention, taken along line B3-B4 in FIG. 34.

Then, as shown in FIG. 36A and FIG. 36B, the second insulating layer 114, the second gate electrodes 116a and 116b, and the flattening layer 142 are formed. In the flattening layer 142, the opening 144 is formed, and the electron injection layer 150 is formed. As shown in FIG. 36A and FIG. 36B, the electron injection layer 150 is formed on the top surface of the flattening layer 150 and in the opening 144 and is in contact with the electron transfer layer 148.

After this, the light emitting layer 152, the hole transfer layer 154, the hole injection layer 156 and the anode electrode 158 are formed. As a result, the pixel 122c of the display device shown in FIG. 26, FIG. 27A and FIG. 27B is formed.

In this embodiment, the multi-gradation photomask is used to form the electron transfer layer 148 on the first oxide semiconductor layer 112a without increasing the number of photomasks. The positions of the oxide semiconductor layer 112a and the electron transfer layer 148 are determined by one photomask, and thus the oxide semiconductor layer 112a and the electron transfer layer 148 are both formed with high precision even in the case where the pixels are microscopic. Also in this embodiment, the number of photomasks and the number of photolithography steps do not need to be increased, and thus the production cost is suppressed from increasing.

5-3-2. Production Method 2

Figure 37A:
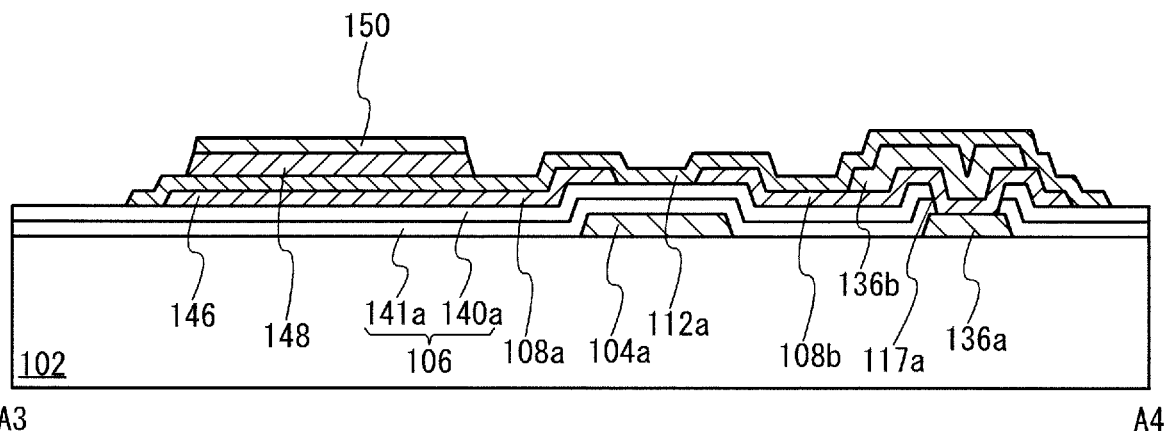
FIG. 37A is a cross-sectional view showing a method for producing a display device in an embodiment according to the present invention, taken along line A3-A4 in FIG. 34.
Figure 37B:
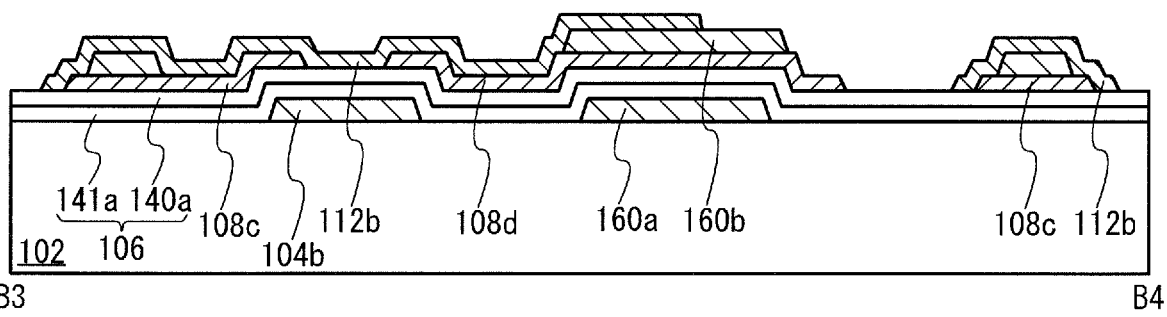
FIG. 37B is a cross-sectional view showing the method for producing the display device in an embodiment according to the present invention, taken along line B3-B4 in FIG. 34.

On the stage shown in FIG. 30A and FIG. 30B, the electron injection layer 150 may be stacked on the electron transfer layer 148 and the method described in 5-3-1 may be performed. Specifically, the multi-gradation photomask may be used to form the electron transfer layer 148 and the electron injection layer 150 by etching. As a result, as shown in FIG. 37A and FIG. 37B, the electron transfer layer 148 and the electron injection layer 150 may be selectively formed on the first oxide semiconductor layer 112a.

Then, the flattening layer 142 is formed, and the opening 144 is formed in the flattening layer 142. The light emitting layer 152, the hole transfer layer 154, the hole injection layer 156 and the anode electrode 158 are formed. As a result, the pixel 122c shown in FIG. 28A and FIG. 28B is formed.

In this embodiment, like in the case described in 5-3-1, the multi-gradation photomask is used to provide the electron transfer layer 148 and the electron injection layer 150 on the first oxide semiconductor layer 112a without increasing the number of photomasks.

Embodiment 6

In embodiment 6, an example of pixel of a display device of a so-called top emission type, in which light from the organic EL element 130 is output in a direction opposite to the substrate 102, will be described. In the following description, differences from embodiment 2 will be described.

Figure 38:
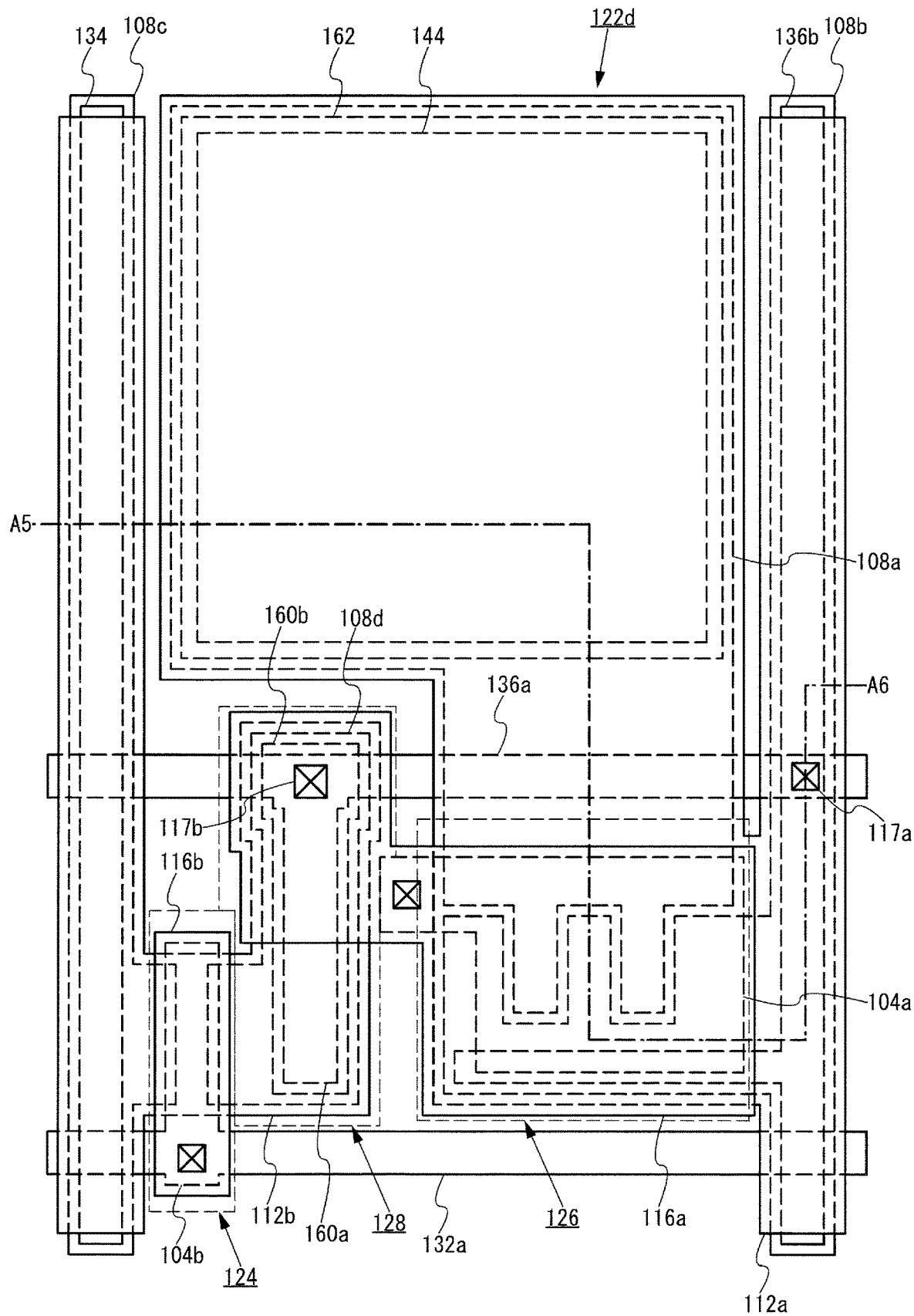
FIG. 38 is a plan view showing a structure of a pixel in a display device in an embodiment according to the present invention.
Figure 39:
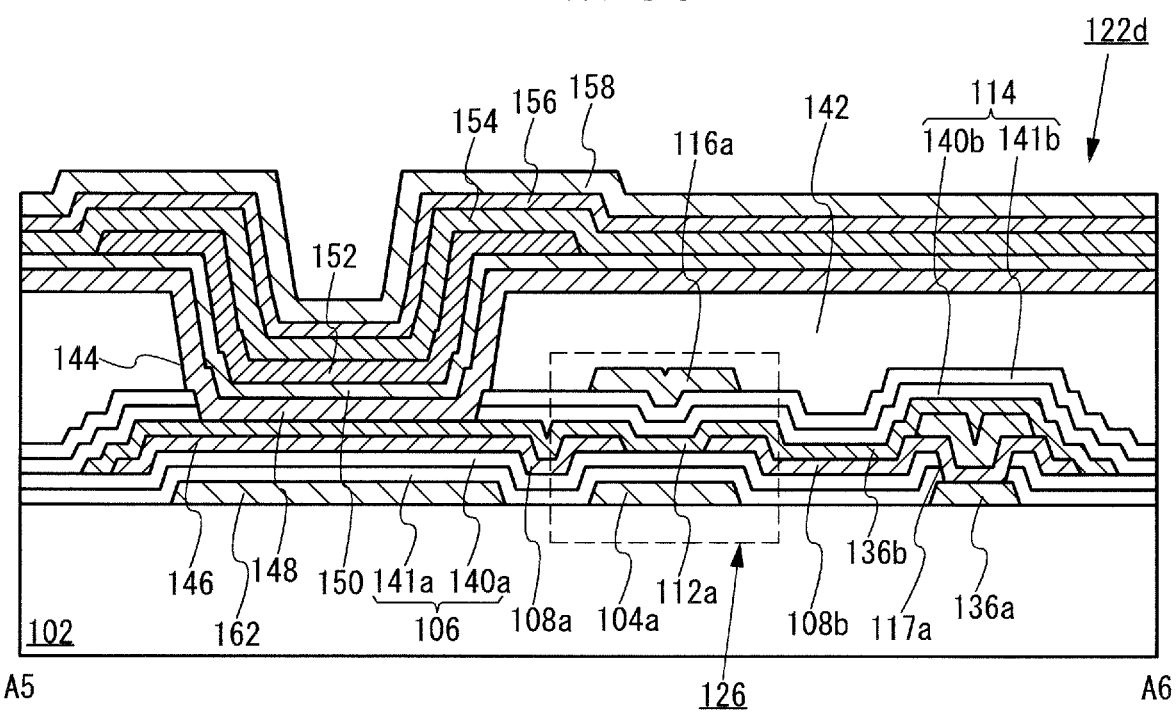
FIG. 39 is a cross-sectional view showing the structure of the pixel in the display device in an embodiment according to the present invention, taken along line A5-A6 in FIG. 38.

FIG. 38 is a plan view of a pixel 122*d* of a display device 120 in this embodiment. FIG. 39 shows a cross-sectional structure taken along line A5-A6 in FIG. 38. The selection transistor 124, the driving transistor 126, the capacitance element 128 and the organic EL element 130 in the pixel 122*d* each have substantially the same structure as that in embodiment 2.

The pixel 122*d* includes a reflective layer 162 in a region overlapping the first electrode 146, which is a cathode electrode. The reflective layer 162 is provided below the first electrode 146 with the first insulating layer 106 being located between the reflective layer 162 and the first electrode 146. The reflective layer 162 is formed in, for example, the same layer as that of the first gate electrode 104. Namely, the reflective layer 162 is formed of the first conductive layer 103 described in embodiment 2. The second electrode 158, which is an anode electrode, is formed of a transparent conductive material such as indium tin oxide, indium zinc oxide or the like.

In this embodiment, the first electrode 146, which is the cathode electrode, is formed of a transparent conductive material. Light emitted by the light emitting layer 152, except for a component thereof propagating in the organic EL element 130 as wave guide light, radiates at least toward the first electrode 146, which is the cathode electrode, and toward the second electrode 158, which is the anode electrode. The light directed from the light emitting layer 152 toward the first electrode 146, which is the cathode electrode, is transmitted through the first electrode 146, which is the cathode electrode, and the first insulating layer 106, and is reflected by the reflective layer 162. The light reflected by the reflective layer 162 is partially output from the second electrode 158, which is the anode electrode. In order to increase the intensity of the output light, it is preferable that the reflective layer 162 includes a metal film of a material having a high reflectance such as aluminum (Al), silver (Ag) or the like at a surface thereof facing the first electrode 146, which is the cathode electrode.

In FIG. 38 and FIG. 39, an end of the reflective layer 162 is located inner to an end of the first electrode 146, which is the cathode electrode. This embodiment is not limited to this. The reflective layer 162 is provided below the first electrode 146 with the first insulating layer 106 being located between the reflective layer 162 and the first electrode 146. Therefore, the reflective layer 162 may be wider than the first electrode 146, which is the cathode electrode. The reflective layer 162 may be provided to be continuous throughout the plurality of pixels 122*d*, unless the reflective layer 162 is in contact with the first gate electrode 104 or the gate signal line 132.

As described above, in this embodiment, the reflective layer 162 is provided below the first electrode 146, which is the cathode electrode, and thus the display device 120 including the pixel 122*d* of a top emission type is realized. In this case, the reflective layer 162 may be formed of the same conductive film as that of the first gate electrode 104. Therefore, the number of the steps of the production process is not increased.

Embodiment 7

Figure 40:
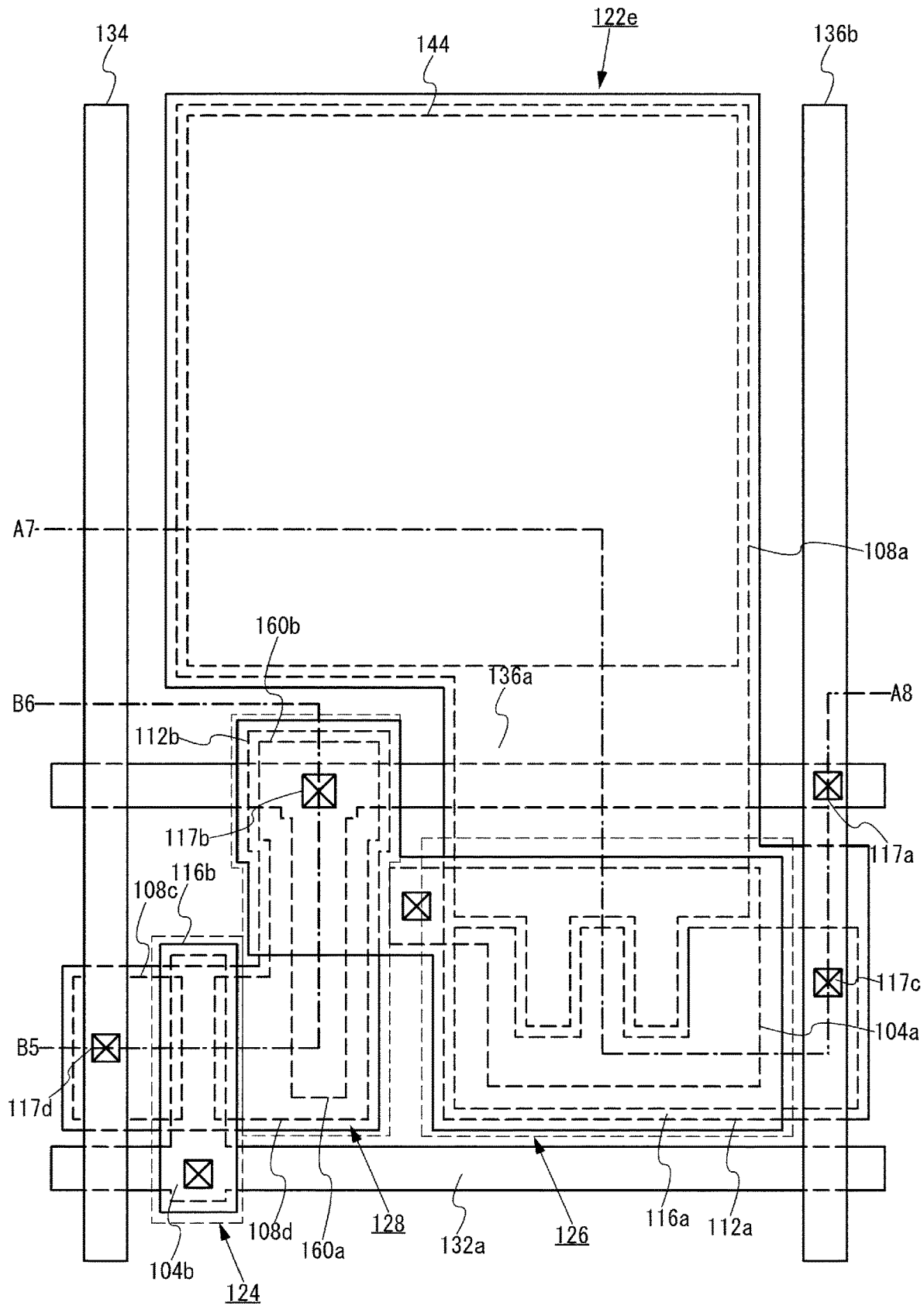
FIG. 40 is a plan view showing a structure of a pixel in a display device in an embodiment according to the present invention.
Figure 41A:
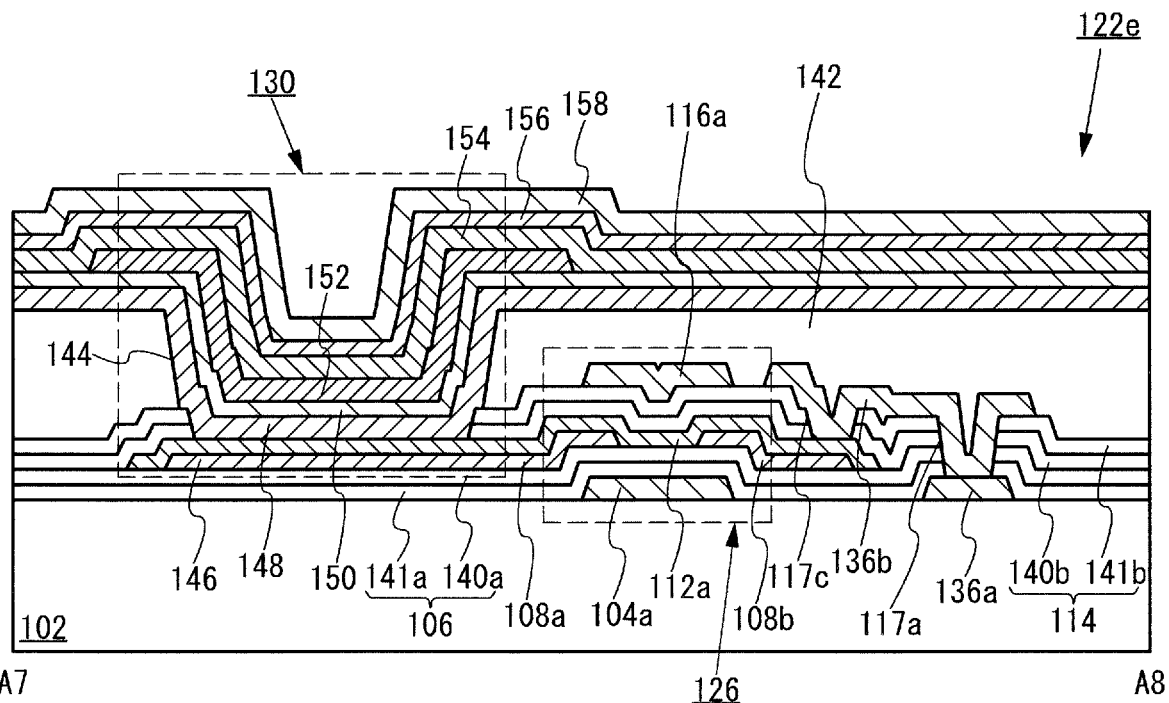
FIG. 41A is a cross-sectional view showing the structure of the pixel in the display device in an embodiment according to the present invention, taken along line A7-A8 in FIG. 40.
Figure 41B:
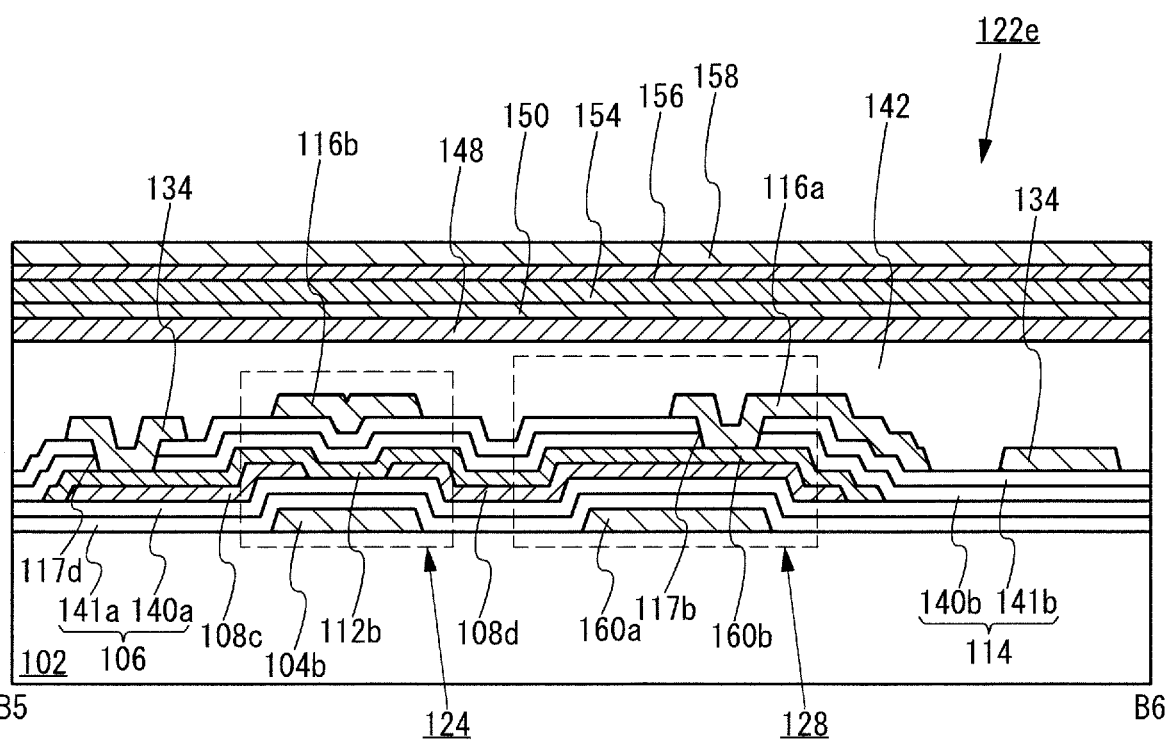
FIG. 41B is a cross-sectional view showing the structure of the pixel in the display device in an embodiment according to the present invention, taken along line B5-B6 in FIG. 40.

In embodiment 7, the pixel structure is different from that in embodiment 2. FIG. 40 is a plan view of a pixel 122*e*. FIG. 41A shows a cross-sectional structure taken along line A7-A8 in FIG. 40, and FIG. 41B shows a cross-sectional structure taken along line B5-B6 in FIG. 40. The pixel 122*e* has substantially the same equivalent circuit as that shown in FIG. 7. In the following description, differences from embodiment 2 will be described.

In the pixel 122*e*, the data signal line 134 and the second common line 136*b* are formed of the fourth conductive film 115 described in embodiment 2. Specifically, the data signal line 134 and the second common line 136*b* are provided on the second in layer 114.

The second common line 136*b* is electrically connected with the first common line 136*a* via the first contact hole 117*a* running through the first insulating layer 106 and the second insulating layer 114. The second common line 136*b* is in contact with the first oxide semiconductor layer 112*a* via a third contact hole 117*c* running through the second insulating layer 114. The second common line 136*b* is in contact with the first oxide semiconductor layer 112*a* in a region where the first transparent conductive layer 108*a* also overlaps the common line 136*b* and the first oxide semiconductor layer 112*a*. This region corresponds to the source region of the driving transistor 126. Therefore, the second common line 136*b* is electrically connected with the first common line 136*a* and the source region of the driving transistor 126.

The data signal line 134 is in contact with the second oxide semiconductor layer 112*b* in a fourth contact hole 117*d* running through the second insulating layer 114. The data signal line 134 is in contact with the second oxide semiconductor layer 112*b* in a region where the third transparent conductive layer 108*c* also overlaps the data signal line 134 and the second oxide semiconductor layer 112*b*. This region corresponds to the source or drain region of the selection transistor 124. Therefore, the data signal line 134 is electrically connected with the source or drain region of the selection transistor 124.

The capacitance element 128 is formed in a region where the first capacitance electrode 160*a* and the second capacitance electrode 160*b* overlap each other while having the first insulating layer 106 therebetween. In this embodiment, the second capacitance electrode 160*b* is formed of a portion of the fourth transparent conductive layer 108*d* and the second oxide semiconductor layer 112*a* extending from the selection transistor 124 onto the first capacitance electrode 160*a*. In this region, it is preferable that the second oxide semiconductor layer 112*b* has a low resistance so as to act as an electrode. In this region, the second oxide semiconductor layer 112*b* may be removed. The second gate electrode 116*a* is in contact with the second capacitance electrode 160*b* via the second contact hole 117*b*, and thus the driving transistor 126 and the capacitance element 128 are electrically connected with each other.

In this embodiment, the data signal line 134 and the second common line 136*b* are formed in the same conductive layer as that of the second gate electrode 116. Therefore, in the pixel 122*e*, the selection transistor 124 and the data signal line 134 are electrically connected with each other with certainty, the driving transistor 126 and the second common line 136*b* are electrically connected with each other with certainty, and the driving transistor 126 and the capacitance element 128 are electrically connected with each other with certainty.

Embodiment 8

In embodiment 8, an example of pixel of a display device of a so-called top emission type, in which light from the organic EL element 130 is output in a direction opposite to the substrate 102, will be described. In the following description, differences from embodiment 4 will be described.

Figure 42:
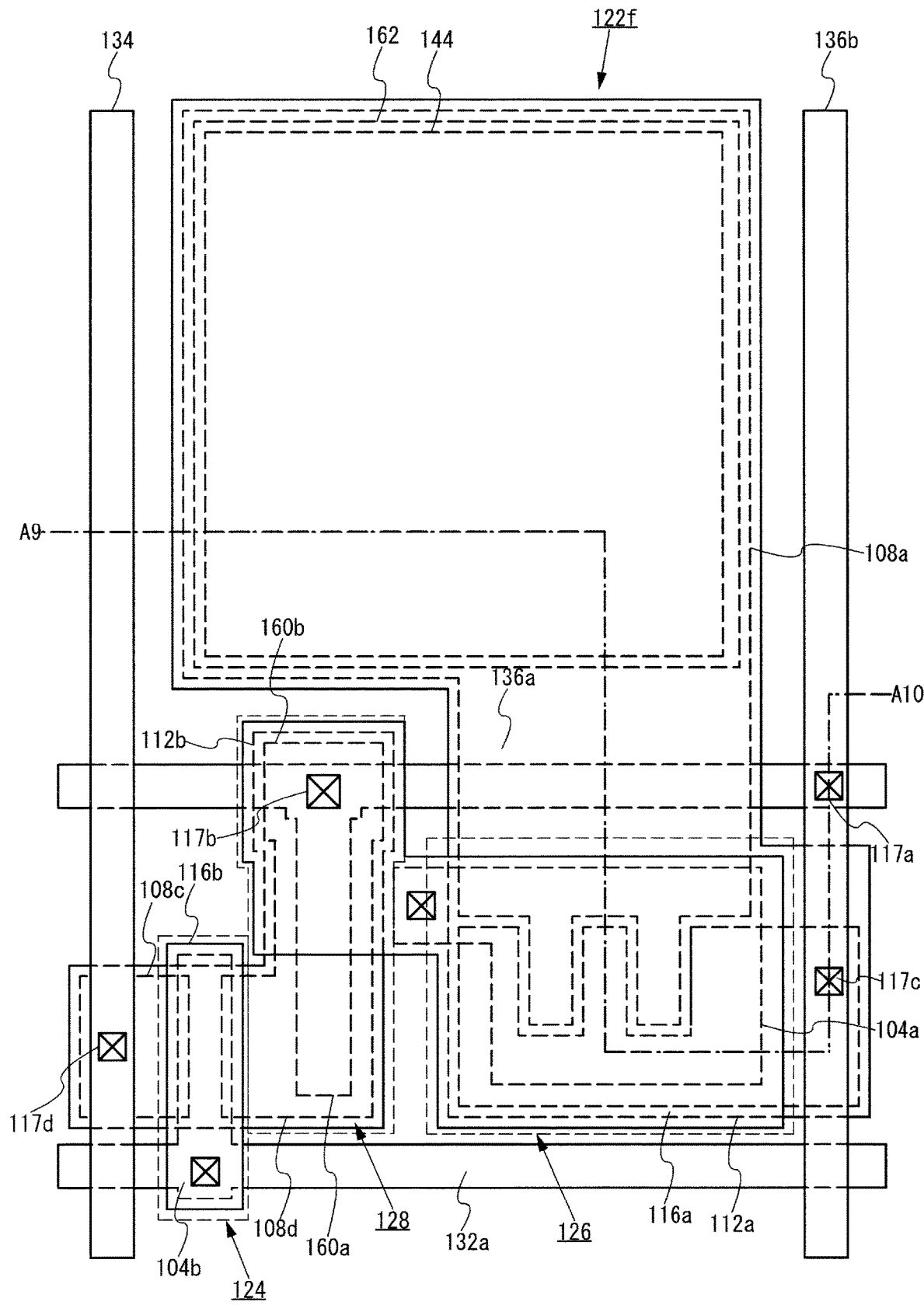
FIG. 42 is a plan view showing a structure of a pixel in a display device in an embodiment according to the present invention.
Figure 43:
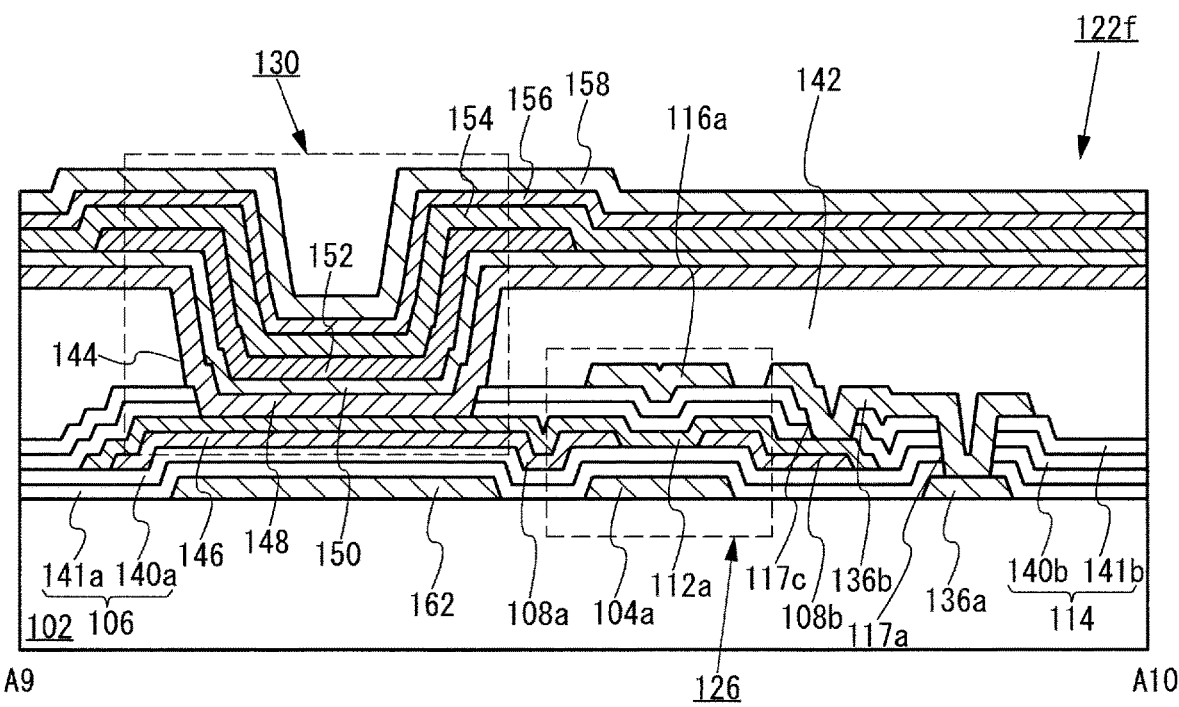
FIG. 43 is a cross-sectional view showing the structure of the pixel in the display device in an embodiment according to the present invention, taken along line A9-A10 in FIG. 42.

FIG. 42 is a plan view of a pixel 122f of a display device 120 in this embodiment. FIG. 43 shows a cross-sectional structure taken along line A9-A10 in FIG. 42. The selection transistor 124, the driving transistor 126, the capacitance element 128 and the organic EL element 130 in the pixel 122f each have substantially the same structure as that in embodiment 4.

Like in embodiment 6, the pixel 122f includes the reflective layer 162 in a region overlapping the first electrode 146, which is a cathode electrode. The reflective layer 162 is provided below the first electrode 146 with the first insulating layer 106 being located between the reflective layer 162 and the first electrode 146. The reflective layer 162 is formed in, for example, the same layer as that of the first gate electrode 104. Namely, the reflective layer 162 is formed of the first conductive layer 103 described in embodiment 2. The second electrode 158, which is an anode electrode, is formed of a transparent conductive material such as indium tin oxide, indium zinc oxide or the like.

The pixel 122f of a top emission type may have a pixel structure in which the data signal line 134 and the second common line 136b are formed in the same layer as that of the second gate electrode 116.

In FIG. 42 and FIG. 43, an end of the reflective layer 162 is located inner to an end of the first electrode 146, which is the cathode electrode. This embodiment is not limited to this. The reflective layer 162 is provided below the first electrode 146 with the first insulating layer 106 being located between the reflective layer 162 and the first electrode 146. Therefore, the reflective layer 162 may be wider than the first electrode 146, which is the cathode electrode. The reflective layer 162 may be provided to be continuous throughout the plurality of pixels 122d, unless the reflective layer 162 is in contact with the first gate electrode 104 or the gate signal line 132.

In this embodiment, the reflective layer 162 is provided below the first electrode 146, which is the cathode electrode, and thus the display device 120 including the pixel 122f of a top emission type is realized. In this case, the reflective layer 162 may be formed of the same conductive film as that of the first gate electrode 104. Therefore, the number of the steps of the production process is not increased.

Embodiment 9

Figure 44:
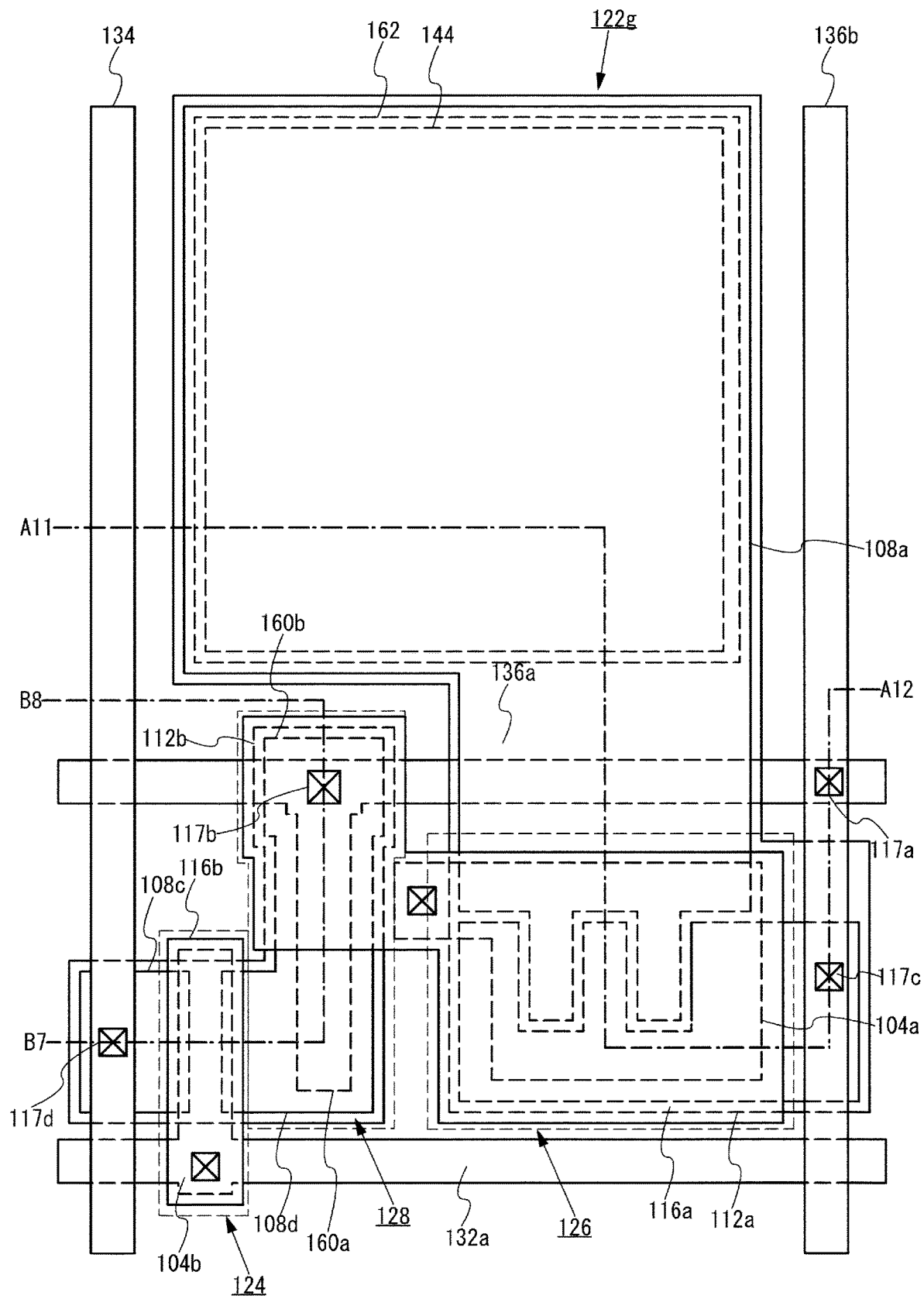
FIG. 44 is a plan view showing a structure of a pixel in a display device in an embodiment according to the present invention.
Figure 45A:
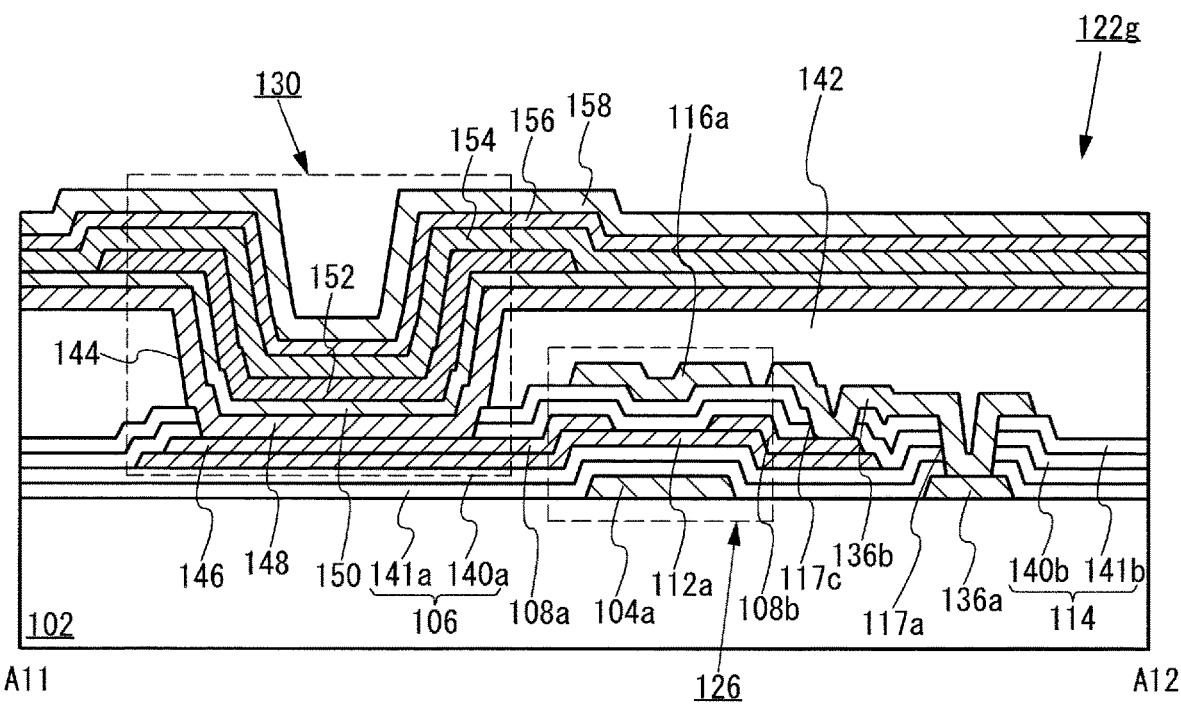
FIG. 45A is a cross-sectional view showing the structure of the pixel in the display device in an embodiment according to the present invention, taken along line A11-A12 in FIG. 44.
Figure 45B:
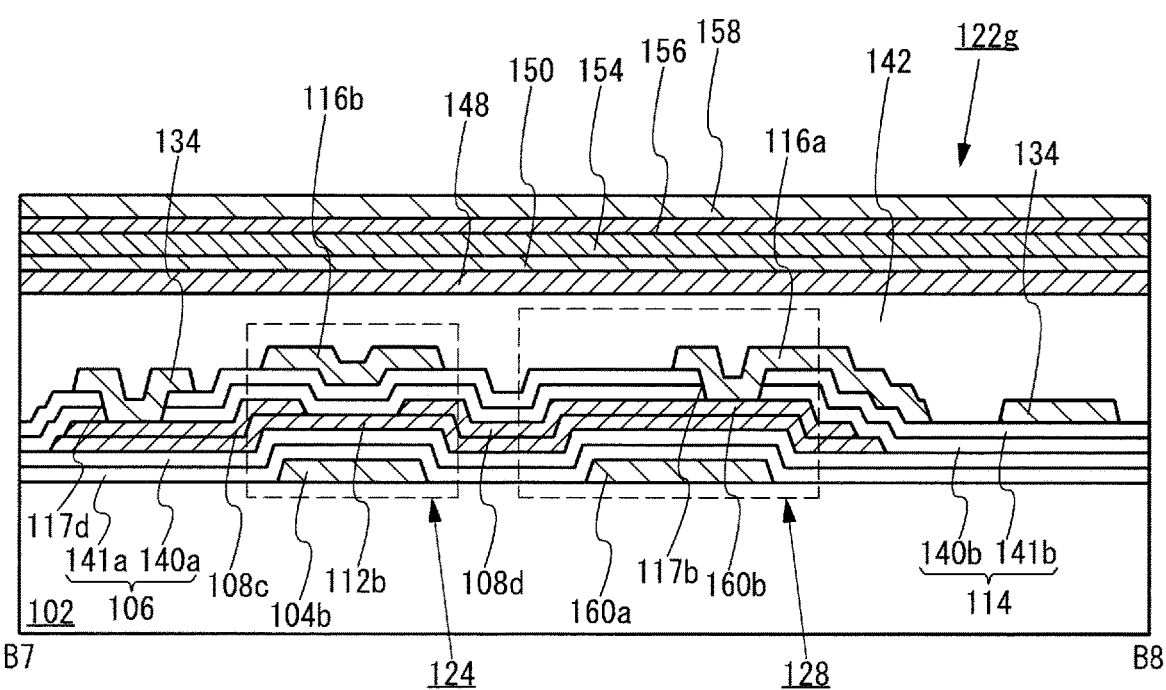
FIG. 45B is a cross-sectional view showing the structure of the pixel in the display device in an embodiment according to the present invention, taken along line B7-B8 in FIG. 44.

In embodiment 9, the pixel structure is different from that in embodiment 4. FIG. 44 is a plan view of a pixel 122g. FIG. 45A shows a cross-sectional structure taken along line A11-A12 in FIG. 44, and FIG. 45B shows a cross-sectional structure taken along line B7-Ab8 in FIG. 44. The pixel 122g has substantially the same equivalent circuit as that shown in FIG. 7. In the following description, differences from embodiment 4 will be described.

In the pixel 122g in this embodiment, the transparent conductive layer 108 and the oxide semiconductor layer 122 are stacked in an order different from that in embodiment 4. Namely, the oxide semiconductor layer 112 is provided on the first insulating layer 106, and the transparent conductive layer 108 is provided on the oxide semiconductor layer 112. Specifically, in the driving transistor 126, the first transparent conductive layer 108a and the second transparent conductive layer 108b are provided on the first oxide semiconductor layer 112a. The second transparent conductive layer 108b is extended to the region of the organic EL element 130, and acts as the first electrode 146, which is a cathode electrode, in this region. In the selection transistor 124, the third transparent conductive layer 108c and the fourth transparent conductive layer 108d are provided on the second oxide semiconductor layer 112b.

As can be seen, the transistors are realized even in the case where the order of stacking the oxide semiconductor layer 112 and the transparent conductive layer 108 is changed. In this structure, in the case where the oxide semiconductor layer 112 and the transparent conductive layer 108 have a certain level of etching rate ratio (in the case where the etching rate of the oxide semiconductor layer 112 is lower than that of the transparent conductive layer 108), the multi-gradation photomask described in embodiment 2 may be used to form the oxide semiconductor layer 112 and the transparent conductive layer 108 by processing. Thus, the number of photomasks required for the production process is decreased, and the steps of the production process is also decreased.

In this embodiment, as shown in FIG. 45A, the second common line 136b is in contact with the second transparent conductive layer 108b via the third contact hole 117c. As shown in FIG. 45B, the data signal line 134 is in contact with the third transparent conductive layer 108c via the fourth contact hole 117d. As can be seen, the data signal line 134 and the second common line 136b are in contact with the transparent conductive layer 108, and thus the contact resistance is decreased.

Embodiment 10

Figure 46:
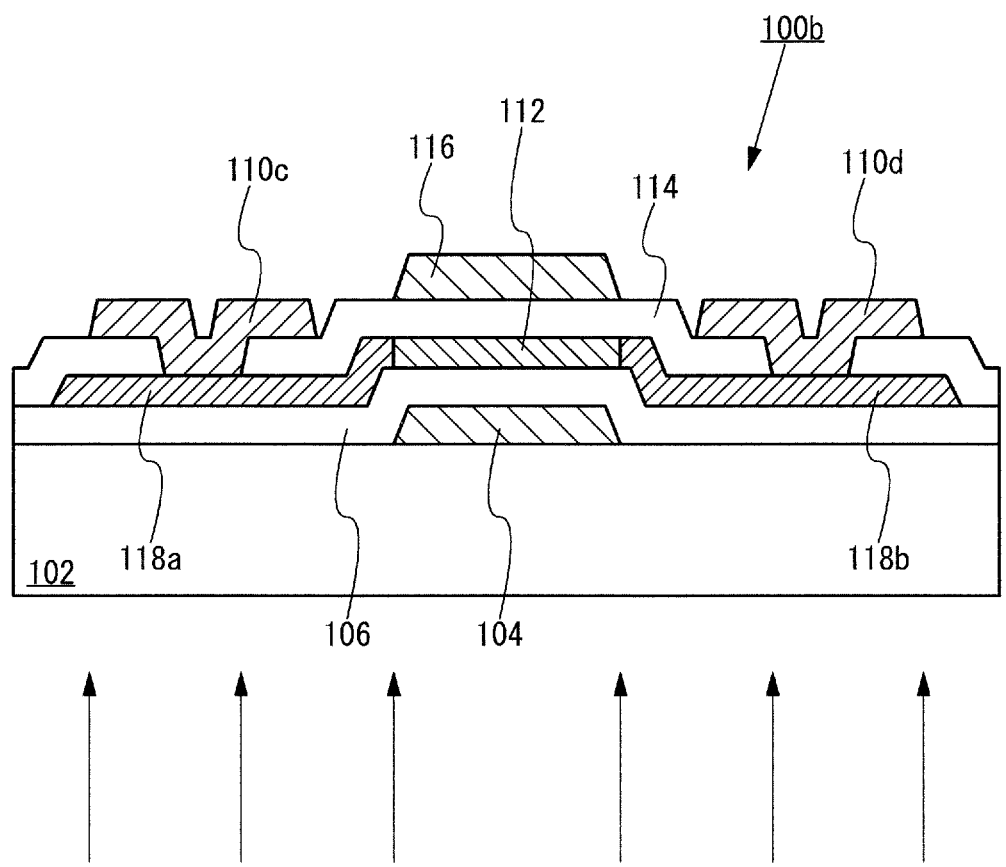
FIG. 46 is a plan view showing a method for producing a transistor in an embodiment according to the present invention, and shows a process of directing lase light to decrease a resistance of the oxide semiconductor layer.

FIG. 46 shows a stage in a method for forming a transistor 100b including the first gate electrode 104, the first insulating layer 106, the oxide semiconductor layer 112, the second insulating layer 114 and the second gate electrode 116. On the stage shown in FIG. 46, source and drain regions 118 having a lower resistance than that of a channel region is formed in the oxide semiconductor layer 112.

FIG. 46 shows a process of irradiating the oxide semiconductor layer 112 with laser light from the substrate 102 side to form the source and drain regions 118 having a resistance lower than that of the oxide semiconductor layer 112. It is preferable that the laser light used in this process has a short wavelength so as to be absorbed into the oxide semiconductor layer 112, which has a wide bandgap. It is preferable that the oxide semiconductor layer 112 is irradiated with ultraviolet laser light such as, for example, KrF excimer laser light (wavelength: 248 nm), XeCl excimer laser light (wavelength: 308 nm), XeF excimer laser light (wavelength: 351 nm) or the like.

In the case where the laser process shown in FIG. 46 is performed, the substrate 102 is required to have such a level of transparency as to transmit the ultraviolet laser light sufficiently. Therefore, it is preferable that the substrate 102 is formed of non-alkali glass or quartz. In the case where the substrate 102 has a low transmittance for light in an ultraviolet range or the substrate 102 absorbs the light in an ultraviolet range, the laser light may be directed from the oxide semiconductor layer 112 side as shown in FIG. 47, so that a low resistance region is formed.

In the case where the laser light is directed from the substrate 102 side, a region of the oxide semiconductor layer 112 that overlaps the first gate electrode 104 is not irradiated with the laser light because the laser light is blocked by the first gate electrode 104. By contrast, the regions of the oxide semiconductor layer 112 not overlapping the first gate electrode 140 are irradiated with the laser light transmitted through the substrate 102. The irradiation with the laser light rapidly raises the temperature of the oxide semiconductor layer 112. This causes oxygen deficiency, and thus a donor level is generated in the oxide semiconductor layer 112. As a result, these regions have a resistance thereof decreased.

This process may be performed in a state where a contact hole is provided in the second insulating layer 114 and a third line 110*c* and a fourth line 110*d* are provided. The regions having the resistance thereof decreased act as a source region 118*a* and a drain region 118*b* of the transistor 110*b*.

In the laser process shown in FIG. 46 performed to form the transistor 110*b*, the first gate electrode 104 is used as a mask blocking the laser light. Thus, the source region 118*a* and the drain region 118*b* are formed in a self-aligned manner.

Figure 47A:
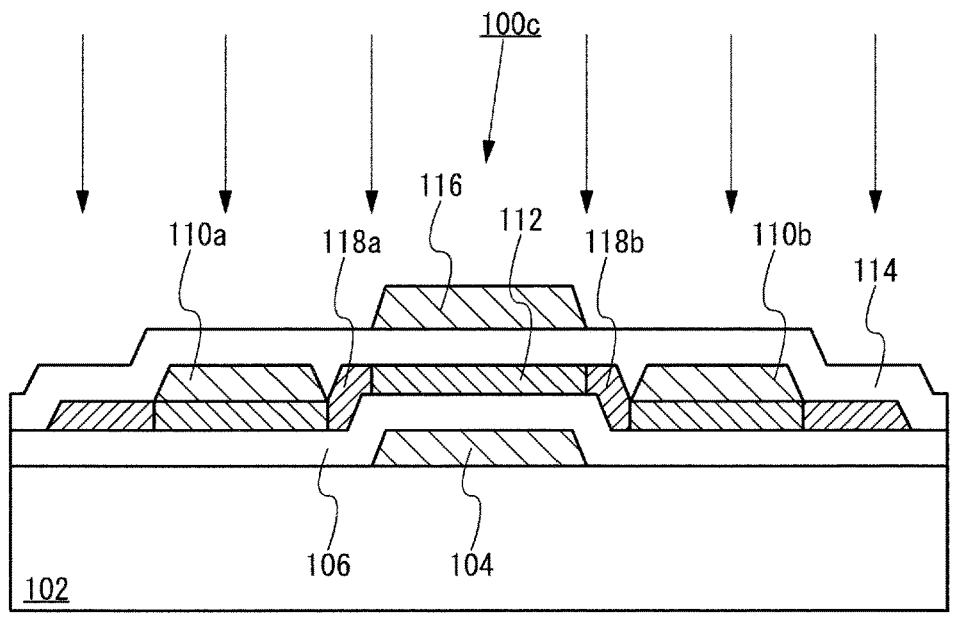
FIG. 47A is a cross-sectional view showing a method for producing a transistor in an embodiment according to the present invention, and shows a process of directing the laser light from the second gate electrode side.

As shown in FIG. 47A, the laser process may be performed on a transistor 110*c* including the first line 110*a* and the second line 110*b* provided between the oxide semiconductor layer 112 and the second insulating layer 114 while being in contact with the oxide semiconductor layer 112. In this case also, the source region 118*a* and the drain region 118*b* are formed.

FIG. 47A shows an embodiment in which the oxide semiconductor layer 112 is irradiated with the laser light from the second electrode 116 side. Regions of the oxide semiconductor layer 112 that overlap the second electrode 116, the first line 110*a* and the second line 110*b* are not irradiated with the laser light. The remaining region of the oxide semiconductor layer 112 is irradiated with the laser light, and has the resistance thereof decreased. As shown in FIG. 47A, in a region of the oxide semiconductor layer 112 that is between a region thereof overlapping the second gate electrode 116 and a region thereof overlapping each of the first line 110*a* and the second line 110*b*, the resistance is decreased. In a region of the oxide semiconductor layer 112 that is outer to the region thereof overlapping each of the first line 110*a* and the second line 110*b*, the resistance is decreased.

In the structure shown in FIG. 47A, the source region 118*a* and the drain region 118*b* are provided adjacent to a channel region where the oxide semiconductor layer 112 is held between the first gate electrode 104 and the second gate electrode 116. Namely, an offset region having a high resistance is not provided between the channel region and the source region or between the channel region and the drain region. Therefore, the level of on-current is prevented from decreasing. Unlike in the transistor 100*a* described in embodiment 1, it is not necessary that the first line 110*a* and the second line 110*b* overlap each of the first electrode 104 and the second electrode 116. Therefore, the source-gate coupling capacitance and the drain-gate coupling capacitance are decreased.

Figure 47B:
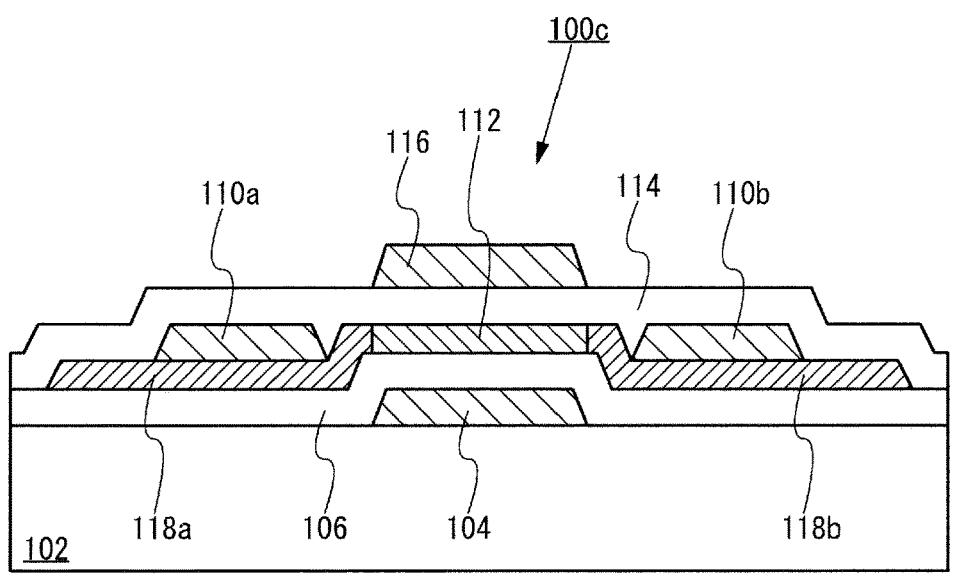
FIG. 47B is a cross-sectional view showing a method for producing a transistor in an embodiment according to the present invention, and shows a process of directing the laser light from the first gate electrode side.

FIG. 47B shows an embodiment in which the oxide semiconductor layer 112 is irradiated with the laser light from the first gate electrode 104 side. In this case, regions of the oxide semiconductor layer 112 that do not overlap the first gate electrode 104 are irradiated with the laser light. As a result, regions of the oxide semiconductor layer 112 that are below the first line 110*a* and the second line 110*b* also have a resistance thereof decreased. With such a process, the resistance of the source region 118*a* and the drain region 118*b* is further decreased. The contact resistance between the source region 118*a* and the first line 110*a*, and the contact resistance between the drain region 118*b* and the second line 110*b*, are also decreased. Like in the structure shown in FIG. 46, the first gate electrode 104 is used as a mask, and the source region 118*a* and the drain region 118*b* are formed in a self-aligned manner. Therefore, an offset region having a high resistance is not provided, and the level of on-current is prevented from decreasing.

As shown in FIG. 47A and FIG. 47B, the first gate electrode 104 or the second gate electrode 116 is used as a mask blocking the laser light, so that the source region 118*a* and the drain region 118*b* are formed in the oxide semiconductor layer 112 in a self-aligned manner. This increases the productivity of the integrated circuit elements including the transistor 1000 and decreases the production cost.

Figure 48A:
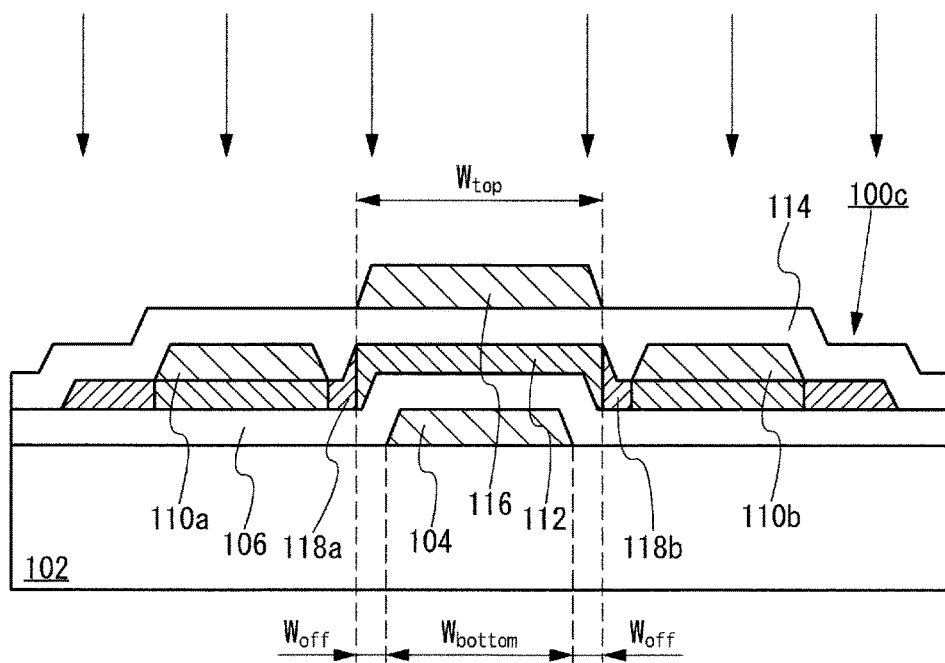
FIG. 48A is a cross-sectional view showing a method for producing a transistor in an embodiment according to the present invention, and shows a process of directing the laser light from the second gate electrode side.

As described in embodiment 2, in consideration of the alignment precision of the photomask, it is preferable that width $W_{top}$ of the second gate electrode 116 is larger than width $W_{bottom}$ of the first gate electrode 104 ($W_{top} > W_{bottom}$). FIG. 48A shows an embodiment in which the oxide semiconductor layer 112 is irradiated with the laser light from the second gate electrode 116 side in the case where the second gate electrode 116 is wider than the first gate electrode 104.

FIG. 48A shows an embodiment in which the laser light is directed from the second gate electrode 116 side in the case where width $W_{top}$ of the second gate electrode 116 is larger than width $W_{bottom}$ of the first gate electrode 104. A region of the oxide semiconductor layer that is irradiated with the laser light has the resistance thereof decreased. In the case shown in FIG. 48A, the positions of the source region 118*a* and the drain region 118*b* adjacent to the channel region of the oxide semiconductor layer 112 are determined by the second gate electrode 116. In other words, the source region 118*a* and the drain region 118*b* are formed in a self-aligned manner by the second gate electrode 116. By contrast, ends of the first gate electrode 104 does not match ends of the source region 180*a* and the drain region 180*b*, and offset regions each having width Wott are present. However, the offset regions with respect to the first gate electrode 104 are included in the channel region for the second gate electrode 116. Therefore, the influence of the offset regions on static characteristics of the transistor 1000 is small.

Figure 48B:
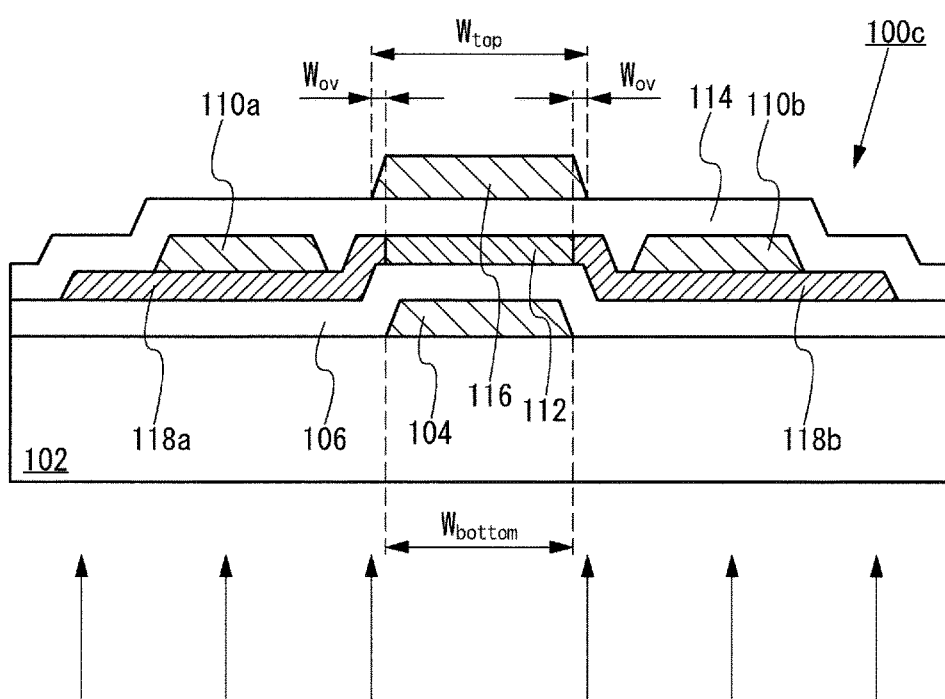
FIG. 48B is a cross-sectional view showing a method for producing a transistor in an embodiment according to the present invention, and shows a process of directing the laser light from the first gate electrode side.

FIG. 48B shows an embodiment in which the laser light is directed from the first gate electrode 104 side in the case where width $W_{top}$ of the second gate electrode 116 is larger than width $W_{bottom}$ of the first gate electrode 104. In the case shown in FIG. 48B, the positions of the source region 118*a* and the drain region 118*b* adjacent to the channel region of the oxide semiconductor layer 112 are determined by the first gate electrode 104. Therefore, the source region 118*a* and the drain region 118*b* formed in the oxide semiconductor layer 112 include regions overlapping the second gate electrode 116. Such regions each have width $W_{ov}$. As can be seen, the source region 118*a* and the drain region 118*b* have the regions overlapping the second gate electrode 116. Therefore, a high resistance region is not formed between the source region 118*a* and the second gate electrode 116 or between the drain region 118*b* and the second gate electrode 116. Thus, the level of on-current of the transistor 100*c* is prevented from decreasing.

In this embodiment, the source region 118*a* and the drain region 118*b* are formed in a self-aligned manner by the first gate electrode 104 or the second gate electrode 116. In consideration of the alignment precision in the lithography step, it is preferable that width $W_{top}$ of the second gate electrode 116 is larger than width $W_{bottom}$ of the first gate electrode 104 ($W_{top} > W_{bottom}$). Namely, the second gate electrode 116 on the upper layer is made wider than the first gate electrode 104 in the lower layer, so that there is a margin for the alignment precision of the photomask in the lithography step. Therefore, the channel region formed in the oxide semiconductor layer 112 is covered with the second gate electrode 116 with certainty.

Embodiment 11

In embodiment 11, an example of applying the structure of the transistor described in embodiment 7 to a display device 120 will be described.

11-1. Pixel Structure 1

Figure 49:
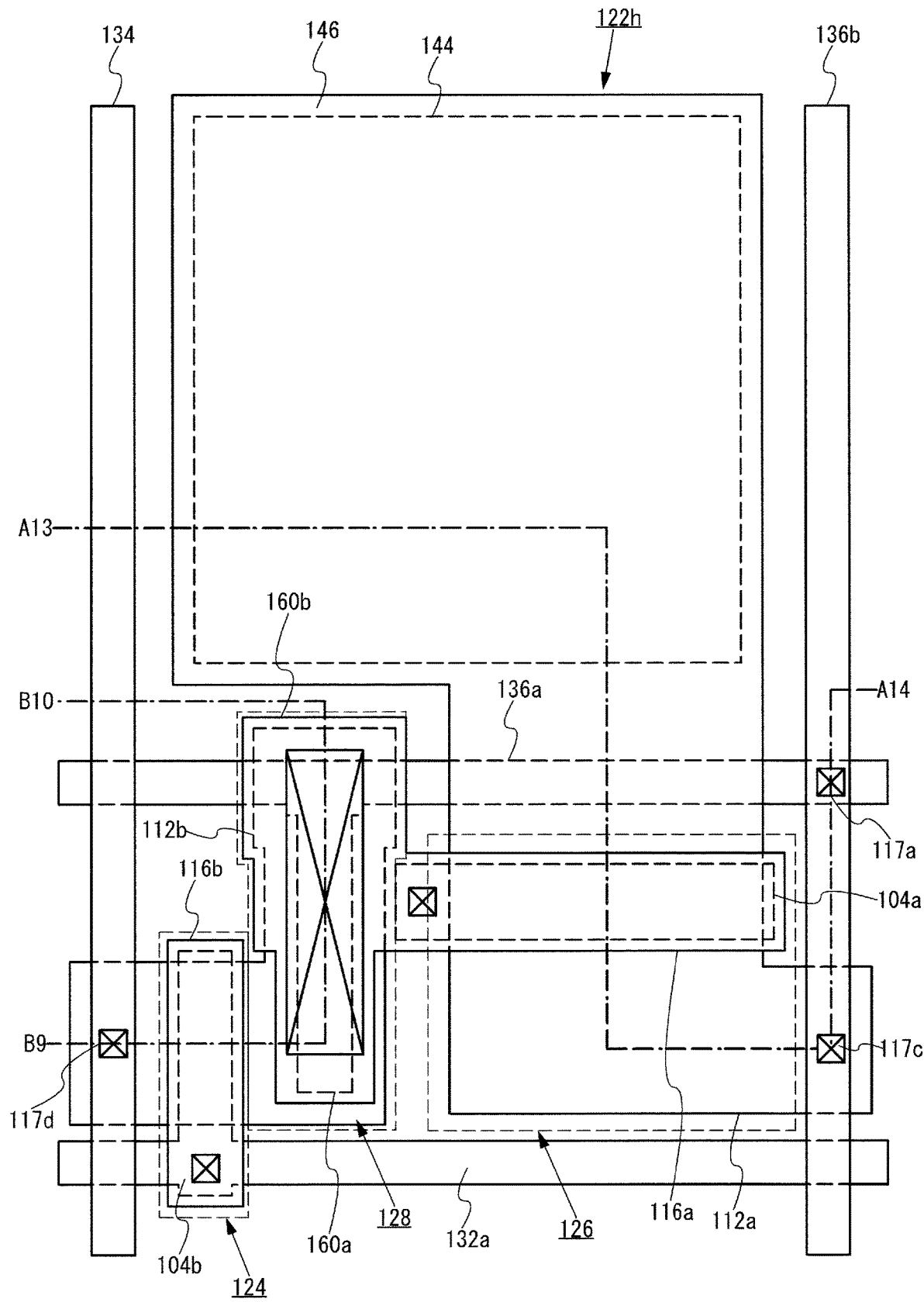
FIG. 49 is a plan view showing a structure of a pixel in a display device in an embodiment according to the present invention.
Figure 50A:
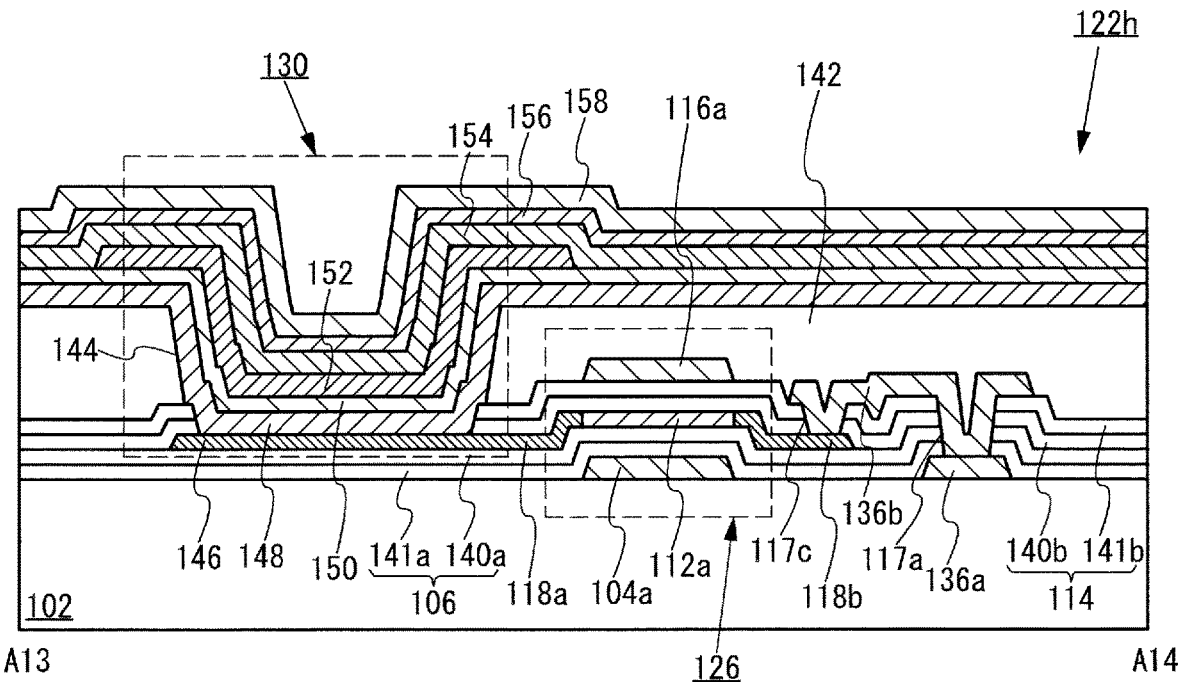
FIG. 50A is a cross-sectional view showing the structure of the pixel in the display device in an embodiment according to the present invention, taken along line A13-A14 in FIG. 49.
Figure 50B:
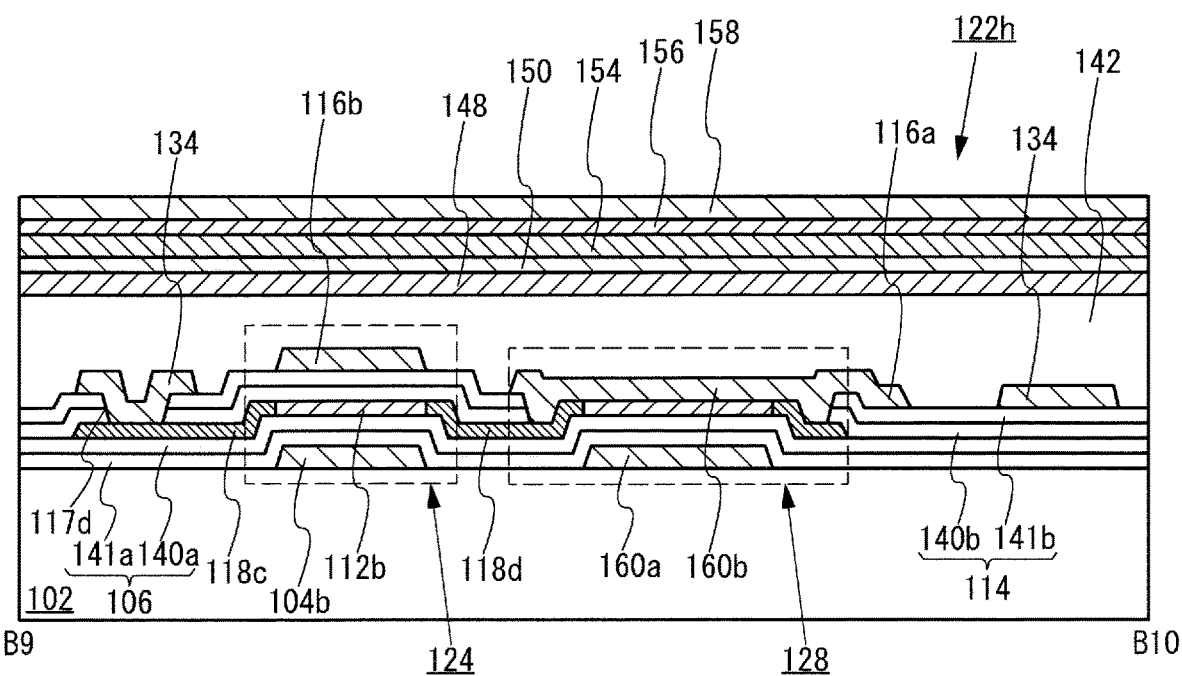
FIG. 50B is a cross-sectional view showing the structure of the pixel in the display device in an embodiment according to the present invention, taken along line B9-B10 in FIG. 49.

FIG. 49 is a plan view of a pixel 122h of a display device 120 in embodiment 11. FIG. 50A shows a cross-sectional structure taken along line A13-A14 in FIG. 49, and FIG. 50B shows a cross-sectional structure taken along line B9-B10 in FIG. 49. The following description will be made with reference to FIG. 49, FIG. 50A and FIG. 50B.

The first oxide semiconductor layer 112a includes a region overlapping the first gate electrode 104a and the second gate electrode 116a, and the second oxide semiconductor layer 112b includes a region overlapping the first gate electrode 104b and the second gate electrode 116b. The driving transistor 126 includes the first source region 118a and the first drain region 118b provided in a region of the first oxide semiconductor layer 112a that is outer to the region thereof overlapping the first gate electrode 104a. The selection transistor 124 includes a first source/drain region 118c and a second source/drain region 118d provided in a region of the second oxide semiconductor layer 112b that is outer to the region thereof overlapping the first gate electrode 104b.

As described above in embodiment 7, the first source region 118a, the first drain region 118b, the first source/drain region 118c and the second source/drain region 118d are low-resistance regions generated as a result of being irradiated with laser light from the substrate 102 side. The first gate electrodes 104a and 104b are used as masks against laser irradiation. Therefore, in each of the driving transistor 126 and the selection transistor 124, regions of the oxide semiconductor layer 112 other than the region thereof corresponding to the channel region have a resistance thereof decreased.

In the organic EL element 130, the regions of the first oxide semiconductor layer 112a having the resistance thereof decreased is used as the first electrode 146, which is the cathode electrode. In the capacitance element 128, the first capacitance electrode 160a formed in the same layer as that of the first gate electrode 104 overlaps the second oxide semiconductor layer 112b. Therefore, the region of the oxide semiconductor layer 112 that overlaps the first capacitance electrode 160a does not have a resistance thereof decreased. For this reason, a wide opening is formed in the second insulating layer 114 to enlarge a region where the second gate electrode 116a is in contact with the second oxide semiconductor layer 112b and overlaps the first capacitance electrode 160a. With such an arrangement, the second gate electrode 116a also acts as the other capacitance electrode.

11-2. Pixel Structure 2

Figure 51:
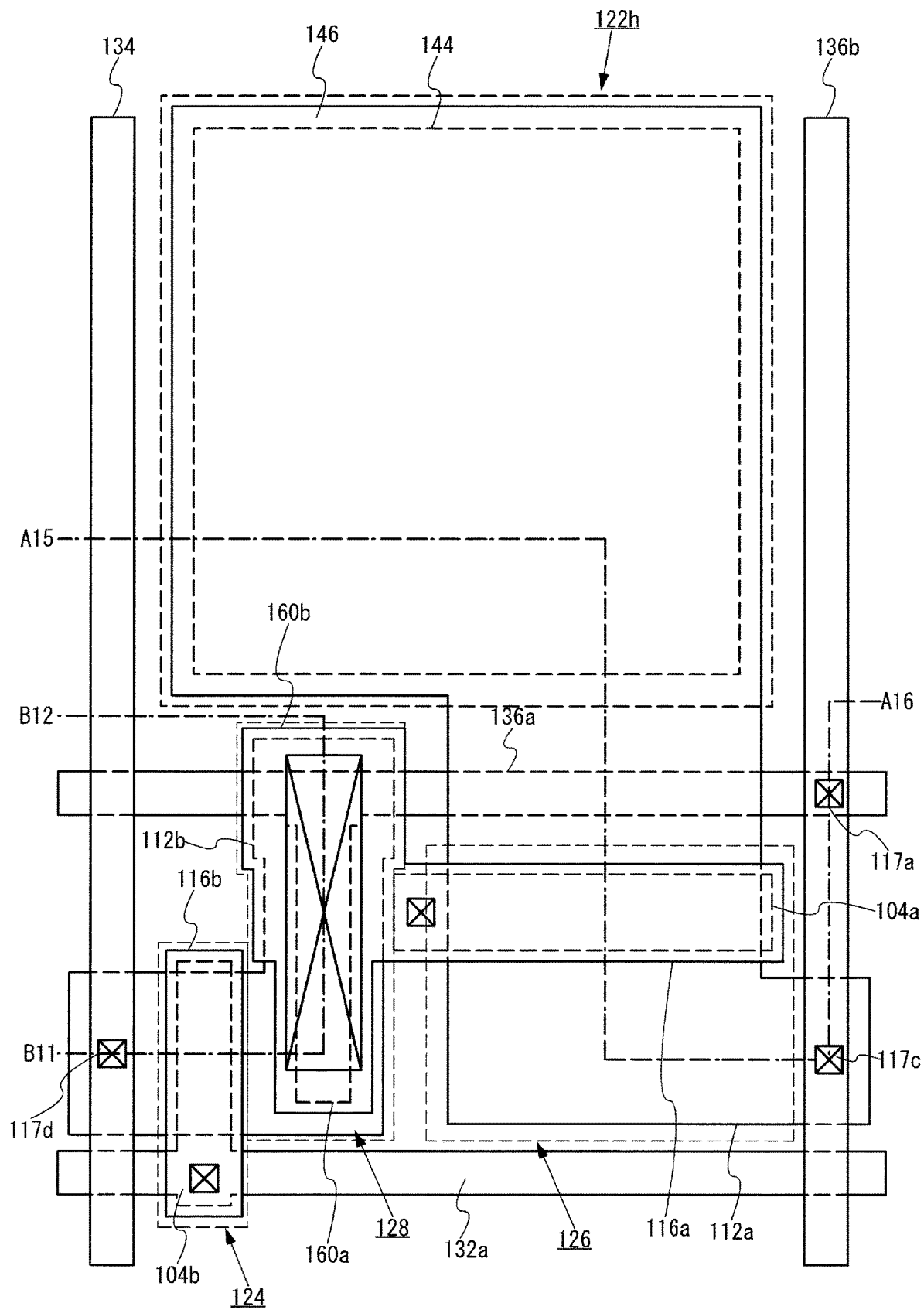
FIG. 51 is a plan view showing a structure of a pixel in a display device in an embodiment according to the present invention.
Figure 52A:
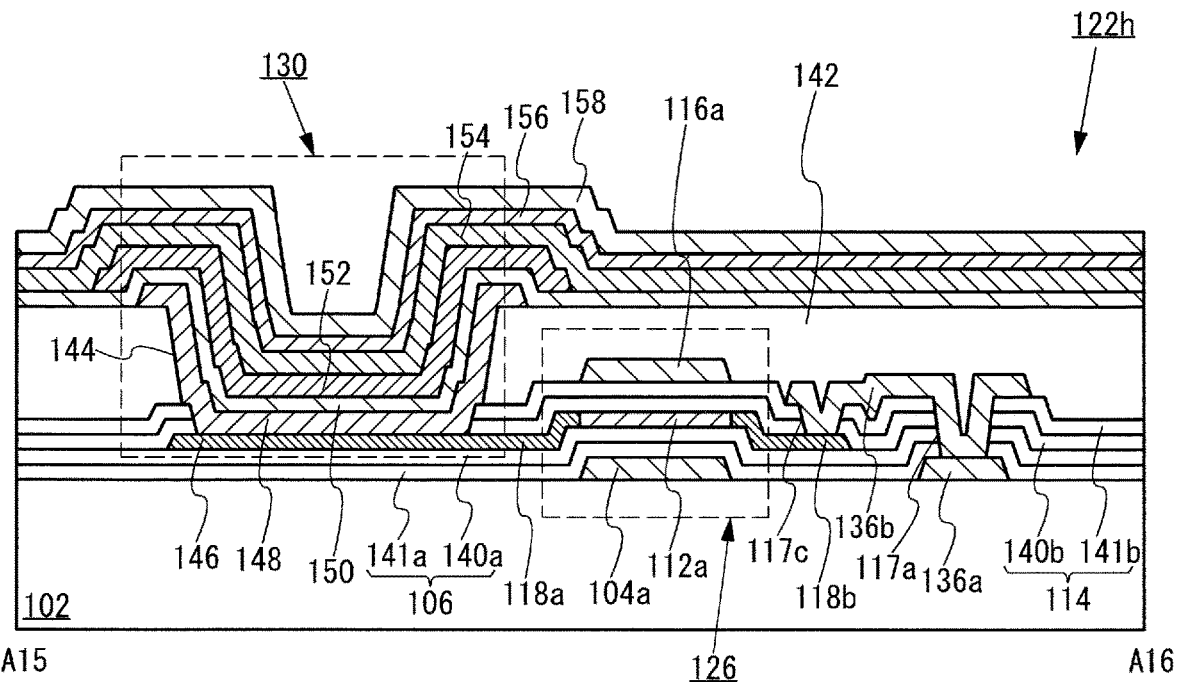
FIG. 52A is a cross-sectional view showing the structure of the pixel in the display device in an embodiment according to the present invention, taken along line A15-A16 in FIG. 51.
Figure 52B:
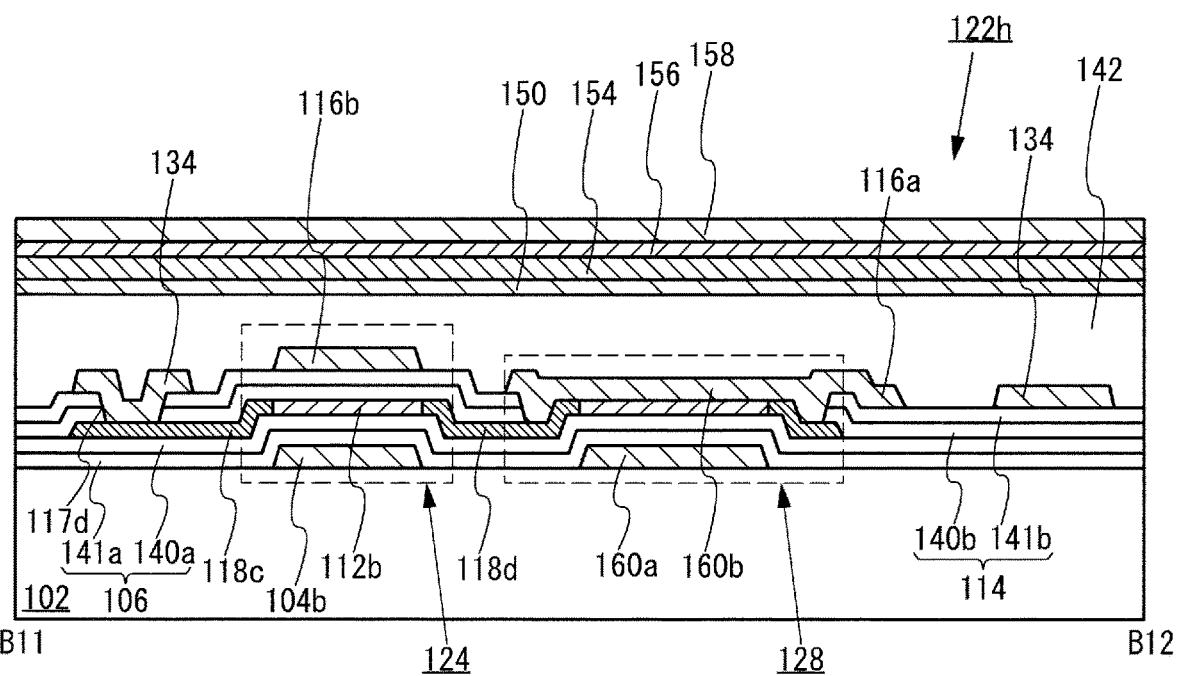
FIG. 52B is a cross-sectional view showing the structure of the pixel in the display device in an embodiment according to the present invention, taken along line B11-B12 in FIG. 51.

As described above in embodiment 4, the electron transfer layer 148 may be individually provided for each pixel. FIG. 51, FIG. 52A and FIG. 52B show a structure of a pixel 122h in this case. FIG. 51 is a plan view of the pixel 122h in a display 120 in this embodiment. FIG. 52A shows a cross-sectional structure taken along line A15-A16 in FIG. 51, and FIG. 52B shows a cross-sectional structure taken along line B11-B12 in FIG. 51.

As shown in FIG. 51, the opening 144 provided in the flattening layer 142 exposes the inside of the first electrode 146 formed as a result of the resistance of the oxide semiconductor layer 112 being decreased. As shown in FIG. 52A, the electron transfer layer 148 is in contact with the first electrode 146 exposed by the opening 144. The electron transfer layer 148 is individually provided for each pixel. For example, the electron transfer layer 148 is not provided in the entirety of the pixel 122h. For example, as shown in FIG. 52B, the electron transfer layer 148 does not need to be provided in a region where the selection transistor 124 is provided. Like in embodiment 4, since the electron transfer layer 148 is formed to be larger than the opening 144, the light emitting layer 152 is prevented from contacting the oxide semiconductor layer 112a. Since the electron transfer layer 148 is formed to be smaller than the light emitting layer 152, the hole transfer layer 154 is prevented from contacting the electron transfer layer 148.

As shown in FIG. 52A, since an end of the electron transfer layer 148 is located outer to the opening 144 (on the top surface of the flattening layer 142), the first electrode 146 formed of an oxide semiconductor is not exposed outside. Namely, the first electrode 146 is not exposed to be etched when the electron transfer layer 148 is formed by etching. Therefore, the first electrode 146 is not extinguished by over-etching. This allows the first electrode 146 (in other words, the oxide semiconductor layer 112a) to be formed to have the same thickness as that of the channel region of the transistor.

11-3. Pixel Structure 3

Figure 53A:
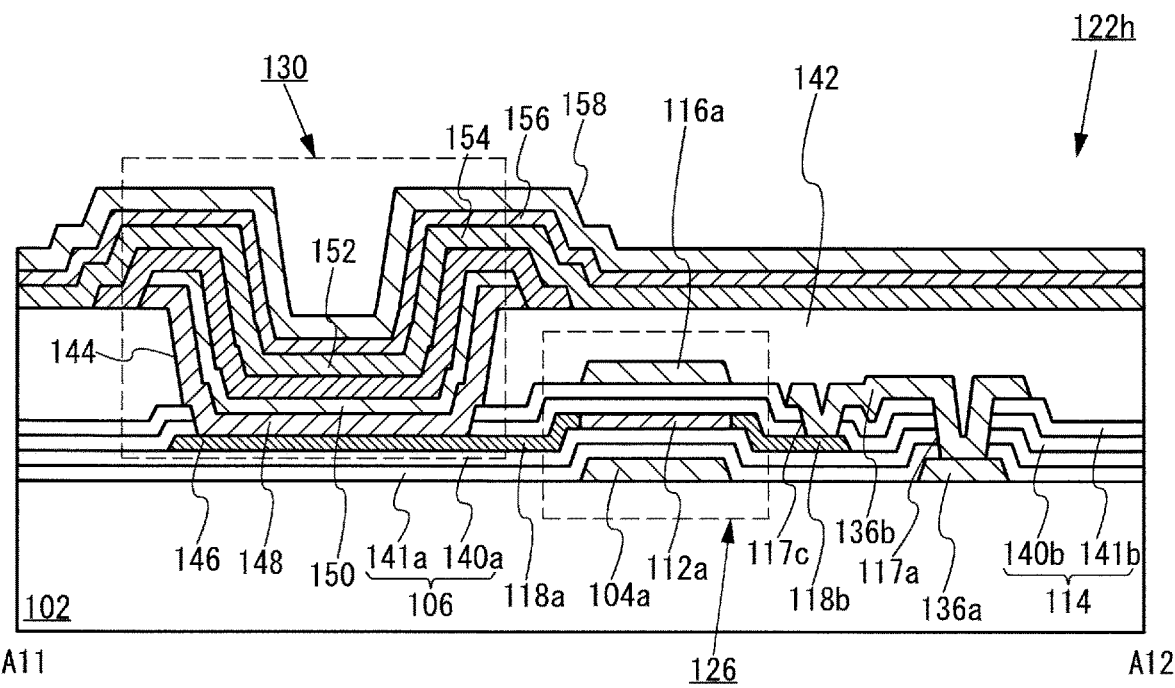
FIG. 53A is a cross-sectional view showing a structure of a pixel in a display device in an embodiment according to the present invention, taken along line A15-A16 in FIG. 51.
Figure 53B:
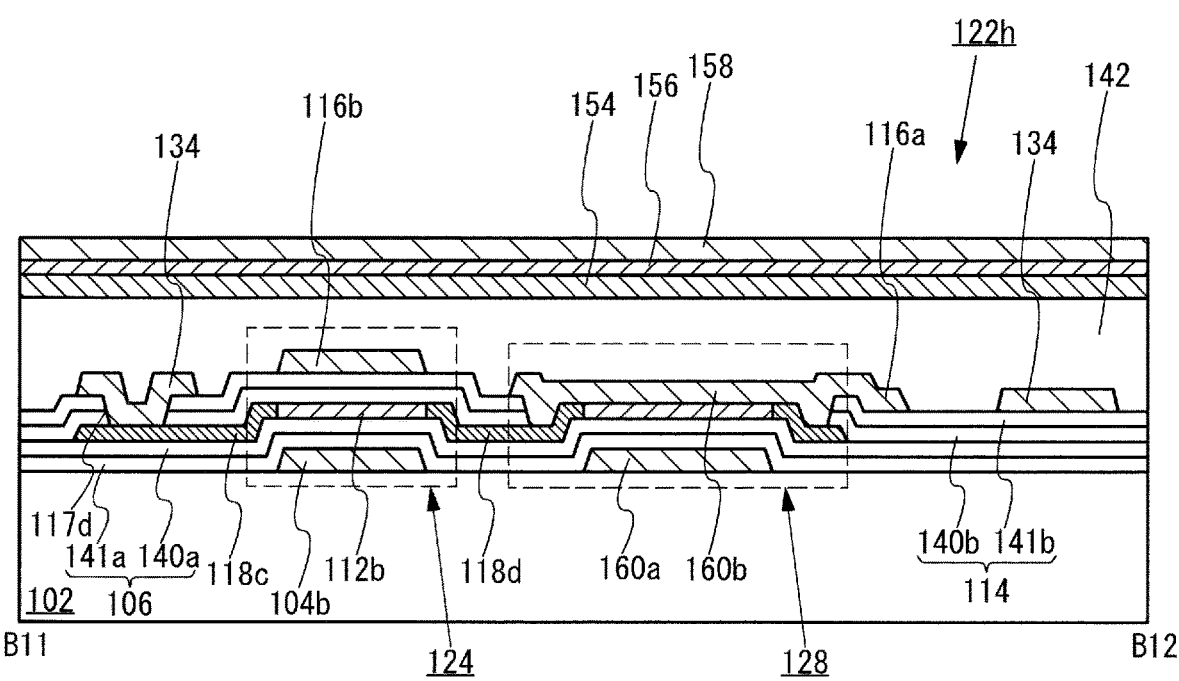
FIG. 53B is a cross-sectional view showing the structure of the pixel in the display device in an embodiment according to the present invention, taken along line B11-B12 in FIG. 51.

As described above in embodiment 4, the two layers of the electron transfer layer 148 and the electron injection layer 150 may be formed by a lithography step and an etching step. FIG. 53A and FIG. 53B show a structure of the pixel 122h in such a case. FIG. 53A shows a cross-sectional structure taken along line A15-A16 in the plan view of FIG. 51, and FIG. 53B shows a cross-sectional structure taken along line B11-B12 in the plan view of FIG. 51.

As shown in FIG. 53A, both of the electron transfer layer 148 and the electron injection layer 150 are provided in correspondence with the organic EL element 130 in each pixel 122h. In this case, as shown in FIG. 53B, neither electron transfer layer 148 nor the electron injection layer 150 is provided in a region where the selection transistor 124 is provided. The electron transfer layer 148 and the electron injection layer 150 shown in FIG. 53A and FIG. 53B each have substantially the same structure as that in embodiment 4.

As can be seen, in this embodiment, the driving transistor 126 and the selection transistor 124 included in the pixel 122h both have a source region and a drain region formed as a result of the resistance of the oxide semiconductor layer 112 being decreased. This simplifies the structure of the transistors, and decreases the source-gate coupling capacitance and the drain-gate coupling capacitance.

In this embodiment, the channel region of each of the driving transistor 126 and the selection transistor 124, and the first electrode 146 acting as the cathode electrode of the organic EL element 130, are formed of the same oxide semiconductor layer 112. The source/drain regions 118 and the second electrode 146 have resistances thereof decreased as a result of being irradiated with laser light. This simplifies the production process. In addition, since electron transfer layer 148 is individually formed for the organic EL element 130 in each pixel 122h, the undesirable possibility that that the leak current between the pixels 122h (in other words, crosstalk) is generated is solved.

Embodiment 12

12-1. Pixel Structure

Figure 54:
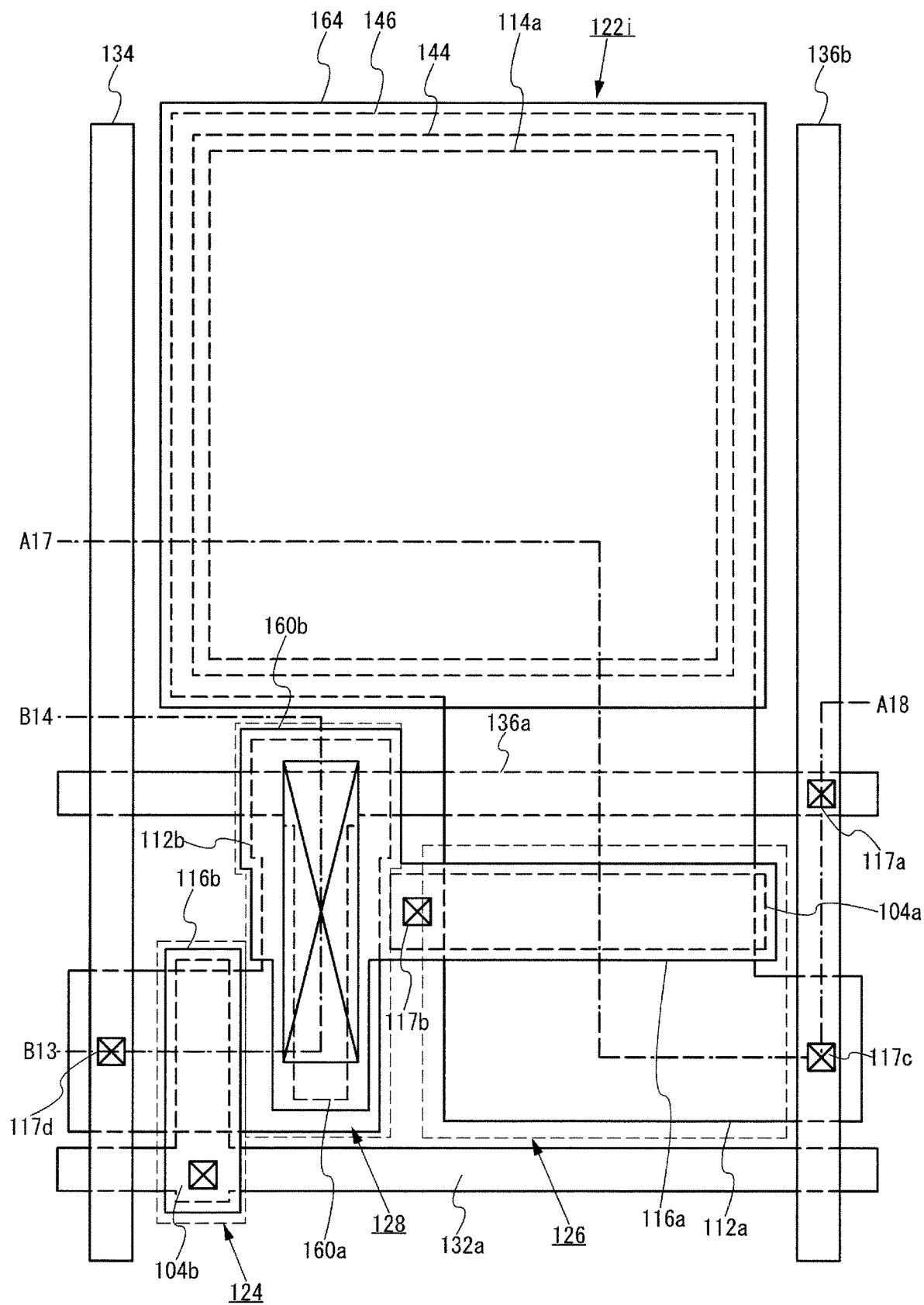
FIG. 54 is a plan view showing a structure of a pixel in a display device in an embodiment according to the present invention.
Figure 55A:
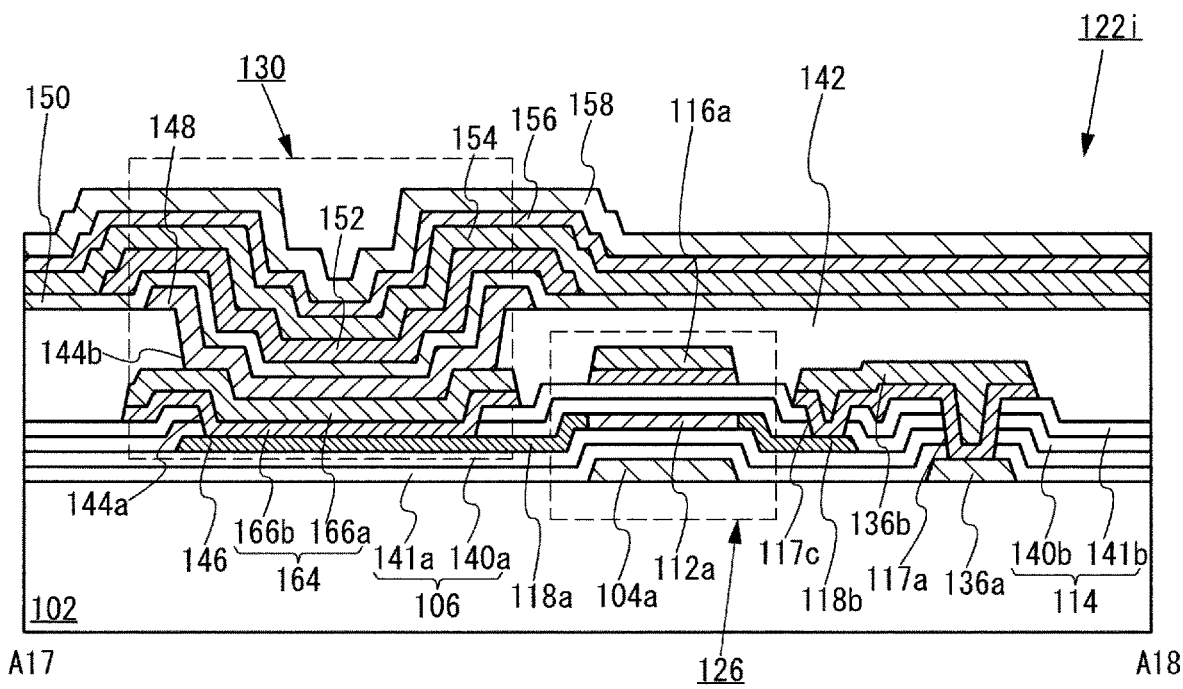
FIG. 55A is a cross-sectional view showing the structure of the pixel in the display device in an embodiment according to the present invention, taken along line A17-A18 in FIG. 54.
Figure 55B:
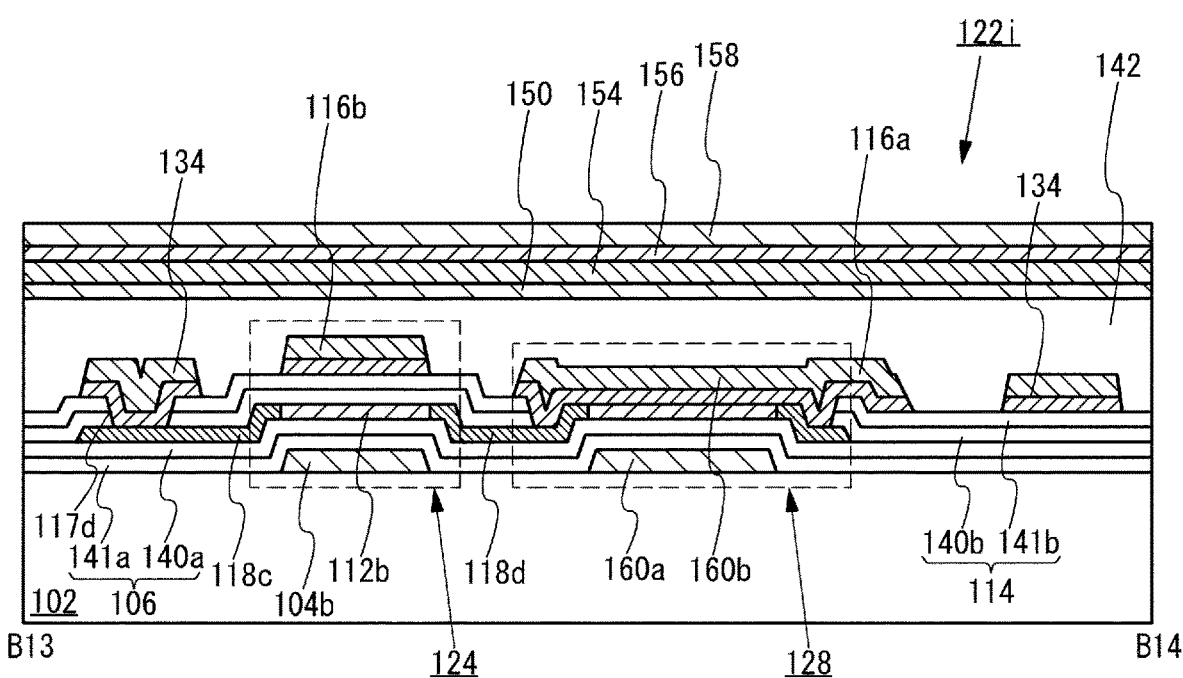
FIG. 55B is a cross-sectional view showing the structure of the pixel in the display device in an embodiment according to the present invention, taken along line B13-B14 in FIG. 54.

The pixel described in embodiment 11 may include a reflective electrode 164 in the organic EL element 130. FIG. 54, FIG. 55A and FIG. 55B show a structure of a pixel 122i including the reflective electrode 164 provided between the first electrode 146 and the electron transfer layer 148. FIG. 54 is a plan view showing a first structure of the pixel 122i. FIG. 55A shows a cross-sectional structure taken along line A17-A18 in FIG. 54, and FIG. 55B shows a cross-sectional structure taken along line B13-B14 in FIG. 54.

As shown in FIG. 54 and FIG. 55A, the reflective electrode 164 is provided to be wider than the first electrode 146. An outer end of the reflective electrode 164 is located outer to the opening 144. As shown in FIG. 55A, the reflective electrode 164 is in contact with the first electrode 146. On the first electrode 146, the second insulating layer 114 is provided. Therefore, the reflective electrode 164 is formed after the opening 144a exposing the first electrode 146 is formed in the second insulating layer 114. The reflective electrode 164 may be formed of the same conductive layer as that of the second gate electrode 116 (the common line 136 is also formed of the same conductive layer). Since the reflective electrode 164 is formed of the same conductive layer as that of the second gate electrode 116 as described above, the number of steps of the production process is decreased. Namely, the reflective electrode 164 is formed merely by forming the opening 144a in the second insulating layer 114 without adding any other step.

In the case where the pixel 112h is of a top emission type, in which light from the organic EL element 130 is output from the second electrode 158 side, it is preferable that the reflective electrode 164 is provided on the first electrode 146 side. It is preferable that the reflective electrode 164 includes a metal layer having a high reflectance at a surface thereof facing the electron transfer layer 148. The reflective electrode 164 may include, for example, a first metal layer 166a formed of aluminum (Al), an aluminum alloy, silver (Ag) or the like. Examples of the aluminum alloy usable for the first metal layer 166a include an aluminum-neodymium alloy (Al—Nd), an aluminum-neodymium-nickel alloy (Al—Nd—Ni), an aluminum-carbon-nickel (Al—C—Ni), a copper-nickel alloy (Cu—Ni), and the like.

An aluminum film may undesirably cause an oxidation-reduction reaction when directly contacting the first electrode 146, which is formed of an oxide semiconductor. In order to avoid this, a second metal layer 166b formed of a metal material such as titanium (Ti), tantalum (Ta), molybdenum (Mo) or the like may be provided between the first electrode 146 and the first metal layer 166a.

On the reflective electrode 164, the flattening layer 142 is provided. A surface of the reflective electrode 164 is exposed by an opening 144b formed in the flattening layer 142. The electron transfer layer 148 is in contact with the reflective electrode 164 via the opening 144b formed in the flattening layer 142. A thin film formed of an aluminum-lithium alloy (AlLi), a magnesium-silver alloy (MgAg) or the like may be provided between the reflective electrode 164 and the electron transfer layer 148.

12-2. Pixel Structure 2

Figure 56A:
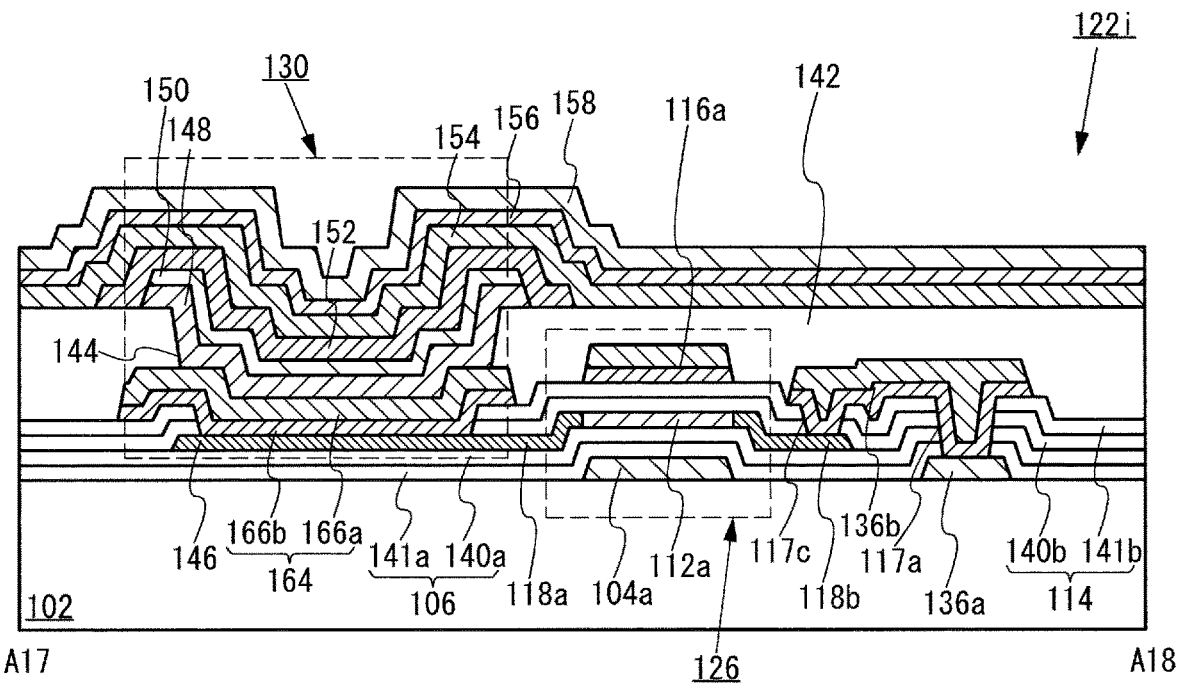
FIG. 56A is a cross-sectional view showing a structure of a pixel in a display device in an embodiment according to the present invention, taken along line A17-A18 in FIG. 54.
Figure 56B:
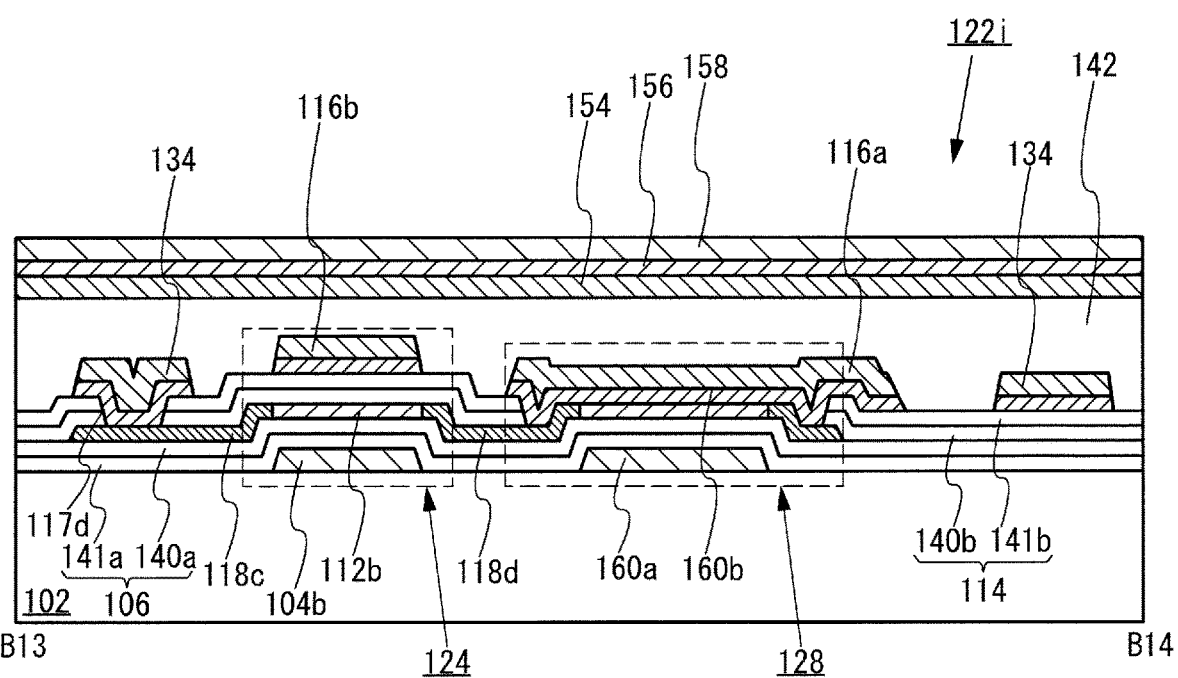
FIG. 56B is a cross-sectional view showing the structure of the pixel in the display device in an embodiment according to the present invention, taken along line B13-B14 in FIG. 54.

FIG. 56A and FIG. 56B show a second structure of the pixel 122i.

FIG. 56A shows a cross-sectional structure taken along line A17-A18 in the plan view of FIG. 54, and FIG. 56B shows a cross-sectional structure taken along line B13-B14 in the plan view of FIG. 54. In the second structure, the electron transfer layer 148 and the electron injection layer 150 are individually provided for each pixel 122i, like in embodiment 11. Even in the case where the electron transfer layer 148 and the electron injection layer 150 are individually provided for each pixel 122i, the organic EL element 130 may include the reflective electrode 164.

12-3. Pixel Structure 3

Figure 57:
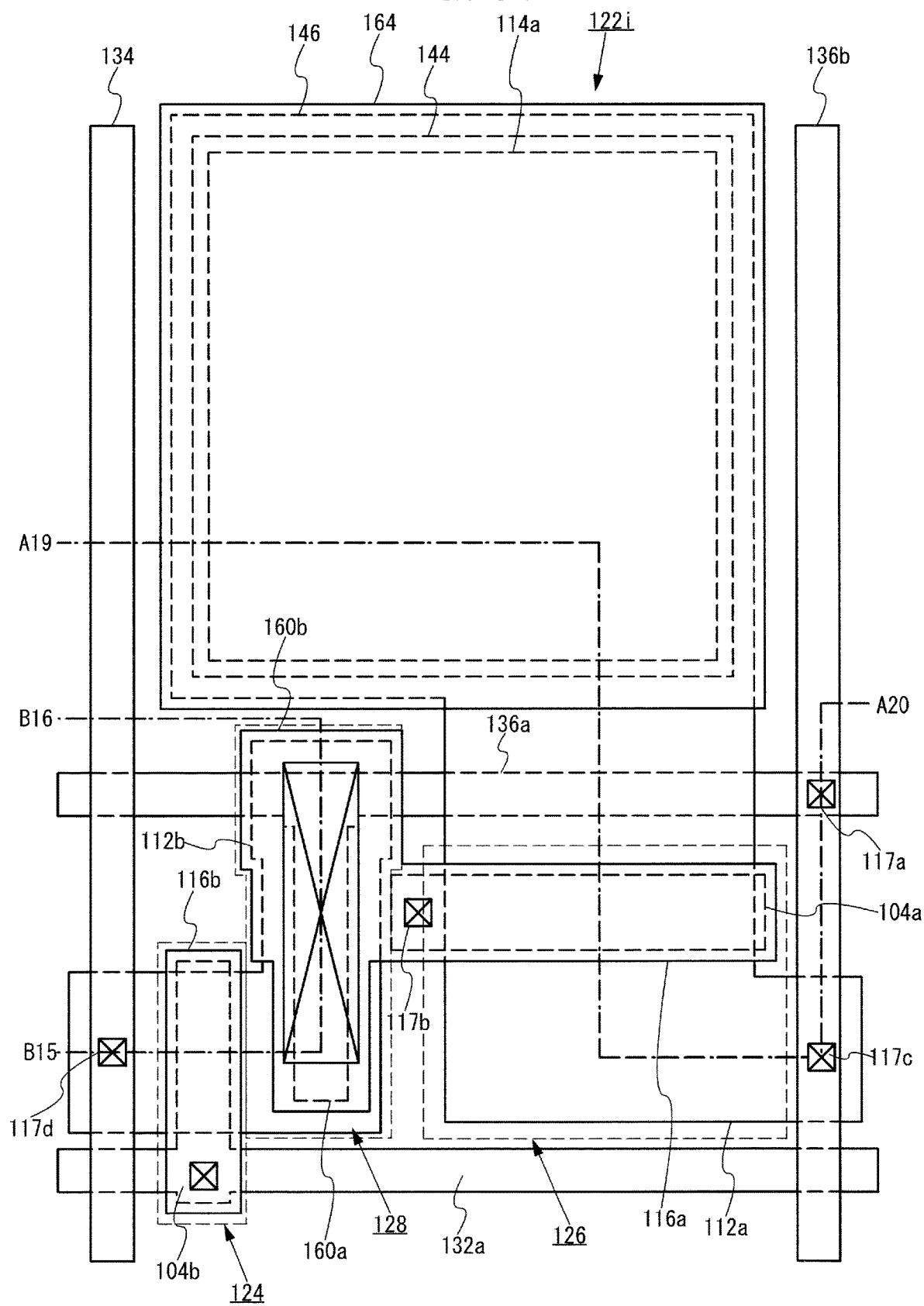
FIG. 57 is a plan view showing a structure of a pixel in a display device in an embodiment according to the present invention.
Figure 58A:
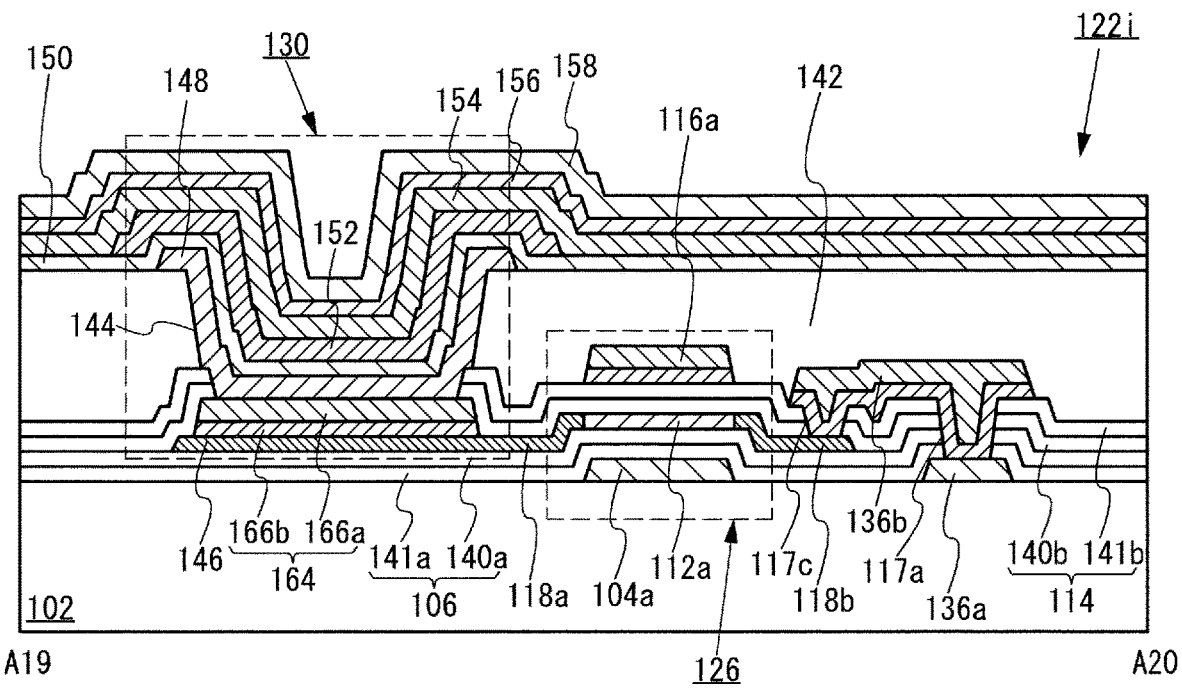
FIG. 58A is a cross-sectional view showing the structure of the pixel in the display device in an embodiment according to the present invention, taken along line A19-A20 in FIG. 57.
Figure 58B:
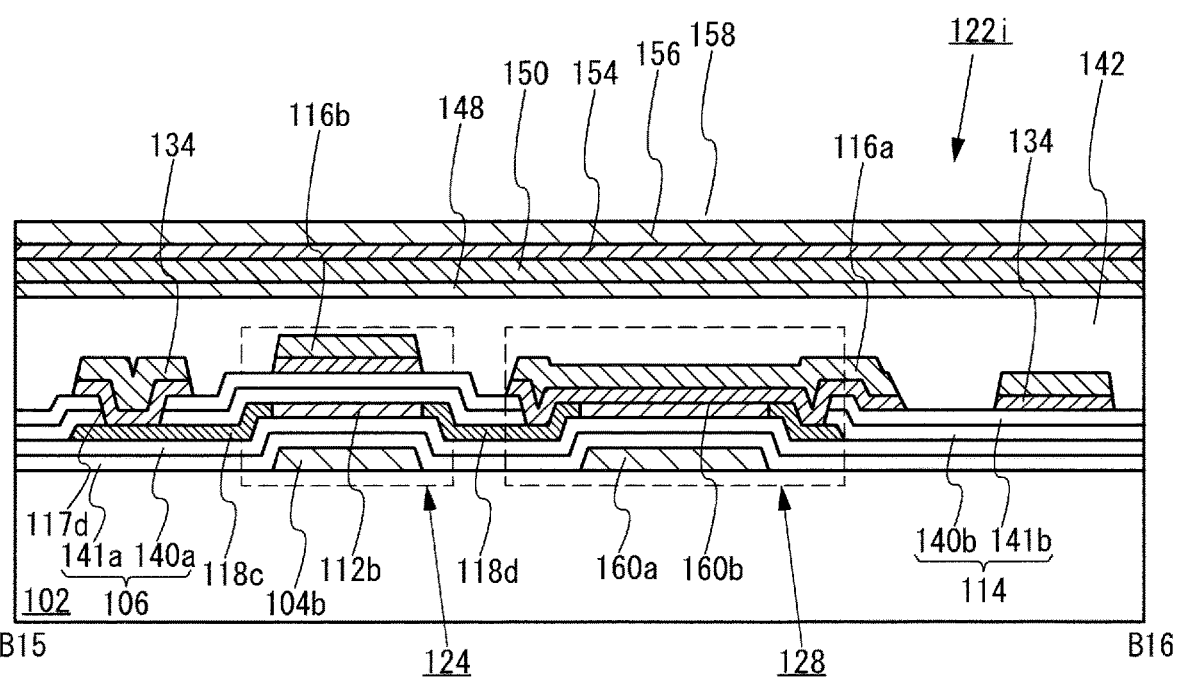
FIG. 58B is a cross-sectional view showing the structure of the pixel in the display device in an embodiment according to the present invention, taken along line B15-B16 in FIG. 57.

FIG. 57 is a plan view showing a third structure of the pixel 122i. FIG. 58A shows a cross-sectional structure taken along line A19-A20 in FIG. 57, and FIG. 58B shows a cross-sectional structure taken along line B15-B16 in FIG. 57. In the third structure, the reflective electrode 164 is provided below the second insulating layer 114. In this case, the reflective electrode 164 is formed as follows. The oxide semiconductor layer 112, the first metal layer 166a and the second metal layer 166b are formed on substantially the entire surface of the substrate 102, and the reflective electrode 164 is formed by use of a multi-gradation photomask as described above in embodiment 5.

Figure 62A:
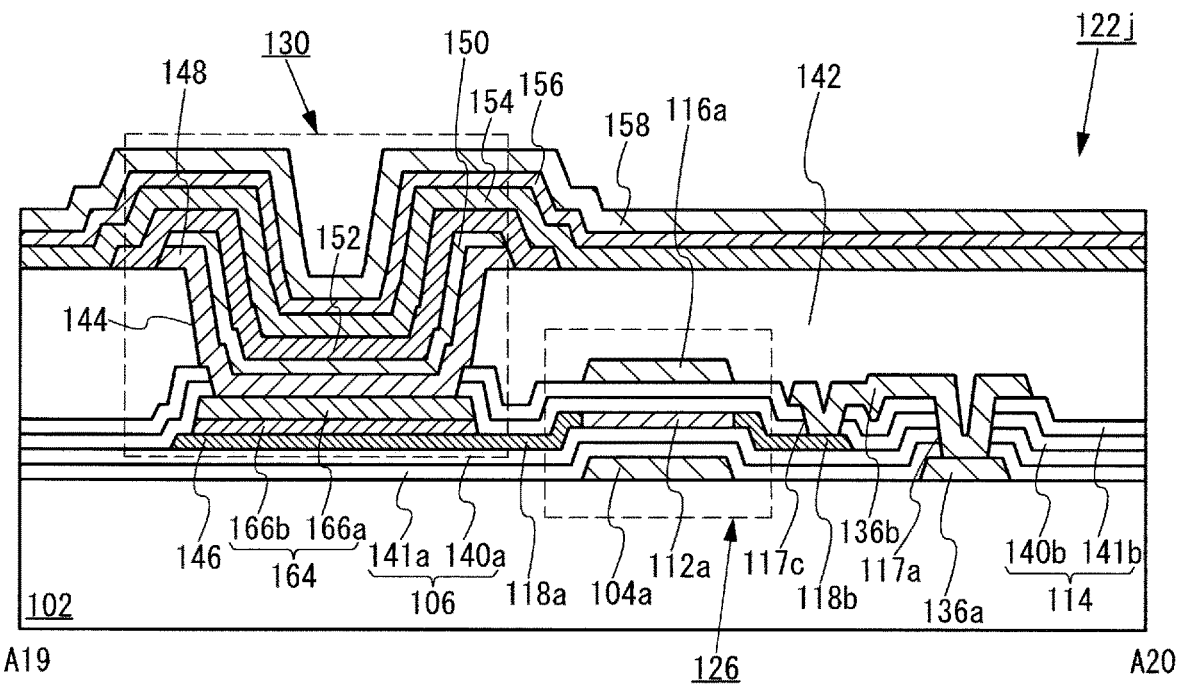
FIG. 62A is a cross-sectional view showing a structure of a pixel in a display device in an embodiment according to the present invention, taken along line A19-A20 in FIG. 57.
Figure 62B:
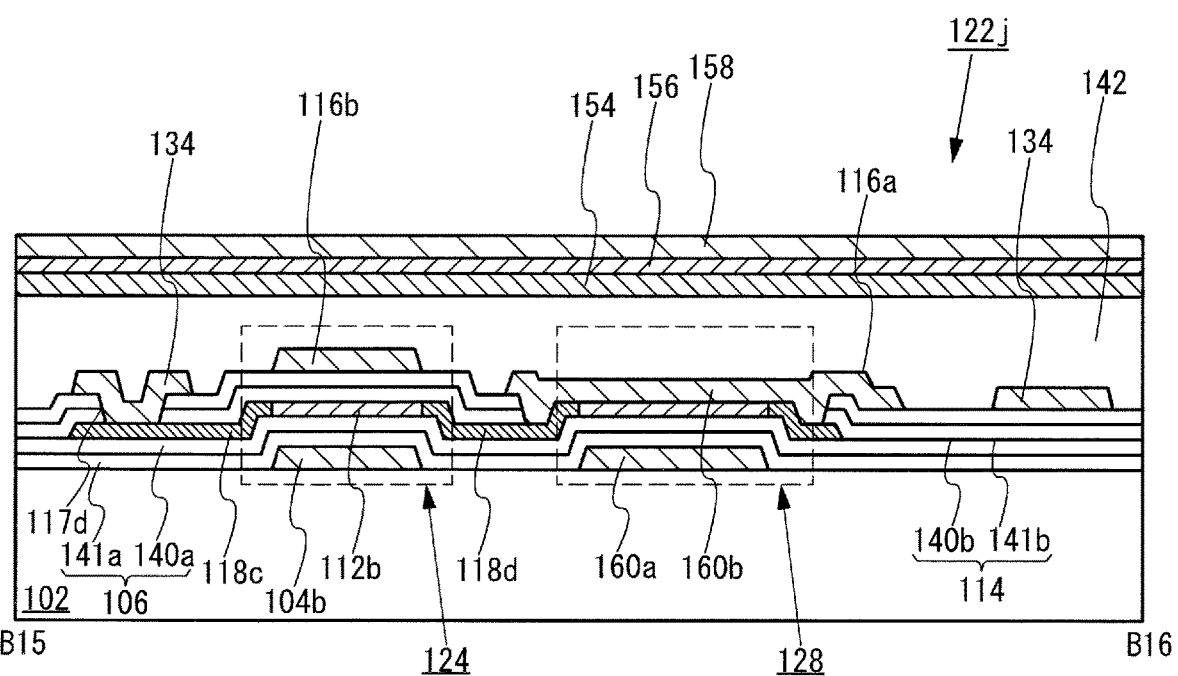
FIG. 62B is a cross-sectional view showing the structure of the pixel in the display device in an embodiment according to the present invention, taken along line B15-B16 in FIG. 57.

FIG. 62A and FIG. 62B show an embodiment in which the electron transfer layer 148 and the electron injection layer 150 are individually provided for each pixel 122i, like in embodiment 11, in the third structure. Even in the case where the electron transfer layer 148 and the electron injection layer 150 are individually provided for each pixel 122i, the organic EL element 130 may include the reflective electrode 164.

As can be seen, in this embodiment, the reflective electrode 164 is provided in the organic EL element 130, so that the intensity of the light output from the top emission type pixel is increased. Namely, the current efficiency of the organic EL element 130 is increased. In this case, the reflective electrode 164 is formed of the same conductive layer as that of the second gate electrode 116. Therefore, the number of steps of the production process does not need to be significantly increased to form the reflective electrode 164 in the organic EL element 130.

Embodiment 13

Figure 59:
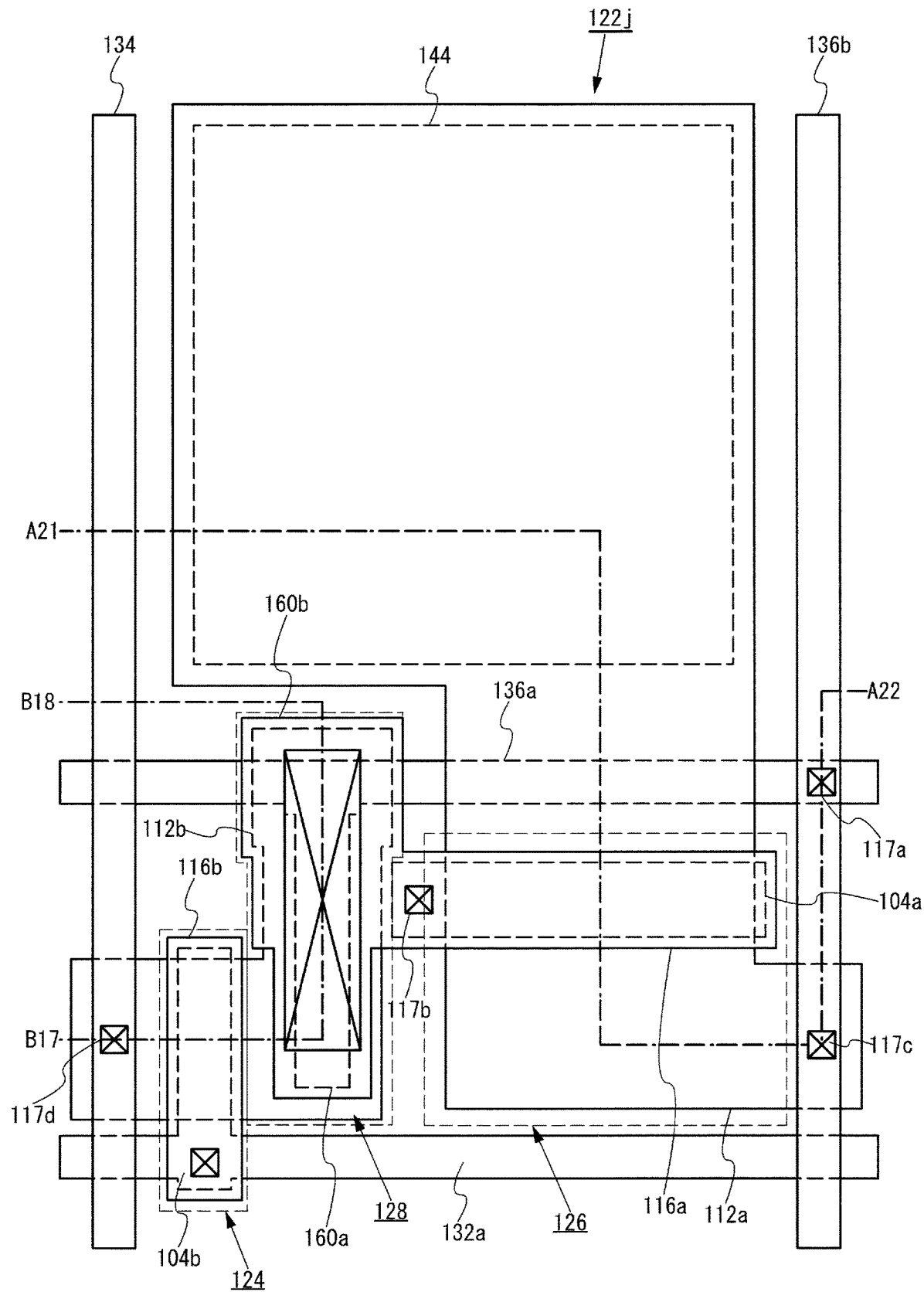
FIG. 59 is a plan view showing a structure of a pixel in a display device in an embodiment according to the present invention.
Figure 60A:
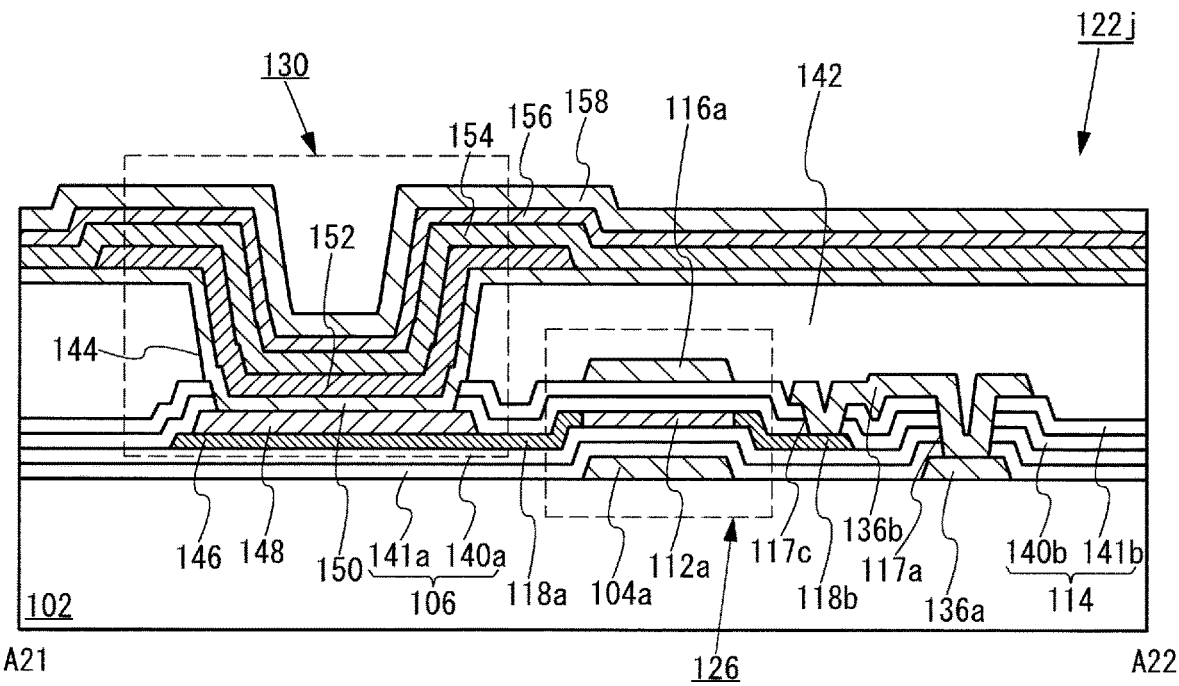
FIG. 60A is a cross-sectional view showing the structure of the pixel in the display device in an embodiment according to the present invention, taken along line A21-A22 in FIG. 59.
Figure 60B:
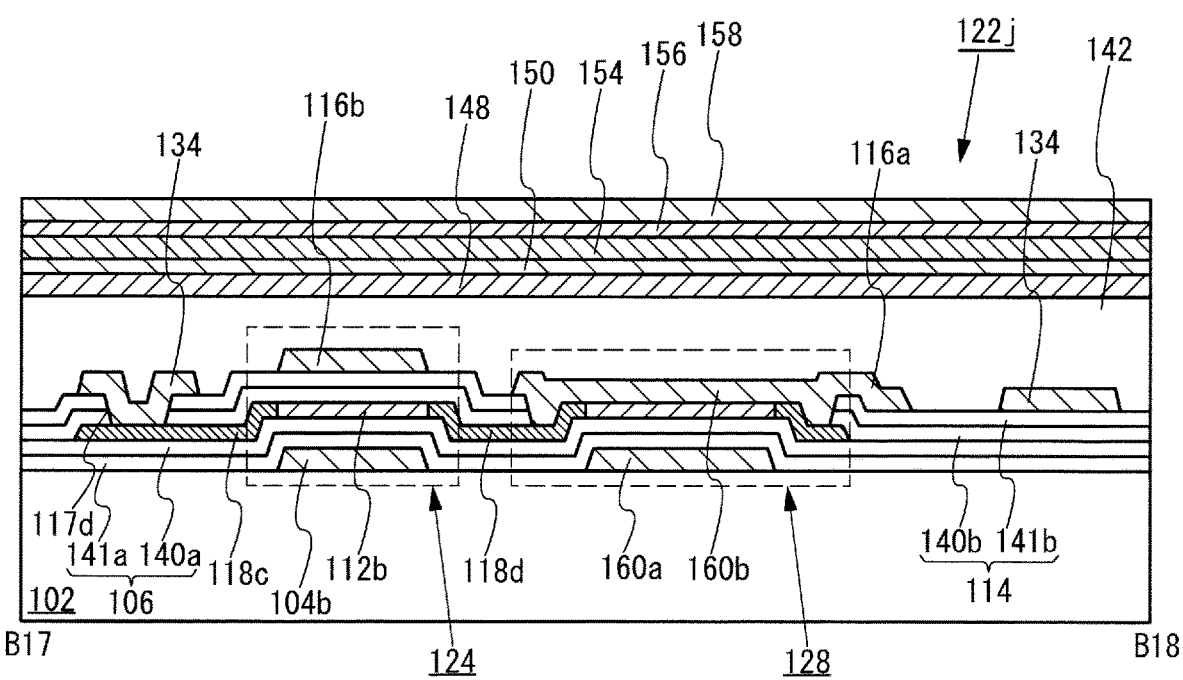
FIG. 60B is a cross-sectional view showing the structure of the pixel in the display device in an embodiment according to the present invention, taken along line B17-B18 in FIG. 59.

In embodiment 13, the electron transfer layer 148 is provided on the oxide semiconductor layer 112a like in embodiment 5. FIG. 59 is a plan view of a pixel 122j in this embodiment. FIG. 60A shows a cross-sectional structure taken along line A21-A22 in FIG. 59, and FIG. 60B shows a cross-sectional structure taken along line B17-B18 in FIG. 59.

The first electrode 146 in contact with the electron transfer layer 148 is provided in the same layer as that of the oxide semiconductor layer 112a included in the driving transistor 126, and has the resistance thereof decreased as a result of being irradiated with laser light from the substrate 102 side. The electron transfer layer 148 is formed by use of a multi-gradation photomask as in the steps shown in FIG. 31A, FIG. 31B, FIG. 32A, FIG. 32B, FIG. 33A, FIG. 33B, FIG. 34, FIG. 35A, FIG. 35B, FIG. 36A and FIG. 36B in embodiment 5.

Figure 61A:
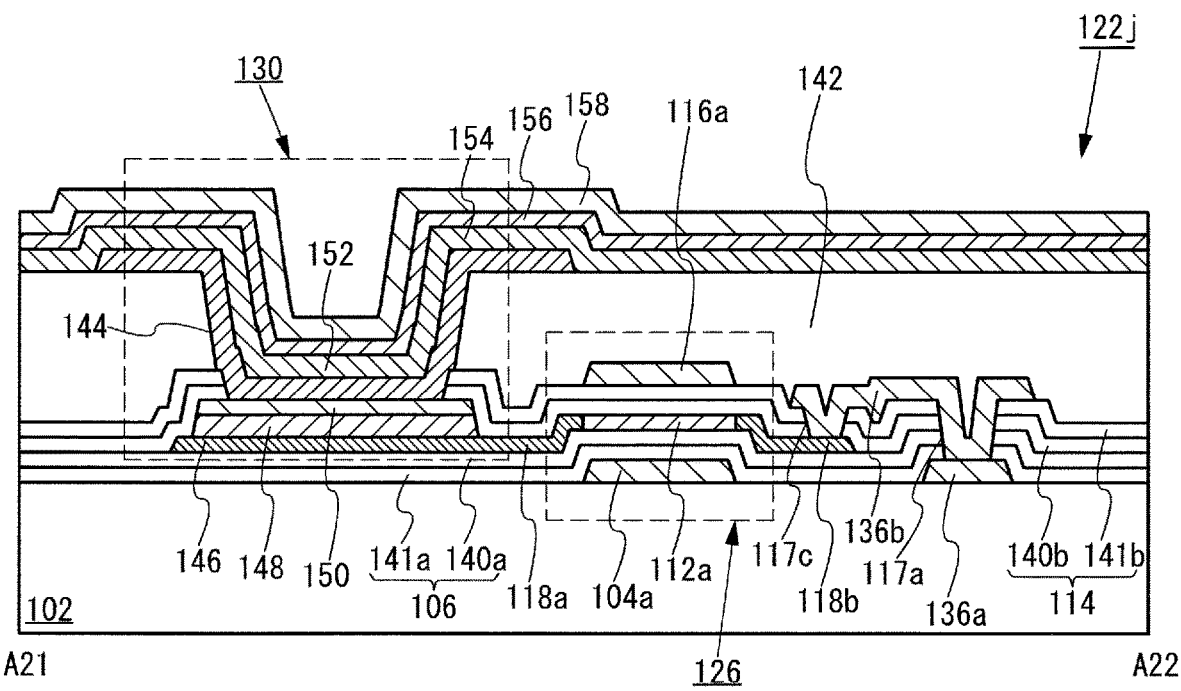
FIG. 61A is a cross-sectional view showing a structure of a pixel in a display device in an embodiment according to the present invention, taken along line A21-A22 in FIG. 59.
Figure 61B:
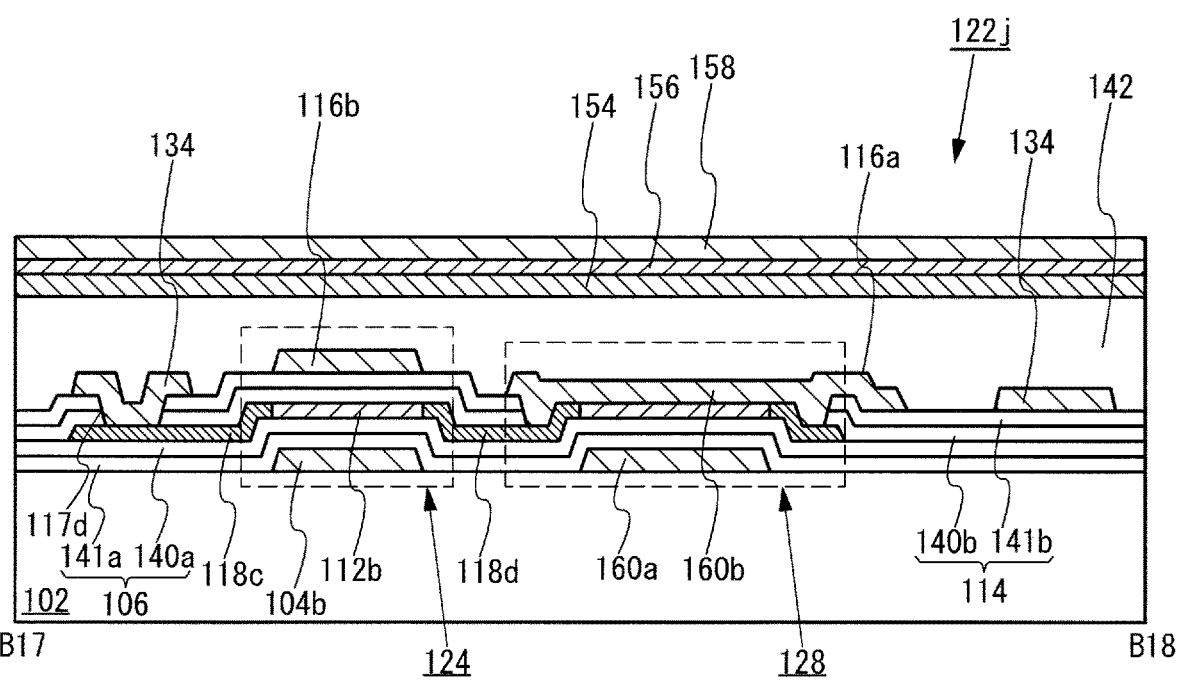
FIG. 61B is a cross-sectional view showing the structure of the pixel in the display device in an embodiment according to the present invention, taken along line B17-B18 in FIG. 59.

FIG. 61A and FIG. 61B show a cross-sectional structure of the pixel 122j. In the structure shown in FIG. 61A and FIG. 61B, the electron transfer layer 148 and the electron injection layer 150 provided on the first electrode 146 are formed by use of a multi-gradation photomask, unlike in the structure shown in FIG. 60A and FIG. 60B.

The first electrode 146 formed in the oxide semiconductor layer 122 has the resistance thereof decreased as a result of being irradiated with laser light in the ultraviolet range from the substrate 102 side. This decreases the contact resistance between the first electrode 146 and the electron transfer layer 148, and thus a good ohmic junction is formed.

It is preferable that the oxide semiconductor layer 112a and the first electrode 146 are formed of a tin (Sn)-based oxide semiconductor not containing zinc (Zn), magnesium (Mg) or the like (e.g., $InGaSnO_x$, $InWSnO_x$, $InSiSnO_x$, etc.), and that the electron transfer layer 148 is formed of a zinc (Zn)-based oxide semiconductor not containing tin (Sn) (e.g., $ZnSiO_x$, $ZnMgO_x$, $ZnGaO_x$, etc.). With such an arrangement, the etching rate on the oxide semiconductor used for the electron transfer layer 148 is made different from the etching rate on the oxide semiconductor used for the oxide semiconductor layer 112a, and thus the selection ratio is increased. In addition, the bandgap relationship of the oxide semiconductor layer 112a and the first electrode 146 with respect to the electron transfer layer 148 is made optimal. Specifically, the bandgap of the electron transfer layer 148 is made larger than that of the oxide semiconductor layer 112a and the first electrode 146. For example, the bandgap of the electron transfer layer 148 is preferably 3.4 eV or greater. In the case where the bandbap of the electron transfer layer 148 is 3.4 eV or greater, blue light is not absorbed and thus the reliability is improved.

The entirety of, or a part of, the illustrative embodiments disclosed above may be defined by the following supplementary Notes. Any embodiment of the present invention is not limited to any of the following.

Supplementary Note 1.

A display device includes a substrate; and a plurality of pixels provided on the substrate. The plurality of pixels each include a driving transistor and an organic EL element electrically connected with the driving transistor; the driving transistor includes: an oxide semiconductor layer; a first gate electrode including a region overlapping the oxide semiconductor layer, the first gate electrode being provided on a surface of the oxide semiconductor layer facing the substrate; a first insulating layer provided between the first gate electrode and the oxide semiconductor layer; a second gate electrode including a region overlapping the oxide semiconductor layer and the first gate electrode, the second gate electrode being provided on a surface of the oxide semiconductor layer opposite to the surface facing the substrate; and a second insulating layer provided between the second gate electrode and the oxide semiconductor layer; and the organic EL element includes: a light-transmissive first electrode; a second electrode provided to face the first electrode; a light emitting layer provided between the first electrode and the second electrode; and an electron transfer layer provided between the light emitting layer and the first electrode; wherein the first electrode is continuous from the first transparent conductive layer.

Supplementary Note 2.

The display device according to supplementary Note 1, wherein the second gate electrode has a width in a channel length direction larger than a width of the first gate electrode in the channel length direction.

Supplementary Note 3.

The display device according to supplementary Note 1, wherein the region of the second gate electrode overlapping the oxide semiconductor layer has an area size larger than an area size of the region of the first gate electrode overlapping the oxide semiconductor layer.

Supplementary Note 4.

The display device according to supplementary Note 1, wherein the electron transfer layer has a carrier concentration higher than a carrier concentration of the oxide semiconductor layer.

Supplementary Note 5.

The display device according to supplementary Note 1, wherein the electron transfer layer has a bandgap of 3.4 eV or greater, and the oxide semiconductor layer has a bandgap of 3.0 eV or greater.

Supplementary Note 6.

The display device according to supplementary Note 1, wherein the organic EL element further includes an electron injection layer provided between the electron transfer layer and the light emitting layer.

Supplementary Note 7.

The display device according to supplementary Note 6, wherein the electron injection layer is formed of C12A7 ($12CaO·7Al_2O_3$) electride.

Supplementary Note 8.

The display device according to supplementary Note 1, wherein the electron transfer layer is formed of a zinc (Zn)-based oxide semiconductor not containing tin (Sn), and the oxide semiconductor layer is formed of a tin (Sn)-based oxide semiconductor containing neither zinc (Zn) nor magnesium (Mg).

Supplementary Note 9.

The display device according to supplementary Note 8, wherein: the electron transfer layer contains at least one selected from zinc oxide, silicon oxide, magnesium oxide and gallium oxide; and the oxide semiconductor layer contains tin oxide, indium oxide and at least one selected from gallium oxide, tungsten oxide and silicon oxide.

Supplementary Note 10.

The display device according to supplementary Note 1, further comprising a flattening layer burying the driving transistor; wherein: the flattening layer has an opening exposing a top surface of the first electrode; and the electron transfer layer, the light emitting layer and the second electrode are provided continuously on the top surface of the first electrode, on an inner wall of the opening and on a top surface of the flattening layer.

Supplementary Note 11.

The display device according to supplementary Note 10, wherein: the organic EL element further includes a hole transfer layer and a hole injection layer provided between the light emitting layer and the second electrode; the hole transfer layer and the hole injection layer are provided continuously for the plurality of pixels; and the electron transfer layer is individually provided for each of the plurality of pixels.

Supplementary Note 12.

The display device according to supplementary Note 10, wherein:

the organic EL element further includes a hole transfer layer and a hole injection layer provided between the light emitting layer and the second electrode; the hole transfer layer and the hole injection layer are provided continuously for the plurality of pixels; and the electron transfer layer and the electron injection layer are individually provided for each of the plurality of pixels.

Supplementary Note 13.

The display device according to supplementary Note 11, wherein an end of the electron transfer layer is located outer to the opening and inner to an end of the light emitting layer.

Supplementary Note 14.

The display device according to supplementary Note 12, wherein an end of the electron transfer layer and an end of the electron injection layer are located outer to the opening and inner to an end of the light emitting layer.

Supplementary Note 15.

The display device according to supplementary Note 1, further comprising a reflective electrode provided between the first electrode and the electron transfer layer.

Supplementary Note 16.

The display device according to supplementary Note 15, wherein the reflective electrode is provided in the same layer as that of the second gate electrode.

The invention claimed is:

1. A display device, comprising:
    a substrate; and
    a plurality of pixels each including a transistor and an electroluminescence element on the substrate,
    wherein the transistor comprising:
        a first gate electrode on the substrate;
        a second gate electrode overlapping at least one portion of the first gate electrode;
        an oxide semiconductor layer between the first gate electrode and the second gate electrode;
        a first insulating layer between the first gate electrode and the oxide semiconductor layer; and
        a second insulating layer between the oxide semiconductor layer and the first gate electrode,
    wherein the electroluminescence element comprising:
        a first electrode;
        a second electrode opposite to the first electrode;
        a light emitting layer between the first electrode and the second electrode; and
        an electron transfer layer between the light emitting layer and the first electrode,
    wherein the oxide semiconductor layer comprising:
        a channel region overlapping the first gate electrode and the second gate electrode;
        a first low-resistance region and a second low-resistance region adjacent said channel region; and
    wherein an edge of the first low-resistance region and an edge of the second low-resistance region overlap an edge of the first gate electrode,
    wherein the oxide semiconductor layer extends into a region overlapping the electroluminescence element,
    wherein the first electrode comprises same layer as the oxide semiconductor layer, and the first low-resistance region and the first electrode are continuous.

2. The display device according to claim 1, wherein:
    the first insulating layer and the second insulating layer extend into a region overlapping the electroluminescence element;
    the second insulating layer includes a first opening; and
    the first electrode and the electron transfer layer are in contact at the first opening.

3. The display device according to claim 2, further comprising a flattening layer on the transistor,
    wherein:
    the flattening layer includes a second opening overlapping the first opening; and
    the electron transfer layer, the light emitting layer, and the second electrode overlap the second opening.

4. The display device according to claim 1, wherein the first low-resistance region and the second low-resistance region are sandwiched between the first insulating layer and the second insulating layer.

5. The display device according to claim 1, wherein the electron transfer layer comprises an oxide semiconductor.

6. The display device according to claim 5, wherein the electron transfer layer is disposed separately for each of the plurality of pixels, and the second electrode is disposed across the plurality of pixels.

7. The display device according to claim 6, wherein:
    the light emitting layer is disposed separately for each of the plurality of pixels; and
    an edge of the light emitting layer is outside of an edge of the electron transfer layer.

8. The display device according to claim 1, wherein the first low-resistance region and the second low-resistance region are formed self-aligned by irradiating a laser beam from the substrate side.

9. The display device according to claim 1, further comprising a reflective electrode between the first electrode and the electron transfer layer.

10. The display device according to claim 9, wherein the reflective electrode is formed of same conductive layer as the second gate electrode.

11. The display device according to claim 9, further comprising a flattening layer,
    wherein the reflective electrode is disposed between the second insulating layer and the flattening layer.

12. The display device according to claim 9, wherein the reflective electrode is disposed between the first electrode and the second gate electrode.

13. The display device according to claim 1, further comprising a data signal line disposed on the second insulating layer,
    wherein the data signal line is electrically connected to the first low-resistance region through a first contact hole in the second insulation layer.

14. The display device according to claim 13, further comprising a common line disposed on the second insulating layer,
    wherein the common line is electrically connected to the second low-resistance region through a second contact hole in the second insulation layer.

15. The display device according to claim 14, wherein the data signal line and the common signal line are formed of same conductive layer as the second gate electrode.

* * * * *